United States Patent [19]
Robbins et al.

[11] Patent Number: 5,801,073
[45] Date of Patent: Sep. 1, 1998

[54] NET-SHAPE CERAMIC PROCESSING FOR ELECTRONIC DEVICES AND PACKAGES

[75] Inventors: William L. Robbins, Newton; John S. Haggerty, Lincoln; Dennis D. Rathman, Ashland; William D. Goodhue, Chelmsford; George B. Kenney, Medfield; Annamarie Lightfoot, Andover; R. Allen Murphy, Boxboro; Wendell E. Rhine, Belmont; Julia Sigalovsky, Sudbury, all of Mass.

[73] Assignees: Charles Stark Draper Laboratory; Massachusetts Institute of Technology, both of Cambridge, Mass.

[21] Appl. No.: 450,692

[22] Filed: May 25, 1995

[51] Int. Cl.$^6$ .................................................. H01L 21/60
[52] U.S. Cl. ............................................. 438/125; 438/126
[58] Field of Search .................................. 437/209, 210, 437/211, 212, 213, 214, 215, 216, 217, 218, 219, 241, 242; 438/125, 126

[56] References Cited

U.S. PATENT DOCUMENTS

| | | | |
|---|---|---|---|
| 3,635,510 | 1/1972 | Stoller et al. | 437/242 |
| 4,127,630 | 11/1978 | Washburn | 264/65 |
| 4,351,787 | 9/1982 | Martinengo et al. | 264/65 |
| 4,475,007 | 10/1984 | Ohno | 437/217 |
| 4,633,573 | 1/1987 | Scherer | 437/209 |
| 4,687,655 | 8/1987 | Hunold et al. | 423/344 |
| 4,769,272 | 9/1988 | Byrne et al. | 437/217 |
| 4,827,082 | 5/1989 | Horiuchi et al. | 174/52.4 |
| 4,919,868 | 4/1990 | Huang | 264/65 |
| 4,946,630 | 8/1990 | Ezis | 264/65 |
| 5,093,289 | 3/1992 | Braetsch et al. | 501/80 |
| 5,103,239 | 4/1992 | Verzemnieks et al. | 343/872 |

(List continued on next page.)

FOREIGN PATENT DOCUMENTS

| | | | |
|---|---|---|---|
| 0484916 | 5/1992 | European Pat. Off. | C04B 35/58 |
| 63-86872 | 4/1988 | Japan | C23C 16/34 |

OTHER PUBLICATIONS

Yasutomi et al., "Evaluation of Silicon Powder Nitridation Catalyst by Activation Energy Measurements," J. Ceram. Jpn., Inter. Ed., V. 96, pp. 547–551, 1988.

(List continued on next page.)

Primary Examiner—Kevin Picardat
Attorney, Agent, or Firm—Theresa A. Lober

[57] ABSTRACT

A method of producing electronic device packages is provided, consisting of the steps of shaping a package preform and heating the package preform in a nitrogen-containing atmoshpere to nitride the package preform. The shaped package preform may consist of package base, sidewall, conductor, resistor, or capacitor components. The package base and sidewall components may be formed of silicon powder. The method also accommodates the step of inserting a semiconducting material into the package preform and heating the semiconducting material component along with the package preform. The inserted semiconducting material component may be processed to define active electronic device areas on the component either before or after the step of heating the shaped package preform and inserted semiconducting material component. The package production methods of the invention provide the ability to produce reaction bonded structural and dielectric package components by way of a nitriding process that causes minimal overall shrinkage of the package. As a result, reaction formed electronic device packages of the invention may be shaped to finished dimensions before the nitriding process with complicated and tight-tolerance geometries of package structural, conducting, resistive, and capacitive components. The package production methods of the invention also provide the ability to interleave electronic device and packaging manufacturing sequence steps, resulting in increased manufacturing efficiency, as well as improved performance in the devices and packages produced. Device substrates or partially fabricated devices may be embedded into semi-finished packages, whereby completion of device fabrication coincides with completion of package fabrication. This makes possible the fabrication of active devices and circuits in a fully packaged environment.

140 Claims, 12 Drawing Sheets

U.S. PATENT DOCUMENTS

| | | | |
|---|---|---|---|
| 5,142,385 | 8/1992 | Anderson et al. | 369/10 |
| 5,158,912 | 10/1992 | Kellerman et al. | 437/209 |
| 5,275,985 | 1/1994 | Huang | 501/97 |
| 5,332,697 | 7/1994 | Smith et al. | 437/242 |
| 5,356,720 | 10/1994 | Creber et al. | 428/545 |
| 5,407,502 | 4/1995 | Takenaka et al. | 437/209 |
| 5,529,959 | 6/1996 | Yamanaka | 437/209 |

OTHER PUBLICATIONS

Yasutomi et al., "Development of High–strength $Si_3N_4$ Reaction–bonded SiC Ceramics," J. Ceram. Jpn, Inter. Ed., V. 96, pp. 762–766, 1988.

Yasutomi et al., "Development and Characterization of Electro–Conductive $Si_3N_4$ Bonded TiN Ceramics," J. Ceram. Jpn., Inter. Ed., V. 97, pp. 145–151, 1989.

Yasutomi et al., "Analyses of Microstructure and Sintering Mechanism of $Si_3N_4$–Bonded SiC Ceramics," J. Ceram. Jpn., Inter. Ed., V. 98, pp. 442–451, 1990.

Asakami et al., "Materials for electrode of alkali metal thermoelectric converter (AMTEC)(II)," J. Mat. Sci. Lett., V. 9, pp. 892–894, 1990.

Yasutomi et al., "Development of Reaction–Bonded Electro–Conductive $TiN-Si_3N_4$ and Resistive $Al_2O_3-Si_3N_4$ Composites," Ceram. Eng. Sci. Proc., V. 11, N. 7–8, pp. 857–867, 1990.

Yasutomi et al., "Development of Reaction–Bonded Electroconductive Silicon Nitride–Titanium Nitride and Resistive Silicon Nitride–Aluminum Oxide Composites," J. Am. Ceram. Soc., V. 74, N. 4, pp. 950–957, 1991.

Yasutomi et al., "Reaction Sintering Property of Green Compact of Si and TiC Mixed Powders In Nitrogen," Mat. Res. Soc., 1991 Fall Meet., Symposium S, Boston, MA, Dec., 1991.

Allen, "Solid state metal–ceramic reaction bonding applications to transistor packages and advanced materials," Elect. Sci. Tech., V. 11, pp. 85–87, 1983.

Lashway, "AlN Thermal Management," Advanced Packaging, May/Jun., pp. 22–24, 1994.

Takeda, "Development of High–Thermal–Conductive SiC Ceramics," Ceramic Bulletin, vol. 67, No. 12, pp. 1961–1963, 1988.

Vel et al., "Cubic boron nitride: synthesis, physicochemical properties and applications," Mat. Sci. & Eng., V. B10, pp. 149–164, 1991.

Demazeau, "Growth of cubic boron nitride by chemical vapor deposition and high–pressure high–temperature synthesis," Diamond and Related Materials, V. 2, pp. 197–200, 1993.

Williams et al., "Assessment of carbon contamination in titanium nitride films deposited from the reaction of titanium (IV) chloride and amines," Mat. Res. Soc., Symp. V. 327, pp. 121–125, 1994.

Winter et al., "Single–source precursors to vanadium nitride thin films," Mat. Res. Soc., Symp. Proc. V. 327, pp. 109–113, 1994.

Winter et al., "Single–source precursors to niobium nitride and tantalum nitride films," Mat. Res. Soc., Symp. Proc. V. 327, pp. 103–108, 1994.

Deshpande et al., "Hot filament assisted CVD of titanium nitride films," Mat. Res. Soc., Symp. Proc. V. 327, pp. 115–120, 1994.

Jiang et al., "Preparation of TiN and TiC from a Polymeric Precursor," Chemistry of Materials, V. 3, No. 6, pp. 1132–1137, 1991.

Lindquisst et al., "Novel silicon nitride microstructures through processing of phase separated polysilazane gels," Mat. Res. Soc. Symp., Proc. V. 249, pp. 565–570, 1992.

Haggerty et al., "Processing and properties of reaction bonded silicon nitride made from laser synthesized silicon powders," MRS Symp. on Defect Props., Boston, MA, Dec. 2–4, 1985.

Haggerty et al., "High strength, oxidation resistant reaction–bonded silicon nitride from laser–synthesized silicon powder," Proc. 2nd Int. Symp., Ceramic Materials & Components for Eng., Lubeck–Travenmunde, Germany, Apr., 1986.

Haggerty, "Reaction bonded $Si_3-N_4$ fiber composites," MIT ILP Workshop: Process., Microstr., Properties of Metal & Ceramic Matrix. Composites, Cambridge, MA, Nov. 18–19, 1986.

Ritter et al., "High–Strength Reaction–Bonded Silicon Nitride," Advanced Ceramic Materials, V. 3, N. 4, pp. 415–417, Jul., 1988.

Haggerty et al., "Properties of Reaction–Bonded Silicon Nitride Made from High Purity Silicon Powder," Ceramic Eng. Science Proc., V. 9, N. 7–8, pp. 1073–1078, 1988.

Sheldon et al., "The nitridation of high purity, laser–synthesized silicon powder to form reaction bonded silicon nitride," Ceramic Eng. & Science Proc., V. 9,. N. 7–8, pp. 1061–1072, 1988.

Sheldon et al., "The Formation of Reaction Bonded $Si_3N_4$ at Low Temperatures and in Short Times," Ceram. Eng. Sci. Proc. V. 10, N. 7–8. pp. 784–793, 1989.

Lightfoot et al., "Nitriding Kinetics of Si–SiC Powder Mixtures as Simulations of Reaction Bonded $Si_3N_4$–SiC Composites," Ceram. Eng. Sci. Proc. V. 10, N. 9–10, pp. 1035–1048, 1989.

Haggerty et al., "Oxidation and Fracture Strength of High–purity Reaction–bonded Silicon Nitride," Jnl. Amer. Ceram. Soc., V. 72, N. 9, pp. 1675–1679, Sep. 1989.

Haggerty et al., "Reaction–Based Processing Methods for Ceramics and Composites," Ceram. Eng. Sci. Proc., V. 11, No. 7–8, pp. 757–781, 1990.

Sheldon et al., "Nitrogen Adsorption onto Silane–Derived Silicon Powders," Jnl. Amer. Ceram. Soc., V. 74, N. 6, pp. 1417–1424, Jun., 1991.

Lightfoot et al., "Processing and Properties of SiC Whisker–and Particulate–Reinforced Reaction Bonded $Si_3N_4$," Ceram. Eng. Sci. Proc. V. 12, N. 7–8, pp. 1265–1291, 1991.

Sheldon et al., "Formation of Reaction–Bonded Silicon Nitride from Silane–Derived Powders: Macroscopic Kinetics and Related Transport Phenomena," Jnl. Amer. Ceram. Soc. V. 75, N. 3, pp. 677–685, Mar., 1992.

Han et al., "Pyrolysis Chemistry of Poly(organosilazanes) to Silicon Ceramics," Chem. Mater., V. 4, pp. 705–711, 1992.

Lightfoot et al., "Relationships Between Toughness and Microstructure of Reaction Bonded $Si_3N_4$," Ceram. Eng. Sci. Proc., V. 13, N. 9–10, pp. 1024–1031, 1992.

Nair et al., "Mechanical behavior of silicon carbide particulate reinforced reaction bonded silicon nitride matrix composites," Ceram. Eng. Sci. Proc., V. 13, N. 7–8, pp. 81–89, 1992.

Han et al., "Effect of silicon exposure on pyrolysis of preceramic polysilazane," Mat. Res. Soc., Symp. Proc. V. 249, pp. 391–396, 1992.

Haggerty, "Synthesis of reaction bonded silicon nitride from high purity Si powders," Mat. Res. Soc., Symp. Proc. V. 249, pp. 495–509, 1992.

Haggerty, "Synthesis and properties of reaction bonded silicon nitride made from high purity Si powders," presented at 1993 PAC RIM Meeting, Amer. Ceram. Soc., Nov. 1993.

Rhine et al., "Silicon nitride ceramic matrix for CMCs from silane derived Si powders and preceramic polymers," Mat. Res. Soc., Fall Meet., Boston., MA, Nov. 28—Dec. 2, 1994.

Haggerty et al., "Opportunities for Enhancing the Thermal conductivities of SiC and $Si_3N_4$ Cer. Through Improved Processing," 19th Ann. Conf. on Composites and Adv. Ceramics, Amer. Ceram Soc., Cocoa Beach, Florida, Jan. 1995.

Lightfoot et al., "Ceramic Matrices and Monoliths synthesized from a Combination of Reactive Polymers," 19th Ann. Conf. on Composites & Adv. Ceramics, Amer. Ceram. Soc., Florida, Jan. 1995.

Ritter, "Strength of reaction bonded silicon nitride after high temperature air exposures," Ceram. Eng. Sci. Proc., V. 10, N. 7–8, pp. 625–631, 1989.

Lightfoot et al., "Properties of RBSN and RBSN–SiC Composites," Ceram. Eng. Sci. Proc., V. 11. N. 7–8, pp. 842–856, 1990.

Nair et al., "Identation Residual Stresses in RBSN and RBSN Composites," Ceram. Eng. Sci. Proc., V. 13, N. 7–8, pp. 90–98, 1992.

Haggerty et al., "Processing and properties of reaction bonded silicon nitride and sintered silicon carbide made from laser synthesized powders," Ceram. Trans., V. 1, Ceramic Powder Science II, B, Ed. G.L. Messing et al., Amer. Ceram. Soc., Westerville, OH, pp. 1059–1068, 1988.

Yasutomi et al., "Sintering Phenomena of $Si_3N_4$ Bonded Ceramics Containing $Al_2O_3$ Particles," Jnl. Ceram. Soc. of Japan, Int. Ed., V. 99, No. 5, pp. 394–397, 1991.

Yasutomi et al., "Sintering property of green compacts of Si & TiC mixed powders in nitrogen and characterization of the sintered bodies," Proc. Fall Meet. Ceram. Soc. Jap. Sep. 26–28, 1990.

Sprague, "Multilayer Ceramic Packaging Alternatives," IEEE Trans. on Comps., Hybrids, & Manufacturing. Tech., V. 13, N. 2, pp. 390–396, Jun. 1990.

Yasutomi et al., "Development of high strength $Si_3N_4$ bonded SiC Engineering Ceramics," Proc. 1st Japan SAMPE Symp., Nov. 28–Dec. 1, 1989.

Keddie et al., "Effect of Nitridation Rate on the Comp. and Cond. of Titanium Nitride Films Prepared from Sol–Gel Titania," J. Am. Ceram. Soc., V. 74, N. 11, pp. 2937–2940, Nov. 1991.

Danforth et al., "Mechanical Properties of Sintered and Nitrided Laser–Synthesized Silicon Powder," J. Am. Ceram. Soc., V. 66, N. 4, pp. C–58–59, Apr. 1983.

Drake et al., "Titanium Amide Molecular Precursors for Titanium Nitride," Polyhedron, V. 13, N. 2, pp. 181–186, 1994.

Seyferth et al., "Preparation of titanium nitride and titanium carbonitride by the preceramic polymer route," Jnl. Materials Science Letters, V. 7, pp. 487–488, 1988.

Zorn et al., "Observation of Annealing Effects in Ti/TiN Diffusion Barriers using High–Temp. X–ray Diffraction," Materials Science Forum, vol. 79–82, pp. 893–902, 1991.

Jiang et al., "Non–stoichiometry of titanium nitride plates prepared by chemical vapour deposition," Jnl. of Alloys and Compounds, (JALCOM 420), V. 190, pp. 197–200, 1993.

Etchessahar et al., "The Ti–N System: Kinetic, calorimetric, structural and metallurgical investigations of the $\delta'$–$TiN_{0.51}$ phase," Jnl. of the Less–Common Metals, V. 167, pp. 261–281, 1991.

Lengauer, "The Titanium–Nitrogen System: A study of phase reactions in the subnitride region by means of diffusion couples," Acta Metall. Mater., V. 39, N. 12, pp. 2985–2996, 1991.

Gatterer et al., "Das kubische Tantalmonoitrid (B 1–Typ) und sein Mischbarkeit mit den isotypen Ubergangsmetallnitriden und –carbiden," Monatshefte fur Chemie, V. 106,pp. 1137–1147, 1975.

Every et al., "The effect of particle size on the thermal conductivity of ZnS/Diamond composites," Acta metall. mater. V. 40, N. 1, pp. 123–129, 1992.

Hasselman et al., "Thermal Conductivity of a Particulate–Diamond–Reinforced Cordierite Matrix Composite," Jnl. Amer. Ceram. Soc., V. 77, N. 7, pp. 1757–1760, 1994.

Kamijo et al., "Electrical Discharge Machinable $Si_3N_4$ Ceramics," Sumitomo Electric Technical Review, N. 24, pp. 183–190, Jan. 1985.

Messier, "Use of Ti to Enhance Wetting of Reaction–Bonded $Si_3N_4$ by Si," Ceram. Eng. Sci. Proc. V. 1, N. 7–8, (B), pp. 624–633, Jul.–Aug. 1980.

Narula et al., "Preparation of Silicon Nitride–Titanium Nitride and Titanium–Titanium Nitride Composites from $(CH_3)3SiNHTiCl_3$–Coated $Si_3N_4$ and Ti Particles," Jnl. Amer. Ceram. Soc., V. 78, N. 5, pp. 1247–1251, 1995.

Godfrey, "The Fabrication and Properties of Silicon Nitride Ceramics and Their Relevance to Aerospace Applications," J. British Interplanetary Society, V. 22, pp. 353–368, 1969.

Moulson, "Review: Reaction–bonded silicon nitride: its formation and properties," Jnl. Materials Science, V. 14, pp. 1017–1051, 1979.

Laine et al., "Preceramic Polymer Routes to Silicon Carbide," Chem. Mater. V. 5, N. 3, pp. 260–279, 1993.

Dreike et al., "An Overview of High–temperature Electronic Device Technologies and Potential Appls.," IEEE Trans. Comp., Pack., and Manf. Tech., Part A, V. 17, N. 4, pp. 594–609, Dec. 1994.

Giannelis, "New Chemical Processing Technique Deposits Good Quality TiN Thin Films for Microelectronic Applications," Materials & Processing Report, V. 7, N. 5, pp. 5–6, May 1992.

Messier et al., "Silicon nitride: A promising material for radome applications," Proc. 12th Symp. on Electromagnetic Windows, Georgia Inst. Tech., pp. 62–66, J.N. Harris, ed., 1974.

Walton Jr., "Reaction Sintered Silicon Nitride for High Temperature Radome Applications," Ceramic Bulletin, V. 53, N. 3, pp. 255–258, 1974.

Su et al., "Polymer Precursor Route to $TiB_2$/TiN Nanocomposites," Chem. Mater. V. 4, N. 6, pp. 1139–1141, 1992.

Greil et al., "Modelling of dimensional changes during polymer–ceramic conversion for bulk component fabrication," Jnl. Mater. Sci., V. 27, pp. 1053–1060, 1992.

Ziegler, "Thermo–Mechanical Properties of Silicon Nitride and their Dependence on Microstructure," Materials Science Forum, V. 47, pp. 162–203, 1989.

Kurokawa et al., "Development and Microstructural Characterization of High–Thermal–Conductivity Aluminum Nitride Ceramics," Jnl. Amer. Ceram. Soc., V. 71, N. 7, pp. 588–594, 1988.

*Microelectronics Packaging Handbook*, R. Tummala and E. Rymaszewski, Editors, Chapter 8: "Plastic Packaging," Van Nostrand Reinhold, 1989.

NET-SHAPE CERAMIC PROCESSING FOR ELECTRONIC DEVICES AND PACKAGES

GOVERNMENT RIGHTS IN THE INVENTION

This invention was made in part with U.S. Government support under Air Force Contract Number F19628-90-C-0002. The U.S. Government has certain rights in this invention.

RELATED APPLICATIONS

This application is related to U.S. application Ser. No. 08/448,725, to Robbins et al., filed May 25, 1995.

FIELD OF THE INVENTION

This invention relates to electronic package designs and production techniques, and more particularly relates to materials processing techniques for producing electronic packages.

BACKGROUND OF THE INVENTION

Electronic semiconductor device technology continues to rapidly advance, producing devices that achieve heretofore unattainable operating speeds, packing density, and high-temperature compatibility. This last characteristic, high-temperature compatibility, is especially crucial; high-temperature environments as well as high-power and high frequency applications are becoming increasingly commercially important. The ability of electronics to withstand high-temperature environments such as gas-turbines, automotive engine compartments, materials handling and fabrication equipment, and aircraft subsystems makes possible many historically impractical electronic applications for these environments.

Many such high-power, high-temperature electronics applications inherently limit the ability to dissipate heat and power generated by the electronics. Thermal and power management as well as environmental protection of the electronics are therefore handled entirely by the electronics packaging. As a result, typical high-performance packaging criteria include mechanical strength, high thermal conductivity, close matching of device and package thermal expansion coefficients, low dielectric constant for accommodation of high frequency devices, and environmental protection, such as hermetic sealing.

Traditional electronics packaging is ceramics-based, and one common packaging technology is based on the ceramic material alumina. Alumina electronics packages are typically manufactured using green tape casting techniques in which unsintered ceramic sheets are cut to size, punched to provide vias, screen printed with e.g., tungsten slurry, to fill vias and provide conductor lines and planes, laminated in a multi-layer stack, and then co-fired to sinter the alumina and conductors. The sintered multi-layer stack is then typically brazed to bond, e.g., a lead frame, heat sink, and/or input/output pins to metallized pads on the stack, and then all exposed metal surfaces are plated for environmental protection. Electronic devices are then inserted, bonded, and then connected to contacts of the finished package. Alumina-based packaging is also used for ceramic-based multichip module (MCM-C) designs; here a similar production process is used. In an alternative conventional multichip module scheme, (MCM-D), organic dielectrics, rather than alumina, and thin film metallization is employed. But such use of polymer-based packaging can severely limit the survivability of multichip modules in high temperature applications due to the characteristics of the polymer film. For example, at high temperatures, the dielectric properties of polymer interlayers may degrade, and thermal expansion mismatch between a substrate and dies protected by the polymer film can pose severe reliability concerns.

Alumina-based packages also present limitations due to their thermophysical expansion coefficient mismatch with semiconductor materials at high temperatures and even at moderate temperatures. Specifically, the thermal expansion coefficient of alumina is substantially different than that of silicon, silicon carbide, and gallium nitride. This characteristic is illustrated in FIG. 1, which plots the thermal expansion coefficient of various electronic device and package materials as a function of temperature. In general, it is seen that for all materials, the expansion coefficient increases with increasing temperature from zero at 0° C. to the materials' Debye temperatures, which are generally >1000° C. for these examples.

Although at low temperatures the materials exhibit relatively similar expansion coefficients, at high temperatures, alumina ($Al_2O_3$) is characterized by a relatively high expansion coefficient while silicon, silicon carbide (SiC), silicon nitride ($Si_3N_4$), and gallium nitride (GaN) are characterized by relatively low expansion coefficients and gallium arsenide (GaAs) exhibits an only slightly higher expansion coefficient. As a result of this coefficient mismatch at high temperatures, silicon and the other device materials can be successfully mated with an alumina package only if temperature excursions during late-stage processing and device/package operation are expected not to exceed a few hundred degrees; otherwise, the thermal stresses produced by such a mismatch at higher temperatures may result in device and/or package failure.

Another critical concern, from a manufacturing perspective, is a 10%–15% linear shrinkage that occurs to alumina during firing of green alumina sheets. This shrinkage precludes tight geometric integration of device and package assemblies and inherently results in reduced production yields due to variations in aggregate assembly shrinkage and associated warpage conditions.

An additional drawback of alumina based packages is the result of the dielectric constant of alumina, which is about 9.5. This high dielectric constant inherently limits the signal speed which alumina can support. In an effort to reduce the dielectric constant of alumina to six or less, the addition of glass to the alumina ceramic has been demonstrated. This introduction of glass has been shown to reduce the thermal conductivity of the composite material, however, to suboptimal levels that cannot effectively handle heat dissipation. Thus, glass-alumina device packaging systems do not provide acceptable heat dissipation and so require costly cooling schemes for many applications.

In an effort to achieve better inherent thermal conductivity for device packaging, beryllium oxide (BeO) has been investigated as a packaging material; BeO is characterized by a thermal conductivity that is approximately an order of magnitude higher than that of alumina. In exchange for this high thermal conductivity, however, BeO is also characterized by a high thermal expansion coefficient, (as illustrated in FIG. 1) and so like alumina, is not optimally compatible with semiconducting device materials at high temperatures. In addition, BeO powder is highly toxic, making it unattractive for manufacturing environments, and preformed co-fired BeO package forms are not practically available.

Aluminum nitride packages are an historically accepted alternative to alumina- and beryllium oxide-based ceramic packages. Aluminum nitride (AlN) is characterized by a thermal conductivity that, like that of BeO, is up to an order of magnitude higher than that of alumina, and the coefficient of thermal expansion of aluminum nitride is significantly lower than that of alumina, as shown in FIG. 1. Like alumina packages and MCMs, AlN packages and MCMs are produced using a green-tape process in which conductor lines are screen printed on layers of the material. A multi-layer stack of such layers is then densified by sintering them at a temperature of at least, e.g., 1770° C. to 1850° C.

Aluminum nitride-based package systems suffer from many of the same limitations as alumina-based systems. Like alumina, AlN has a high dielectric constant, about 8.9, thereby limiting signal frequencies supported by the material. Additionally, as shown in FIG. 1, AlN exhibits a high-temperature thermal expansion coefficient that is sufficiently dissimilar from that of silicon and silicon carbide to critically limit the range of acceptable applications for which silicon and silicon carbide devices may be packaged in AlN. Perhaps most critically, like alumina, AlN exhibits a 10% to 15% linear shrinkage during sintering procedures, and this shrinkage may be uneven across the length of the sintered part. As a result, manufacturers have typically been required to hot press an AlN part during densification to produce a uniformly flat part. This process enhancement adds unwanted complexity and expense to the manufacturing process. AlN also presents demanding manufacturing challenges beyond those it shares with alumina. For example, it is difficult to control the surface characteristics of aluminum nitride and thus difficult to achieve reliable metallization of AlN layers.

In an effort to exploit only the optimal characteristics of each of several materials in a composite device package design, Horiuchi et al., U.S. Pat. No. 4,827,082, has demonstrated use of an AlN sintered package substrate and a mullite multi-layer package frame positioned and bonded to the substrate; here AlN is exploited for its high thermal conductivity and mechanical strength, and mullite is exploited for its dielectric constant, 7.3, which is lower than that of AlN (8.9). While this material system provides some decrease in dielectric constant, it is still suboptimal for high frequency applications.

All of the packaging systems described above share in a common manufacturing concern, caused by the sintering process required in production of the packaging systems. As explained previously, during this sintering process, employed for densifying the ceramic materials, the "green" metallized ceramic layers are co-fired; large linear shrinkage of the ceramics typically occurs during this process. As a result, precise materials selection criteria are required to select conductor metals and ceramics that have at least similar rates of shrinkage and a total shrinkage match so that mechanical stresses between the metals and the ceramic part are minimized during the sintering process. Even with precise materials selection, lot to lot variations in starting materials results in unpredictable shrinkage of, e.g., green tapes, producing reduced yields and sub-optimal package reliability. Furthermore, as a practical matter, precise matching of shrinkage rates and total shrinkage is difficult and requires specific engineering control, which adds to manufacturing costs and ultimately, the cost of the final package product.

Shrinkage dissimilarities commonly result in warpage of ceramic multi-layer parts and further result in high residual stress levels, which can degrade the long term reliability of the electronics package. In addition, sintering shrinkage often can cause delamination between layers of multilayer packages, resulting in failure of the package to provide environmental protection. Equally critically, the variations of sintering shrinkage from lot to lot prohibits the tight dimensional control critically desired for automated assembly of electronic devices and packages. Meeting a strict shrinkage-matching requirement, along with the other myriad and often seemingly opposing materials requirements for high performance electronics packaging systems has posed a daunting packaging design challenge heretofore met with only suboptimal results.

SUMMARY OF THE INVENTION

The invention overcomes limitations of prior electronics packages by providing a method for producing an electronics device package consisting of reaction bonded silicon nitride structural and dielectric components and conductor, resistor, and capacitor elements positioned with the package structural components. In one aspect, the invention provides a method for producing an electronics package by first shaping a package preform consisting of a package base preform and a package conductor preform positioned on the package base preform and extending to an outer wall of the package, and then heating the shaped package preform in a nitrogen-containing atmosphere to nitride the package preform. In a second aspect, the invention provides a package production method of first shaping a preform of package sidewalls, heating the sidewalls in a nitrogen-containing atmosphere to nitride the sidewalls preform, and then attaching the nitrided sidewalls to a package base. In other aspects, the invention provides a package production method of first shaping a preform consisting of package base, sidewalls, and conductor preforms, and then heating the shaped package preform in a nitrogen-containing atmosphere to nitride the package preform.

In other aspects, the invention provides a package production method of first shaping a package preform consisting of a package base preform and a package conductor preform, inserting a semiconducting material component into the package preform, and then heating the shaped package preform and inserted semiconducting material component in a nitrogen-containing atmosphere to nitride the package preform. In yet other aspects, the invention provides a package production method of first shaping a package preform consisting of base, sidewall, and conductor preforms, inserting a semiconducting material component into the package preform, and then heating the shaped package preform and inserted semiconducting material component in a nitrogen-containing atmosphere to nitride the package preform.

The package production methods of the invention provide the ability to produce reaction bonded structural and dielectric package components by way of a nitriding process that causes minimal overall shrinkage of the package. As a result, reaction formed electronic device packages of the invention may be shaped to finished dimensions before the nitriding process with complicated and tight-tolerance geometries of package structural, conducting, resistive, and capacitive components.

The package production methods of the invention also provide the ability to interleave electronic device and packaging manufacturing sequence steps, resulting in increased manufacturing efficiency, as well as improved performance in the devices and packages produced. Device substrates or partially fabricated devices may be embedded into semi-finished packages, whereby completion of device fabrication coincides with completion of package fabrication. This makes possible the fabrication of active devices and circuits in a fully packaged environment.

In preferred embodiments, the package base preform consists of silicon powder and the package sidewalls preform consists of silicon powder. Preferably, the package base and sidewalls preforms also consist of a silicon nitride precursor, aluminum nitride, silicon nitride powder, or boron nitride powder. The sidewall preform preferably consists of a multilayer preform. In other preferred embodiments, the base preform consists of a heat spreader layer of diamond, silicon nitride, or boron nitride; in alternative preferred embodiments, a cavity is defined in a base package preform of silicon powder and a heat spreader layer of diamond or boron nitride is inserted in the base preform. The package base and sidewalls preforms are preferably shaped by laminating tape cast or extruded unreacted sheets of silicon powder, or alternatively, are preferably injection molded or dry pressed. Preferably, the shaped package preform is heated at a temperature less than 1500° C. and preferably the temperature is ramped from a starting temperature to the heating temperature.

In other preferred embodiments, a package cover is attached to the package either before or after the step of heating the shaped package. Preferably, surfaces of the package are coated with a hermetic sealing layer, consisting of reaction bonded silicon nitride or a glass. In alternative preferred embodiments, the base and sidewalls preforms consist of silicon powder and a refractory silicate glass, and the package is heated to melt the refractory silicate glass to produce an internal pore structure of the base and sidewalls that is characterized by closed-cell porosity.

In preferred embodiments, the package conductor preform consists of a film of titanium or a film of titanium and a titanium nitride precursor. In other preferred embodiments, a package resistor preform is shaped and positioned to be connected to the package conductor preform. Preferably, the resistor preform consists of a film of tantalum, a film of tantalum and a tantalum nitride precursor, a film of titanium powder and silicon powder, or a film of titanium powder, titanium nitride precursor, and silicon powder. In yet other preferred embodiments, a package capacitor preform is shaped and positioned to be connected to the package conductor preform; preferably, the capacitor preform consists of a layer of preceramic polymer.

In preferred embodiments, the method includes the step of processing a semiconducting material component inserted in the package preform to define an active device area on the component after the step of heating the package preform and inserted semiconducting material component. Preferably, a conducting contact is formed on the active device area. In alternative preferred embodiments, the method includes the step of processing a semiconducting material component inserted in the package preform to define an active device area on the component before the step of heating the package preform and inserted semiconducting material component. Preferably, a conducting contact is here formed on the active device area before the step of heating the package preform and inserted semiconducting material component. An electrical connection between the active device area and the package conductor preform is preferably made before the step of heating the package preform and inserted semiconducting material component.

Preferably, the semiconducting material component comprises silicon, silicon carbide, indium phosphide, or diamond, and the semiconducting material component preferably consists of active areas of a transistor.

Other features and advantages of the invention will be apparent from the description of a preferred embodiment, and from the claims.

DESCRIPTION OF A PREFERRED EMBODIMENT

Figure 1:
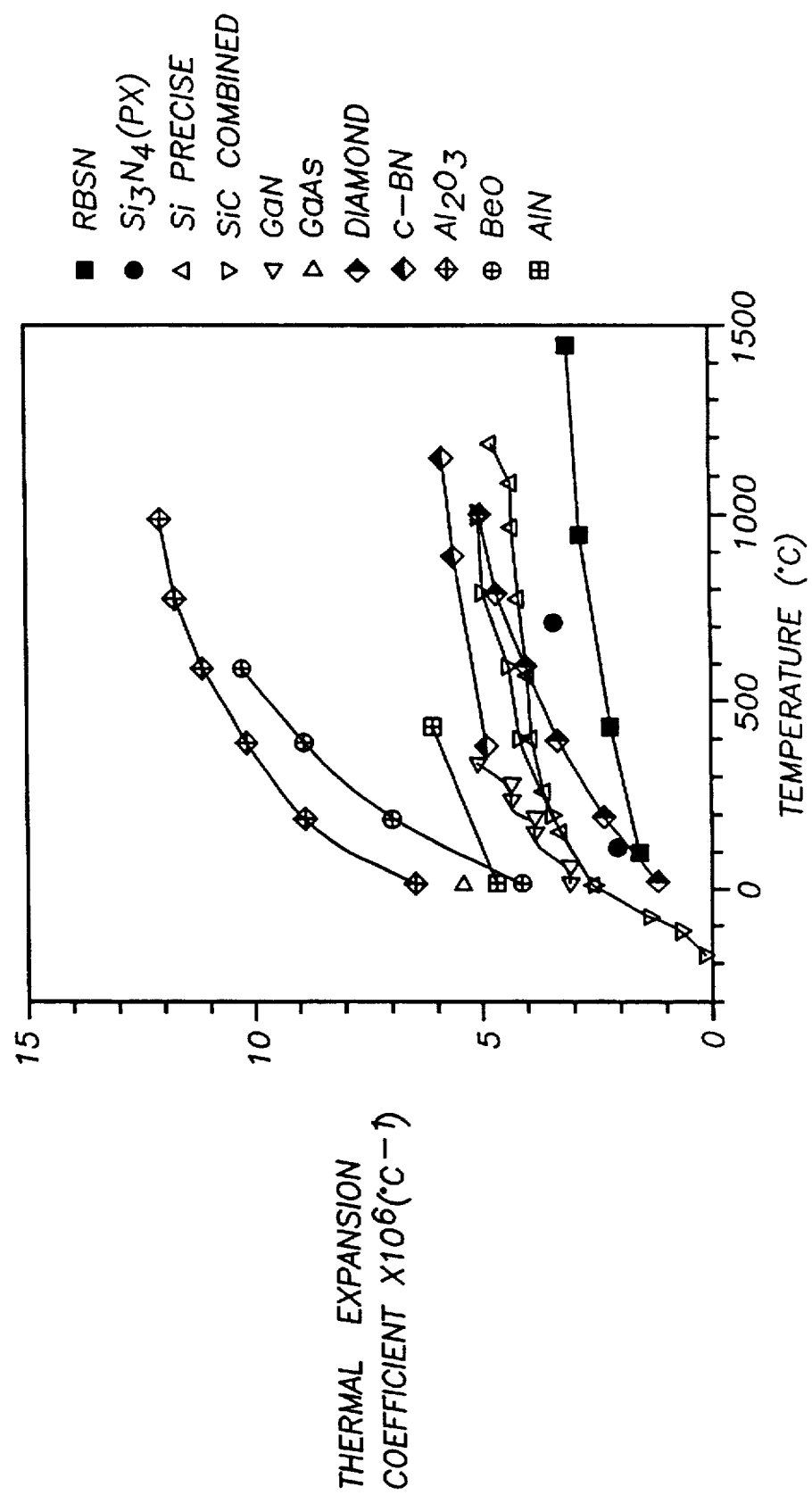
FIG. 1 is a plot of the relationship between the coefficient of thermal expansion and temperature for eleven representative materials.

In accordance with the present invention, high purity reaction bonded silicon nitride (RBSN) is employed as a dielectric ceramic material for packaging electronic devices. Applicants have recognized that RBSN exhibits materials properties that may be exploited for their electrical and thermophysical characteristics to enable its use as an electronic packaging material. The material and electrical characteristics of a RBSN electronics package provide substantial advantages in performance, manufacturing simplicity, manufacturing yield, and manufacturing cost over conventional electronic packaging materials.

High purity RBSN is characterized by a dielectric constant of ~4.8–5.2 at frequencies up to 35 GHz, due to porosity produced by the reaction forming process, described below. This unusually low dielectric constant enables RBSN to reliably support high signal frequencies. In fact, completely converted RBSN exhibits a loss tangent as low as $~2\times10^{-5}$ at 35 GHz and at room temperature, and exhibits a loss tangent of no more than $10^{-2}$ for temperatures up to ~1250° C.

Referring again to FIG. 1, it is illustrated that RBSN and the electronic device materials including Si, SiC, GaN, and $Si_3N_4$ and cubic boron nitride all are characterized by a low thermal expansion coefficient. While the expansion coefficient of RBSN is indeed slightly lower than that of the other materials at higher temperatures, the materials processing techniques of the invention described below provide means for manipulating the RBSN expansion coefficient to achieve precise thermomechanical matching of RBSN and other selected materials over both low and high-temperature ranges. Thus, RBSN package systems provide the ability to significantly reduce or eliminate sources of thermal-mechanical stresses between the electronics package and devices based on these electronic materials.

Furthermore, while RBSN advantageously may exhibit a nearly intrinsic thermal conductivity of as high as 120 W/m·°C., which is greater than that of alumina, the unique porous morphology of RBSN enables it to accommodate infiltration with a high-thermal conductivity material or precursor, such as polysilazane, which is itself converted to $Si_3N_4$ via pyrolysis in $N_2$ or $NH_3$, for increasing thermal dissipation capabilities of the composite even further. Other high- thermal conductivity materials, such as diamond, cubic boron nitride, or aluminum nitride, all having thermal expansion coefficients relatively close to that of RBSN, may be admixed with RBSN starting materials to provide increased thermal conductivity. Mixtures of nitrides or other appropriate materials may also be employed to manipulate the thermal expansion coefficient of RBSN. Each of these techniques for manipulating thermal conductivity and thermal expansion will be explained in detail below.

The high thermal conductivity achievable in RBSN, in combination with the low coefficient of thermal expansion of RBSN, renders its thermal shock resistance virtually unequaled. Additionally, under certain processing conditions, high purity RBSN exhibits an average strength of as high as about 600 Mpa; this characteristic, along with that of a reduced modulus, results in an excellent strain to failure value of 0.3%, thereby providing excellent mechanical package properties.

Of significant importance to the advantages of RBSN over conventional packaging materials is the RBSN forming process, described in detail below. Unlike conventional packaging materials, an RBSN package material according to the invention is not sintered, but rather, is reaction formed in a nitrogen-containing atmosphere in a manner that bonds together the reaction products to form a solid piece. For many RBSN starting materials of interest, the reaction forming process is fully completed at relatively low temperatures and in short times, resulting in an efficient manufacturing process.

The reaction forming process employed in the invention produces an extraordinarily low level of package material shrinkage; typical shrinkage of an RBSN package structure is on the order of about 0.2%. As a result, RBSN package structures in accordance with the invention may be effectively shaped to finished dimensions before the reaction bonding process. This net-shaping characteristic allows for reliable, reproducible, and uncomplicated production of complex, tight-tolerance package geometries.

In accordance with the invention, reaction formed silicon nitride is employed as the structural material for one or more electronics package components including package bases, sidewalls, and covers, or other package components. Package designs and manufacturing processes based on such components are described in detail in specific sections below. Traditional package conducting schemes, e.g., traditional wire bonding and thick-film conductors, may be employed with the RBSN package components of the invention; in addition, package designs for high-performance applications that, e.g., incorporate diamond in the package base or sidewalls, are equally accommodated by RBSN package components. Both traditional package schemes and such high-performance designs and manufacturing processes are described in detail in discussions to follow.

Further in accordance with the invention, there is provided a family of reaction formed nitride-based materials, compatible with the RBSN forming process and configured as device package conductors, resistors, and capacitor structures; as explained in depth below, the use of this family of materials in a packaging system substantially overcomes the processing limitations of conventional conductive and resistive materials typically used in packaging.

With RBSN employed in the invention as the package dielectric, the packaging system of the invention employs one or more conductive nitrides for conducting lines and planes of the RBSN package, employs one or more resistive nitrides for resistor elements of the RBSN package, and employs a dielectric nitride for capacitor structures of the RBSN package. In one example combination according to the invention, titanium nitride (TiN) is used for conducting lines and planes, a nitrided phase of tantalum ($TaN_x$ generally) is used for resistors, and a silicon carbide-silicon nitride composite phase ($SiC$—$Si_3N_4$) is used as a dielectric nitride layer for capacitor structures.

TiN exhibits a resistivity of $-10^{-6}$ $\Omega$-cm, and so provides resistive properties comparable to conventional conductors such as copper, gold, and tungsten. Tantalum nitrides ($TaN_x$) are well-characterized materials known for use as discrete resistive elements; in the invention its materials properties are exploited to provide resistors in a reaction formed package system. These conductive and resistive materials, as well as a $SiC$—$Si_3N_4$ composite, are thermodynamically compatible with RBSN over a wide range of temperatures and atmospheres and so enable a RBSN-based package system with unique manufacturing and performance advantages over conventional packages, as outlined in the discussion to follow.

The RBSN-based packaging system of the invention, while providing substantially improved performance and reliability, provides further advantage in that it is manufacturable using conventional ceramic forming techniques; a "green" package structure formed of appropriate starting materials in accordance with the invention, is reaction formed in a nitridation process rather than being sintered by a traditional sintering process. Applicants have developed a manufacturing process in accordance with the invention whereby RBSN-based package substrates, conductors, resistors, and capacitors are produced using selected starting powders or other suitable starting materials, including polymeric precursors, for the nitridation process.

As explained in depth below, a RBSN package structure may be formed according to the invention from Si powder using green tape technology, injection molding, pressing, or other ceramic forming technique. The conductive, resistive, and dielectric elements may be applied to the package structure using thick- or thin-film processing techniques or other suitable processing techniques. Once a RBSN-based package is in its final configuration, the green part is fired in a nitrogen-containing atmosphere to simultaneously convert the silicon to $Si_3N_4$ and the selected starting materials for conductors, resistors, and capacitor structures to conductive, resistive, and dielectric nitride phases, respectively. This reaction forming step produces an overall net-shaped package with improved multilayer bonding and additionally, substantially eliminates or accommodates shrinkage mismatch between the package material and the conductor, resistor, and capacitor elements, as discussed below.

Each aspect of the RBSN packaging process will be described in detail below. As will be explained, this technology accommodates a wide range of electronics package designs, including dual-in-line (DIP) packages, MCMs, and hybrid packages.

The RBSN packaging process further includes a package-integrated-device technology (PID), developed by applicants in accordance with the invention, which provides substantial design and manufacturing advantages through interleaving of device and package fabrication sequences. This PID will be described in detail, along with various examples of electronic device designs and fabrication sequences which are accommodated by or optimized by the technology.

Below is first presented a description of the starting materials and processing techniques for producing a reaction formed silicon nitride packaging structure, followed by examples of processing techniques for producing a reaction formed packaging structure that includes a plurality of reaction formed species for providing package conductors, resistors, and capacitors. Next is presented a discussion of example electronic package designs and corresponding package manufacturing process sequences that are accommodated by the described reaction forming processes. Device and package design and fabrication specifics are then presented for the package-integrated-device technology of the invention, including a presentation of particular high-performance devices that are well-suited to the technology. Particular techniques according to the invention for cooling packages provided by the invention are then discussed. Finally, designs and corresponding manufacturing processes for producing RBSN-based circuit package structures like radomes are presented.

POWDER SYNTHESIS AND CHARACTERISTICS

The performance characteristics of reaction formed materials in a packaging system according to the invention are found to be impacted by the quality of starting materials used for the package; as will be understood by those in the field of packaging technology, suitable starting materials may be selected based on an intended package application. Research by the applicants into a general reaction forming process, in "Synthesis of Reaction Bonded Silicon Nitride From High Purity Si Powders," Mat. Res. Soc. Symp. Proc. Vol. 249, 495–509, 1992, demonstrates the requirement for precise physical and chemical control of silicon powders for obtaining the highest-quality, most reproducible RBSN. As explained below, however, lesser quality packaging systems according to the invention are well-suited for many applications. Material deficiencies in RBSN package forms may be attributed to characteristics of the starting silicon powder; specific microstructural defects traceable to the powder are related to poor strength and poor oxidation resistance. Thus, while commercially-available silicon powders are acceptable as RBSN starting material, precisely synthesized powders may provide important advantages for some applications.

No matter how silicon powder is obtained, it preferably is characterized by good dispersability, high purity, uniform size, Si—H surface bonding sites, and other similar attributes. Such high quality starting powders produce RBSN package structures that are completely nitrided by a reaction forming process, outlined below, at relatively low temperatures. Advantageously, these temperatures do not alter dopant diffusion profiles of typical high-temperature device materials, which may be incorporated in the package before the forming process. High quality starting powder also provides RBSN package structures with an exceptionally low high-temperature loss tangent at high frequency operation of packaged electronics and the ability to achieve high thermal conductivity.

It must be noted again that silicon powder with less than optimal characteristics is still suited to the reaction forming process of the invention, albeit with a likelihood of the finished product exhibiting properties below the most optimum that are possible, but adequate properties, nevertheless, for many packaging applications. For example, even low-purity silicon powder produces RBSN with thermal characteristics, e.g., expansion and temperature endurance properties, that are superior to conventional package materials. Lesser quality RBSN-based packages are thus adequate for low frequency-high temperature, low temperature-high frequency, or low-temperature-low frequency packaging applications.

Figure 2:
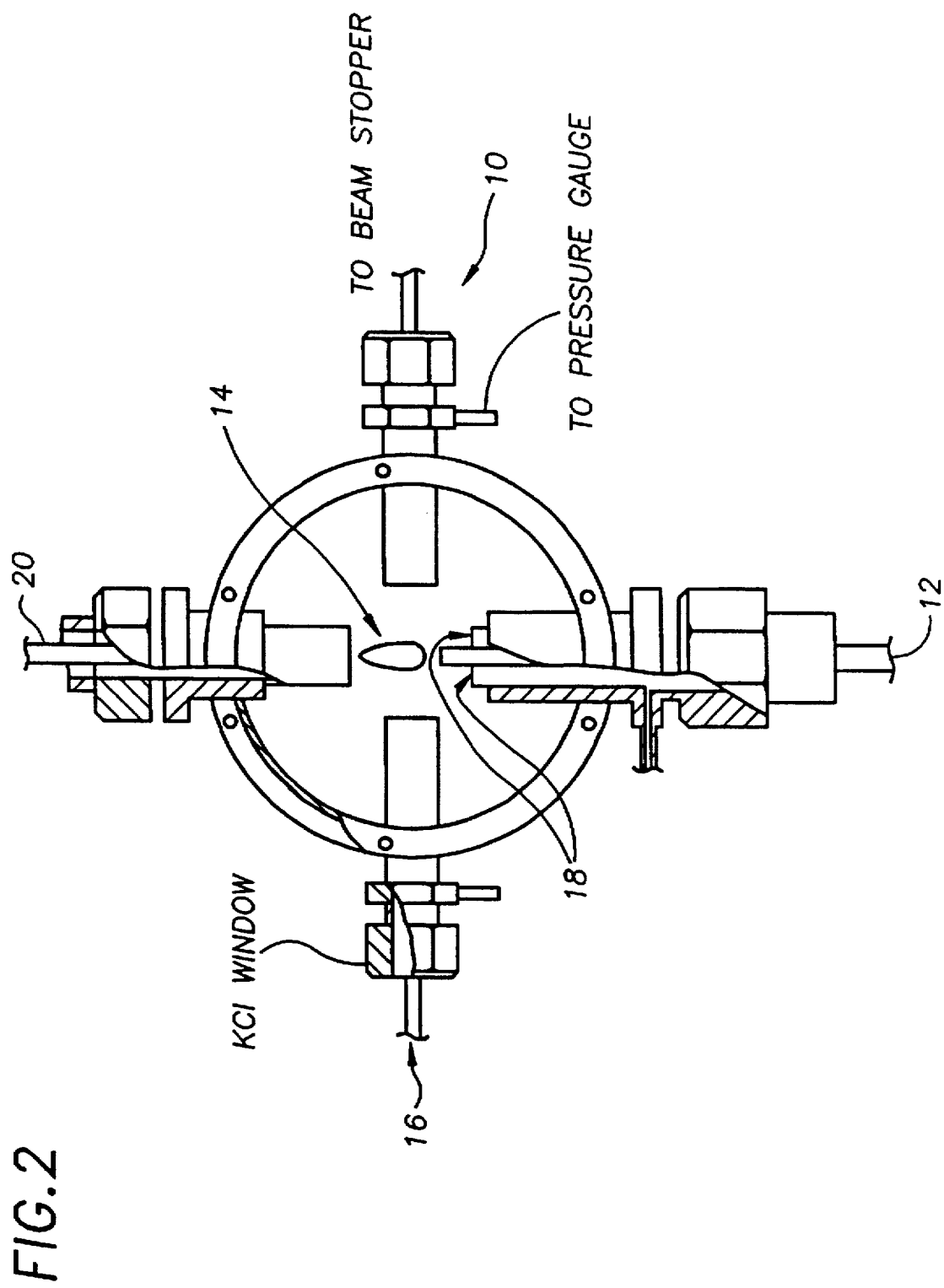
FIG. 2 is a schematic representation of an apparatus for synthesizing silicon powder in accordance with the invention.

In an example powder synthesis process for producing Si powder to be formed into a RBSN package, small diameter, high purity silicon powder is synthesized by rapidly heating a $SiH_4$ gas stream with a CW $CO_2$ laser in a cold wall reactor like that shown in FIG. 2, identified with reference numeral 10. The $SiH_4$ reactant gas is introduced to the reactor at a reaction gas inlet 12, from which it is guided to a reaction zone 14, where it meets a $CO_2$ laser beam 16. The gas is heated by the laser beam at a rate of approximately $10^{6\circ}$ C./sec until such time as the gas reacts and silicon particles, e.g., silicon dimers and trimers, form and grow out of the gas. The number of these initially formed molten particles decreases rapidly from $10^{15}$–$10^{16}$ cm$^{-3}$ to around $10^{10}$ cm$^{-3}$ as the particles grow to a diameter of about 0.01 μm; this growth is a result of interparticle collisions. Collision rates, which start as high as $10^7$/sec, also decrease as the particles grow. Growth of the solid particles continues for less than 1 msec before nondispersible aggregates begin to form as a result of sintering rates no longer being able to spherodize dense particles in the time interval between collisions. Once the heated gas temperature exceeds the melting point of silicon (1410° C.), the aggregates rapidly coalesce into spherical particles by a viscous flow process, and particle growth then continues. Such a coalescence process stops with solidification.

Collision and coalescence of the resulting liquid silicon droplets results in the formation of silicon powder. A stream of argon is injected concentrically around the reaction zone 14 by way of an annular inlet 18, so as to stabilize the reaction zone and to help the produced silicon powder flow smoothly through a chimney 20 into a filter (not shown), where the silicon powder is trapped. Because of the rapid heating in the reaction zone, there is little mixing between the reactant gas and the argon; the reaction concentration is thus uniform throughout most of the reaction zone.

A variation in exposure of the reactant gas to temperatures greater than the silicon melting point produces a distribution of particle sizes in the silicon powder. Flow streams. that never reach the 1410° C. melting point produce agglomerates of small particles. Further, if the cooling rate from 1410° C. is not fast enough to reduce the particle temperature by several hundred degrees in the time period between interparticle collisions, aggregates of large particles may be produced. It is thus clear that the powder particle size and morphology distributions are directly attributable to the temperature and velocity distributions in the reaction zone.

Uniform powder is produced only when all flow streams experience similar time-temperature-concentration histories.

Process variables that control silicon powder characteristics include the reaction cell pressure, the particular choice and purity of reactant gas, which preferably is semiconductor grade silane ($SiH_4$), the gas flow rates and flow ratios, the laser power and intensity, and the reactor nozzle and chimney locations. These variables determine the chemical-reaction, particle-formation, and particle-growth rates primarily through their influence on the reaction zone temperature distribution. Using the combination of optimum process variables, it is found that the synthesized silicon powder is remarkably free of oxygen contamination, and oxidizes only very slowly at room temperature in air.

High purity, small diameter silicon powders can also be synthesized by alternative vapor phase processes. In one such process, silicon wire or powder or gaseous reactants are introduced into an arc or plasma heat source like that used for thermal spray coatings. The inserted powder or wire vaporizes in the extreme temperature conditions, and then condenses and grows by collision and coalescence of liquid droplets in lower temperature regions, as occurs in the laser synthesis process. Although silicon powder produced by such a process may be of a very high purity level, such powder may not possess the passivating Si—H surface layer exhibited by silane-derived powders, and so for some high-performance applications, use of such a process may be less preferable than a silane-based process. Lesser grades of silicon powders can also be made by well-known comminution processes; powders produced by these processes are typically characterized by larger minimum particle diameters and higher impurity levels.

As an alternative to powder synthesis, starting powders may be obtained commercially. However, no commercially available silicon powders exhibit the purity level exhibited by silicon powders produced by laser-heated $SiH_4$. The highest-purity commercially available silicon powder is available from Alber Merle, Inc., of Louisiana, and from KemaNord Industrikemi, Ljungaverk, Sweden, distributed by Superior Graphite, of Chicago, Ill. When mixed with conventional oxide nitriding accelerators, these powders nitride rapidly at relatively low temperatures. They are thus best suited to RBSN package applications that do not demand maximum-achievable RBSN properties.

Considering powders for forming conducting and resistive package elements, titanium sponge powder of a 20 μm diameter may be obtained from Micron Metals, Inc., of Salt Lake City, Utah, Ti powder of a 1 μm size and packed in water, may be obtained from Cerac, Inc., of Milwaukee, Wis., dry Ti powder of a 10 μm particle size may be obtained from Degussa Corp., South Plainfield, N.J., and titanium foil, an alternative to Ti powder, may be obtained from Alfa-Aesar, Danvers, Mass. Tantalum powder of an average particle size of 2 μm and a 99.9% purity may be obtained from Cerac, Inc., of Milwaukee, Wis. As explained in detail in later sections, starting powders for reaction formed TiN conducting lines and reaction formed tantalum nitride resistor elements may consist of silicon-titanium and silicon-tantalum powder mixtures, respectively.

It must be noted here that electronic packages according to the invention may employ resistor, capacitor, and conductor elements that are not reaction formed and that as a result do not rely on these starting powders to form these elements; such alternatives are presented in later discussions.

No matter the source of starting powder, multiple criteria place maximum diameter limitations on powders used in the reaction forming package process. Diameter limitations for silicon powders are imposed by kinetics of the silicon reaction bonding process as well as by surface roughness limitations; both are satisfied for silicon particle diameters that are less than about 0.5 μm. The nitriding kinetics of titanium and tantalum powders permit the use of much larger particle sizes. However, the production of an RBSN-based package using screen printing techniques to produce thick film conductors, resistors, and capacitors by any of several suitable processes suggests that powder particle size preferably should not exceed 25%–33% of the screen size used for screen printing thick film lines and filling of vias using a slurry produced from the powder; this ensures that screen printing ink can flow through the screen holes. For example, given a 325 mesh printing screen, powder particles should preferably not be larger than about 10 μm–12 μm in diameter. As will be understood by those in the field of packaging, required powder characteristics and quality may vary with the particular package manufacturing process selected.

Turning now to starting powders and other materials for producing nitrided capacitor structures in accordance with the invention, it is first noted that the nitrided capacitor dielectric material resulting from the nitridation process is preferably one which, at high temperatures, exhibits a high dielectric constant and high electrical resistivity, as well as both chemical and thermo-mechanical compatibilites with the other nitride-based materials of the RBSN-based package. In one embodiment, silicon carbide is employed as this capacitor dielectric material. Other materials that meet these electrical and thermo-mechanical criteria may also be employed.

Polycrystalline silicon carbide is known to exhibit a dielectric constant of between about 40–42 and a high electrical resistivity at certain purities and stoichiometries, thereby lending itself well as a capacitor dielectric material; at 1 MHz and 25° C., it exhibits a dielectric constant of 42 and a resistivity of greater than $4 \times 10^{13}$ Ω-cm. In addition, silicon carbide exhibits thermal expansion and chemical compatibility with high purity RBSN and other suitable packaging materials like diamond and cubic-BN, as well as the important device material silicon.

For use as a capacitor dielectric starting material in a reaction formed package structure, silicon carbide may be synthesized in situ during the reaction forming process from a preceramic polymer such as vinylic polysilane, or from mixtures of high purity, small diameter silicon powders and preceramic polymers containing excess carbon. In the case of synthesis from a preceramic polymer such as vinylic polysilane, the polymer decomposes to form an amorphous Si—C material and then upon further heating, crystallizes to form crystalline SiC. Other comparable polymers similarly form amorphous Si—C—N and then crystalline SiC and/or $Si_3N_4$, depending on the composition of the polymer, in a two-step heating process during the nitridation step. The addition of silicon in an appropriate proportion to that of the excess carbon in the selected polymer promotes formation of a crystalline reaction product and phase purity. The details of the capacitor reaction forming process are provided in later discussions.

The starting materials for this capacitor reaction forming process may comprise a dielectric precursor consisting of vinylic polysilane or a mixture of silicon powder and vinylic polysilane or other suitable carbon-rich preceramic polymer. Such polymer starting materials may take the form of a powder, liquid, wax, or other form.

In an alternative technique, a thin sheet of silicon carbide, provided by, e.g., known vapor deposition processes, may be provided at an appropriate point in the formation of a green RBSN-based package, via a process described below in the process flow discussion.

Silicon Reaction Bonding Process

One example reaction bonding process employed in accordance with the present invention for producing RBSN electronic packages is based on a process in which a "green," i.e., undensified, powder compact, e.g., a silicon powder compact, is heated in a nitriding gas until the powder completely reacts to form a nitrided product, e.g., $Si_3N_4$ in the case of silicon. The silicon compact is formed in any one of the processes described below in a desired package component shape, e.g., as a substrate, sidewall, top cover, or other component or multi-component structure.

In the nitridation process, the nitriding gas is preferably $N_2$, a $N_2$—$H_2$ mixture, or $NH_3$, but other suitable nitriding gases may alternatively be used. A 22% volumetric increase is caused by the silicon nitridation reaction, but does not result in external shape change of the compact because the increase occurs within void space of the compact. As a result, a green silicon package compact that is 65% dense will produce a 79% dense RBSN package. Thus, the relatively simple nitridation process provides the ability to produce high-purity, net-shape electronics packages with no significant dimensional change. In addition, the nitridation reaction does not require the use of sintering aids or other additives for starting powders of sufficiently high purity.

Proceeding with the reaction bonding process, a powder to be reaction bonded is first formed into a desired shape, via, e.g., tapecasting, molding, pressing, or other suitable forming technique; such forming processes will be discussed below. Once formed as either a multilayer structure containing internal and external conductors, or as a molded or pressed piece possibly containing embedded conductors, a powder package compact is dried and burned out to evaporate solvents and binders in the structure, following a process similar to that for conventional ceramic processing. The particular drying and burn out schedule used is determined by the specific solvents and binders included in the structure, as well as the geometry of the package structure being nitrided, as will be understood by those in the field of ceramics processing.

In one example, where polystyrene is used as a binder and xylene is used as a solvent, the compacted package structure is first dried to remove the xylene by heating in a $N_2$ ambient at 150° C. for 2 hours, before which the temperature is ramped to 150° C. at a rate of 30°–35° C./hour. The compacted package structure is then preferably transferred to a furnace in which both binder removal and nitriding takes place, but as discussed below, a series of furnace transfers may be acceptable for certain processing conditions. After transfer to the binder removal furnace, atmospheric water is removed from the package structure, as well as the furnace environment, by heating the furnace at a rate of between 10° C./min and 20° C./min to a peak temperature of between about 130° C. and 150° C., at which temperature the furnace is held for about 0.75 to 2 hours, in vacuum.

The polystyrene binder is then removed by heating the structure either in vacuum or in $N_2$ through a ramped temperature schedule of about 10° C./minute, peaking at between about 270°–300° C., or in general, a temperature below the temperature of the onset of binder volatilization of the particular binder used. The temperature is then ramped to about 500° C. at a rate of 2° C./minute. This heating rate is chosen to control the binder removal rate, therefore assuring that no physical damage occurs to the package structure during this process. In a second example, where polysilazane is used as a reactive binder and toluene is used as a solvent, the toluene is removed using, e.g., a heating schedule like that given above, to a maximum temperature of about 50° C., to remain below the temperature at which pyrolysis occurs, after which the 500° C. burn out schedule like that given above is extended to about 750° C. to 850° C. to remove any volatile components. Because polysilazane is a reactive binder that converts to a ceramic during the nitridation process, most of the polymer remains after heating to 750°–850° C.

In a further example of solvent removal in which methanol is used as the solvent, green package structures are dried in a nitrogen ambient at room temperature for several days, and then the temperature is ramped at about 25° C./hour to a peak temperature of 20020 C., at which temperature the package structure is held for about 24 hours.

Reaction forming, like the processes just described, can be accomplished under a wide range of process parameters, and yet will still achieve complete nitridation of a green package structure. In general, the higher the heating rate of a part being nitrided, the higher the nitriding reaction rate. Higher reaction rates in turn produce increased levels of conversion in relatively shorter times and at relatively lower temperatures. Such a reaction schedule also causes increased uncontrolled heating from the exothermic nitriding reaction, however, which becomes progressively more damaging with increasing compact mass. In contrast, slower heating rates, used for more massive compacts, necessitate heating to a relatively higher temperature and for a longer time to assure complete conversion. Thus, as will be understood by those in the field of ceramics, the nitriding process schedule is selected based on the size of the compact structure, and further is based on the binders and solvents used with the starting powder, because binders and solvents also influence the nitriding kinetics.

The range of time and temperature nitriding parameters that produce complete nitridation of package structures across a range of package sizes and prior exposure histories may be illustrated by the following seven examples.

In a first example, a 0.5" diameter, 0.080"-thick green package component of silicon powder, 10 wt % polypropylene binder, and xylene solvent is first heated at a rate of 20° C./min to a peak temperature of about 125°, in a vacuum. This first heating step in vacuum was employed to remove any existing adsorbed species, and in some cases may be unnecessary. Then the binder was removed in an atmosphere of ultra high purity nitrogen gas; here the temperature is first ramped at a rate of 20° C./min to a temperature of 340° C. and then ramped at a rate of 1° C./min to a peak temperature of 560° C. Nitriding of the package component was then accomplished in the same atmospheric conditions by first ramping the temperature at a rate of 100° C./min to 1205° C., at which temperature the package was held for 4 hours, and then ramping the temperature at a rate of 0.5° C./min to a peak temperature of 1396° C., at which temperature the package was held for about 10 hours, after which the nitriding furnace was cooled to room temperature.

In a second example, a 0.5" diameter, 0.080"-thick green package component of silicon powder, 10 wt % polymethylmethacrylate binder, and toluene solvent was first heated at a rate of 20° C./min to a temperature of 110° C., in a vacuum to remove any adsorbed species. Then the binder was removed in an atmosphere of ultra high purity nitrogen gas by first heating at a rate of 20° C./min to a temperature of 160° C. and then heating at a rate of 2° C./min to a peak temperature of 500° C. The package structure was then nitrided by first ramping the temperature at a rate of 100° C./min to a temperature of 1254° C., at which temperature the package was held for 4 hours, and then ramping the temperature at a rate of 0.5°C./min to a peak temperature of 1394° C., at which temperature the package was held for 10 hours, after which the nitriding furnace was cooled to room temperature.

In a third example, a 0.5" diameter, 0.080"-thick green package component of silicon powder, 5 wt % polystyrene binder, and xylene solvent was first heated at a rate of 20° C./min to a temperature of 132° C., in vacuum to remove any absorbed species. After this drying step, binder removal was accomplished by heating in an ultra high purity nitrogen gas atmosphere at a rate of 2° C./min to a temperature of 540° C. The package was then nitrided by first increasing the temperature at a rate of 100° C./min to a temperature of 1255° C., at which temperature the package was held for 4 hours, and then increasing the temperature at a rate of 0.5° C./min to a temperature of 1396° C., the package being held at this temperature for about 10 hours. The package component was then cooled to room temperature.

In a fourth example, a 0.5" diameter, 0.080"-thick green package component of silicon powder and methanol solvent, and excluding any binder, was first dried in a nitrogen atmosphere, and then without exposure to air, was nitrided with the following schedule. In ultra high purity nitrogen gas, the temperature was first ramped at a rate of 1° C./min to a temperature of 1200° C., and then ramped at a rate of 0.5° C./min to a peak temperature of 1400° C., at which temperature the package structure was held for 1 hour. The package component was then cooled to room temperature.

In a fifth example, a 0.5" diameter, 0.080"-thick green package component of silicon powder and octanol solvent, and excluding any binder, was first dried in a nitrogen atmosphere by first ramping the temperature at a rate of 25° C./hour to a temperature of 200° C., at which temperature the package component was held for about 24 hours. Then, without interim exposure to air, the component was nitrided, in an atmosphere of ultra high purity nitrogen gas, by first heating the component at a rate of 3° C./min to a temperature of 1250° C., at which temperature the package component was held for 4 hours, and then ramping the temperature at a rate of 0.5° C./min to a peak temperature of 1400° C., at which temperature the package component was held for 7 hours and then cooled to room temperature.

In a sixth example, individual package structures of about 0.5" in diameter and 0.080" in thickness, formed of dry-pressed silicon powder having as-synthesized purities, were heated rapidly, e.g., at about 100° C./minute, from room temperature (or appropriate drying temperature) at about 1250° C., at which point the structure nitrided to completion in less than 10 minutes, after which they were cooled to room temperature.

In a seventh example, a thin-walled structure having a wall thickness of about 0.25", a length of about 12", and a diameter of about 4", formed of air-exposed silicon powder and a polystyrene binder, was nitrided by first loading the structure into the reaction chamber at room temperature, after which the chamber was evacuated for 12 hours. Nitrogen gas was then introduced into the chamber and the chamber was heated at a rate of 1.5° C./min up to about 490°–500° C., at which point the temperature was held constant for about 5 hours. The temperature was then ramped at a rate of 2° C./minute up to about 1180° C., at which point the temperature was held constant for 12 hours. Then in two final cycles, the temperature was ramped at a rate of 0.5° C./min to 1380° C. and held constant at this rate for 10 hours, and then ramped at a rate of 0.5° C./min to 1420° C., and held constant at this temperature for 10 hours, after which the chamber was cooled to room temperature.

As will be understood by those in the field of ceramics processing, a suitable nitriding schedule for a given package structure and desired nitriding state may be extrapolated from the above examples. For example, nitriding of large package structures or groups of smaller package structures preferably is accomplished with nitriding heating schedules that avoid excessive uncontrolled temperature rise from the exothermic nature of the nitriding reaction. If less than complete nitridation is acceptable for a specific application, a suitable nitriding schedule may vary substantially from the limits suggested by the examples and yet produce acceptable results. The rate of the nitriding reaction and the extent of nitridation is found to be directly impacted by the maximum nitriding temperature, the specific types and amount of any binders incorporated into a green package structure, the nitriding gas composition, the pressure of the nitriding chamber, and other expected materials and process parameter effects.

In any reaction schedule, the reaction bonding process kinetics are characterized by a first induction period, which may vary in length from less than 1 minute to several hundred minutes, depending on the specific process parameters, followed by a fast reaction period, leading to conversion. Although several reaction and transport processes are involved in controlling the nitridation process, nucleation of crystalline $Si_3N_4$ is the critical step. Until nucleation occurs at the onset of the fast reaction period, there is virtually no nitridation. Then, over a very short fraction of the nitridation schedule, seconds to minutes out of a cycle of minutes to hours, the majority of $Si_3N_4$ nuclei found in the final product form. The number, type and location of the nuclei that form define the final crystallographic $\alpha/\beta$ ratio, the grain size, and the structure of pore channels formed in the material, as discussed below.

While the spontaneous formation of $Si_3N_4$ nuclei during the nitriding schedule does indeed produce exceptionally high quality reaction-formed material in a reliable and reproducible process, the nucleation reaction step has major consequences on the subsequent reaction kinetics and on the characteristics of the resulting RBSN. Introduction of existing nuclei, or seed crystals, into the unreacted Si powder can provide the ability to achieve full nitridation at a lower reaction temperature and additionally, can render the nitriding process and resulting materials properties less susceptible to uncontrolled effects on the nucleation process.

Nitriding temperatures may be lowered with the use of preexisting nuclei because the growth stage of the reaction in this case proceeds at temperatures below those required for spontaneous $Si_3N_4$ nuclei formation. Preexisting nuclei may be formed by, e.g., heating the green Si powder to temperatures where nuclei form spontaneously, say between 1100° C. and 1200° C., and then cooling the powders after the desired level of conversion, which may be anywhere between 1% and 100% volume conversion, has been completed. Such prenucleated Si powder or other $Si_3N_4$ powder may be mixed with unreacted Si powder to act as seed crystals for the initiation of the nitridation process. Where suitable, powders other than $Si_3N_4$ may be employed as seed crystals to produce heteroepitaxial nucleation. In addition, prenucleation may be accomplished as an initial, separate heating step just prior to nitriding a green package component.

As mentioned above, a minimum purity of ultra high-purity grade nitrogen gas is preferred for use in the reaction process when high purity silicon powder, whether synthesized or obtained commercially, is used. This is because it is found that at the start of the process, as the temperature is increased, high purity silicon powder is extremely susceptible to oxidation from even trace levels of oxygen and water, (<10 ppm combined), that may be found in ultra high purity nitrogen gas, between the temperature region where hydrogen is lost from the silicon surfaces, i.e., above 400° C., and the temperature region at which nitrogen begins to react with the silicon, i.e., between 700° C. and 1000° C. In addition, high levels of oxidation may occur during the relatively long exposures to intermediate temperature levels during burnout. As a result, it is preferred that exposure to air be avoided between the burnout and nitridation steps when high-purity silicon powder is employed. This is easily accomplished by performing both steps in the same furnace.

However, it must be noted that if exposure to a room-temperature oxidizing atmosphere does occur before nitridation, heating in a vacuum at about 150° C. for 1 hour, before which the temperature is ramped to 150° C. at a rate of about 10°–20° C./minute, can remove adsorbed $H_2O$ from uncoated Si powders. Alternatively, Si powder may be coated with an anti-oxidizing layer; it has been observed that Si powder coated with polystyrene in a spray drying process can be exposed to air for weeks with no adverse effect on the nitriding kinetics. Thus, there is some amount of flexibility in addressing oxidation of high-purity silicon powder.

It must be again noted that for many packaging applications, less than the highest grade of RBSN quality is acceptable; such applications include those that do not require maximum thermal conductivities and those that do not involve maximum service temperatures. For such lesser grades of resulting RBSN, the purities of the nitriding gases and the Si powders are not critical. Oxides such as NiO, FeO, CoO, and others may in these cases be added to the starting Si powder to act as nitriding accelerators for overcoming any adverse effects of oxygen contamination.

A distinctive characteristic of RBSN and other reaction formed materials is a relatively high level of residual porosity; RBSN may exhibit as much as 50% porosity, and 25% porosity is typical. This porosity is inherently produced by the nitridation reaction because an interconnected pore structure is maintained during the reaction to allow for transport of $N_2$ throughout the part, whereby the entire volume of the powder compact is nitrided. In addition, the maximum achievable green packing density typical for silicon usually leaves some degree of voids.

The shapes and sizes of the interconnected pore structure of a high purity reaction formed package component are found to be uniform throughout a nitrided part. The porosity may be grouped into two categories, one comprising somewhat irregular larger pores and the other comprising narrow pore channels. The largest dimension of most pores is found to fall in the range of 20 nm to 250 nm, with an average pore dimension of about 130 nm, in the case where starting Si particle sizes are about 0.2 μm; these pores appear to be defined by the size and spacing of the silicon particles in the green compact. Pore channels are found to vary in width within an approximate range of 10 nm to 40 nm; these channels appear to be defined by the spacing between individual $Si_3N_4$ nuclei, among other factors. The remaining solid phase appears as an interconnected, high aspect ratio structure that extends in all directions throughout the microstructure. The widths of the solid phase are found to be in the range of 80 nm to 400 nm. The residual porosity of RBSN does not deteriorate its mechanical behavior, however. To the contrary, the strength of RBSN produced from high-purity silicon powder—up to 870 Mpa, and oxidation resistance of RBSN are essentially equal to that of fully densified $Si_3N_4$. This is an exceptional result considering the fact that it is possible to almost completely traverse the extent of a nitrided body through pore structures.

Reaction Forming Processes for RBSN-Based Package Conductors, Resistors, and Capacitors Reaction forming processes for powders and other materials selected to produce package conductors, resistors, and capacitor dielectrics proceed in manners similar to the silicon reaction bonding process. In all cases, a green, undensified structural compact formed via any of the processes described below in the manufacturing discussion is first prepared. Preferably, the package conductors are formed of nitrided titanium, the package resistors are formed of a nitrided phase of tantalum, and the capacitor dielectrics are formed of a pyrolized or nitrided silicon carbide precursor. Individual reaction processes for each of these phases are discussed in turn below, and adaptations of these processes for providing a unitary simultaneous reaction forming process are given in a later section. A wide range of alternative materials, including some that are not reaction formed, are contemplated by the invention as conductor, resistor, and capacitor materials that are compatible with RBSN package components. These alternatives are discussed later in this section.

Titanium powders having mean diameters less than 35 μm can be fully nitrided to produce TiN conductor lines and planes using a wide range of heating schedules, nitriding atmospheres, binders, solvents, and plasticizers. This insensitivity to processing parameters indicates that the Ti reaction forming process is robust with respect to process variables and prior exposures. In addition, a relatively small impact on Ti nitriding kinetics results from inclusion of binders and solvents.

As explained in detail below, this flexibility in the Ti nitriding reaction is exploited in the packaging system manufacturing process of the invention to enable optimization of nitriding parameters for simultaneous nitriding of a RBSN-based package structure that includes multiple nitriding phases, e.g., Si, Ta, and others. In one example Ti nitriding schedule for producing greater than 99.9% complete conversion of Ti to TiN, Ti package structures are first heated in vacuum in a ramping schedule of 20° C./min up to 150° C., at which point the temperature is held constant for 1 hour. $N_2$ gas is then introduced to flow at 1 atm of pressure, and the temperature is further increased at a rate of 5° C./min to a temperature of 1300° C., at which point the temperature is held constant for 8 hours, and then the reaction chamber is cooled to room temperature.

The first heating step in vacuum removes any existing adsorbed species, and in some cases may be unnecessary. With this example heating schedule, the Ti begins to react at above about 150° C. but below 400° C., and then progressively converts to TiN during the heating cycle. The conversion is effectively complete at 1300° C. The fact that the initiation and the majority of the reaction occurs well within the range of temperatures in the nitriding schedule given above demonstrates that alternative heating schedules may be employed to achieve equivalent conversion levels.

In some cases small-diameter Ti starting powders are shipped in water to minimize hazards resulting from the pyrophoric nature of these powders. Analyses of dried as-received powders by X-ray diffraction reveals the presence of a phase other than Ti which is poorly crystalline and which has an extremely small grain size. When nitrided at 1 atm. in $N_2$, it is found that water-exposed Ti powder fully nitrides to TiN without adverse effects on kinetics, and that the companion phase is converted during the nitridation to $Ti_3O_5$. After nitridation in 1 atm. of 95% $N_2$ and 5% $H_2$, no evidence of the companion phase exists.

Applicants' experimental evidence suggests that Ti transforms to TiN by mechanisms that differ from the mechanism observed for the nucleation and growth processes observed in the nitridation of Si. Phase diagrams indicate that $\alpha$-Ti, which has a hexagonal crystal structure, can incorporate large amounts of soluble nitrogen before transforming to the face centered cubic crystal structure of TiN. At equilibrium, $\alpha$-Ti would transform to nitrogen-deficient TiN through an intermediate E phase ($Ti_2N$) below about 1100° C. Reported phase diagrams indicate that the eutectoid temperature is as low as 1050° C., or as high as 1450° C.; still other reported phase diagrams indicate that a $Ti_4N_{3-x}$ phase may form as an intermediate. Applicants' experimental evidence indicates that $\alpha$-Ti transforms directly to nitrogen deficient TiN without any evidence of intermediate phases. Because the hexagonal close packed and face centered cubic crystal structures are closely related, the phase transformation may proceed without fracturing or otherwise damaging the package component structure during nitridation.

Consideration of the morphology of a nitrided TiN phase leads to a preferable Ti starting materials criteria. Because induced stresses and probabilities of failure both increase with grain size, upper grain size limitations may be placed on the Ti powder to avoid microcracking of the TiN phase. Additionally, the use of reactive binders enables direct formation of a continuously interconnected conductive phase to further compensate for a tendency of Ti particles to micro-crack. The starting Ti material may also consist of an alloy of titanium powder and other selected materials to reduce any tendency of the Ti to oxidize. In addition, the starting Ti material may include an amount of silicon powder, for producing a nitrided film consisting of a mixture of TiN and $Si_3N_4$.

In alternative techniques according to the invention, Ti starting material for producing reaction formed TiN conducting components is provided as, e.g., a foil of titanium. Such a foil is shaped to a desired conductor geometry and nitrided using a heating schedule with a peak temperature of at least about 1300° C. to provide complete nitridation of the Ti. Additionally, Ti starting films to be nitrided may be produced by thin film deposition techniques such as vapor phase deposition, sputtering, or other film deposition technique. Even further, Ti ink may be prepared, as described below, for screen printing Ti lines to be nitrided.

As explained earlier, the invention contemplates many alternatives to Ti for producing a nitride-based package conducting material. For example, TiC carbide, which has the same crystal structure as TiN, exists for compositions in which approximately half of the stoichiometric carbon atoms are missing, e.g., as in $TiC_{0.45}$. Substitution of TiC for Ti powder permits the formation of either TiN or $TiN_xC_{1-x}$ phases, depending on whether the C is fully substituted by N, without undergoing a phase transformation.

Other alternatives for producing a highly-conductive nitride include, e.g., Zr, which is reacted to form ZrN; advantageously, reactive precursors that serve as binders are well-known for this material. Other suitable conductive materials include carbides, borides, silicides, and mixtures or solid solutions of various such components.

The inventors herein have recognized the advantages of a nitrided conductor material that go beyond use of such a conductor with a RBSN-based electronics package. Accordingly, the invention contemplates use of reaction formed TiN conductors with electronics package components other than reaction bonded silicon. Such package components may consist of, e.g., alumina, sintered silicon nitride, aluminum nitride, or any other suitable package material.

Turning now to nitriding of starting tantalum powders for producing a resistive nitride phase, applicants experimental evidence demonstrates that nitridation of tantalum powder with an average particle size of 2 μm produces 99% conversion from tantalum to a tantalum nitride phase. In one suitable nitridation process according to the invention, dry-pressed tantalum powder shaped in a desired formation is first heated in vacuum at a ramp rate of 10° C./min to 130° C. to evaporate residual water. The resulting structure is then exposed to an ultra high pure nitrogen atmosphere and the temperature is further ramped at a rate of 5° C./min to a temperature of 1300° C. The temperature is then held constant for 8 hours, after which the nitridation process is found to be more than 99% complete.

Results of TGA provide evidence that the nitriding reaction of tantalum powder begins at about 510° C. and reaches completion at 1300° C. The maximum reaction rate is found to be 0.64 mg/min/cm$^2$, occurring when the temperature reaches 900° C. X-ray diffraction analysis reveals that the nitrided tantalum is a composite of two nitrided phases, the first being $\epsilon$-TaN, a hexagonal lattice of the B35 structure type, and the second being $TaN_{0.8-0.9}$, a hexagonal lattice of the MoN type. X-ray diffraction analysis also reveals that no unreacted tantalum remains after nitridation, and that the nitrided tantalum has a density of about 5.76 g/cc, corresponding to 35.4% of the theoretical density of $\epsilon$-TaN. In general, nitriding of tantalum to produce a resistive phase will produce a nitride of tantalum in any one of three possible phases of $TaN_x$, where $0.5 \leq x \leq 1$.

The invention contemplates a wide range of alternatives for use of resistor elements in a RBSN-based package. For example, a mixture of $Si_3N_4$ and a nitride of tantalum, a mixture of $Si_3N_4$ and a titanium nitride, or other combination of nitrided materials that provide a composite of adequate resistivity for a given application may be substituted for tantalum nitride alone. For the first example, a mixture of silicon powder and tantalum powder may be combined to form the resistor preform structure that is nitrided to produce a mixture of $Si_3N_4$ and a nitride of tantalum.

As with reaction formed TiN conductors, reaction formed nitrides of tantalum have been recognized by the inventors to be suitable for a wide range of electronics packaging systems beyond reaction formed silicon nitride. Accordingly, the invention contemplates use of resistor structures consisting of reaction formed nitrides of tantalum with package structures consisting of, e.g., alumina, aluminum nitride, sintered silicon nitride, and other suitable electronics package materials.

Considering a nitridation process for the last of the nitride-based package components provided by the invention, namely capacitor components, a preceramic polymer or combination of silicon powder and preceramic polymer are used to produce via a reaction forming process a silicon carbide dielectric layer in a capacitive structure on the RBSN package. As explained previously, a preceramic polymer such as vinylic polysilane may be employed in a two-step heating process; in the first step, the polymer decomposes to form an amorphous Si—C material, and in the second step the amorphous structure crystallizes to form crystalline SiC. Alternatively, a mixture of silicon powder and a carbon-rich polymer may be pyrolized in a nitrogen atmosphere to produce a resultant mixture of SiC and $Si_3N_4$. As will be understood by those skilled in the field of ceramics processing, the exact composition of such a mixture is partially determined by the polymer composition and partially determined by the reactant atmosphere. By selection of appropriate process parameters, as will be understood by those in the field of ceramics processing, the silicon carbide can be made the major phase of the composition, whereby the resulting dielectric constant can be selectively made to approach 42.

Several types of polymers either contain excess carbon or produce a carbon char when fired in a nitriding atmosphere; carbon from such sources may be employed with intimately mixed silicon to form SiC. Possible polymeric sources for carbon include polycarbosilanes such as Nicalon™, polydimethylsilaethylene, or polysilapropylene, polysilanes such as vinylic polysilanes, or polysilastyrenes. When heated in a nitrogen atmosphere during a nitriding step, such preceramic polymers decompose, first forming an amorphous Si—C material, and then as explained above, in a second heating step further forming crystalline SiC. Incorporation of silicon in an appropriate proportion to that of the excess carbon promotes formation of a crystalline reaction product and phase purity.

Enhancement of Thermal Conductivity and Thermal Expansion Coefficients in Reaction Formed Package Materials As mentioned in previous discussions above, the thermal conductivity of reaction bonded silicon nitride is comparable to that of the common package material alumina and when oxygen contamination of high-purity silicon nitride is reduced below approximately 0.5%, its thermal conductivity may be 4 to 6 times that of alumina. Thus, while providing superior dielectric properties and superior thermal compatibility with silicon and silicon carbide, reaction bonded silicon nitride is ideally suited for high temperature electronic device applications.

In pursuit of these applications, in accordance with the invention, applicants have developed materials processing techniques for increasing the thermal conductivity of reaction formed materials, such as reaction bonded silicon nitride, to thereby adapt the materials for high temperature applications such as high temperature electronics packaging. In a first such technique, appropriate materials of relatively high thermal conductivity are add-mixed with the starting powder of the material to be reaction formed to produce a final reaction formed composite material of a thermal conductivity higher than that of the starting material alone. Conductivities of a three or more phase material are described by well-known models; such is also true of an RBSN matrix of $Si_3N_4$, additive material, and porosity. When made properly, conductivities of multiphase materials approach a straight-line rule of mixture values based on the volume fractions of the constituent phases.

Additive materials are chosen in accordance with the invention based on criteria primarily including high thermal conductivity, but also including thermophysical and thermodynamic compatibilities with the material to be reaction formed, e.g., comparable thermal expansion coefficients, compatibility with the reaction forming atmosphere and temperature range, i.e., general compatibility of nitriding reaction kinetics, and chemical stability with respect to the reaction formed products.

The material additive may function in either of two manners, depending on its particular materials properties. Firstly, additive materials which are not impacted by the nitridation process produce an inert filler that is not itself nitrided, but that by the nature of its mixture with the nitrided starting material produces a composite material having a higher thermal conductivity than that of the starting material alone.

Additives for increasing the thermal conductivity of reaction bonded silicon nitride produced from silicon are selected from one of, e.g., diamond, hexagonal boron nitride, cubic boron nitride (cubic-BN), or AlN powders, or other suitable powder, used individually or in combination. Such combinations may be employed to achieve specifically desired overall thermal expansion behavior while at the same time enhancing thermal conductivity—AlN additives specifically provide both of these objectives.

In one example of such a combination according to the invention, AlN is added to RBSN to adjust the composite thermal expansion coefficient so that it precisely matches those of device and/or heat spreader materials, while at the same time raising the thermal conductivity of the RBSN matrix composite. Considering, for example, silicon carbide as the device material to which the thermal expansion of a RBSN package is to be matched, the thermal expansion coefficients of RBSN, SiC, and AlN at 500° C. are $2.3 \times 10^{-6}$, $4.0 \times 10^{-6}$, and $6.1 \times 10^{-6}$ $C.^{-1}$, respectively, as shown in the plot of FIG. 1. Based on the rule of mixtures and using appropriate material densities and molecular weights, a mixture of 47 vol. % RBSN and 53 vol. % AlN produces a composite package material having a thermal expansion coefficient equal to that of SiC at 500° C. The corresponding batch mix for the reaction formed composite is made up of 64 wt. % AlN and 36 wt. % silicon. As will be understood by those skilled in the field of ceramics processing, final compositions depend on actual thermal expansion coefficients of the composite phases and the microstructurally-dependent relationships between composite properties and volume fractions.

A preferable high-thermal conductivity additive according to the invention is diamond. The inventors herein have successfully demonstrated incorporation of diamond powder into a green silicon preform package component structure for producing a RBSN package component that exhibits superior thermal conductivity.

In one example of this process, a slurry was first produced, consisting of 27 wt % silicon, 68 wt % diamond powder, of 6–12 micron diameter, and 5 wt % polystyrene binder. The two powders were mixed in a solution consisting of 6 wt % polystyrene in xylene. The resulting slurry was dried in a glove box in a nitrogen atmosphere before the powders were dry pressed to shape a green preform.

The shaped preform was nitrided in flowing ultra high purity nitrogen gas at a pressure of 1 atm. In a first heating step, the temperature was increased at a rate of 20° C./min to a temperature of 165° C., in vacuum. The package component was held at this temperature for 1 hour to remove residual water vapor from the part. Then, after establishing a flowing nitrogen atmosphere, the heating schedule was continued by ramping the temperature at a rate of 10° C./min to a temperature of 280° C., followed by a temperature increase of 2°/min to a temperature of 1250° C. The component was then held at this temperature for six hours. After this six-hour hold, the temperature was raised to a temperature of 1365° C. at a rate of 0.5° C./min, held at this temperature for 6 hours, and then again raised at a rate of 0.5° C./min to a peak heating temperature of 1400° C. After a one-hour hold period at this temperature, the furnace was then cooled to room temperature.

Generally, additives like diamond, AlN, and the other candidate additives discussed above are inert with respect to silicon powder and a nitriding atmosphere, and will thus not actively participate in the reaction forming process. Although chemically inert, some crystalline additives may act as heterogeneous nucleation sites for the emerging $Si_3N_4$ phase. In this case, the additive particles may be coated with a protective coating, e.g., crystalline or amorphous silicon nitride, that may be applied by a number of well-known gas- or liquid-phase processes. Example coating techniques include fluidized bed gas-phase reactors, use of polysilazanes, or other suitable process.

High purity diamond, cubic or hexagonal boron nitride, AlN, and other additive powders are readily available in high-purity state. AlN powders may be obtained from, e.g., H. C. Starck, Dow Chemical, and Tokyama Soda. Cubic-BN powders may be obtained from General Electric, De Beers, Sumitomo, and Showa Denko. Diamond powders may be obtained from GE Abrasives, Worthington, Ohio.

In a second technique for increasing the thermal conductivity of a reaction formed packaging material, a reactive binder is added to the material to be nitrided to increase the fractional density of the resulting material, and correspondingly increase the thermal conductivity. This technique thereby effectively compensates for the lower density of nitrided materials that is due to the porous morphology inherent in the reaction forming process. For example, in one such technique, a polymer composition is added to silicon powder to be reaction formed. In a second technique, a polymer is infiltrated into the porous RBSN structure after completion of the nitridation process.

In accordance with the invention, polysilazanes provide a well-suited group of preceramic polymers that may be incorporated into an RBSN package structure to increase its conductivity by means of increasing its fractional density. During pyrolysis these preceramic polymers convert to a ceramic which can vary in chemistry and crystallinity. When pyrolyzed in an ammonia atmosphere, the product may approach phase-pure $Si_3N_4$. As discussed above, the polysilazane may be incorporated either as a reactive binder for silicon powder before nitridation, or may be infiltrated into a RBSN package structure after the nitriding process. Applicants' experimental evidence demonstrates advantages for introducing such polysilazanes to the Si powder for the case where intrinsic RBSN is the reaction-formed package insulator material and for the case where a thermal conductivity enhancement additive, such as cubic-BN, is added to produce a higher thermal conductivity matrix.

Infiltration of a RBSN package component with a desired precursor is accomplished as follows. The package component is immersed in a solution of the precursor for a time adequate to saturate the component with the solution. Such infiltration is facilitated by carrying out the process under a vacuum, whereby any air that is entrained in the pores of the component is removed and the solution more easily infiltrates deeper into the pore structure. Once the component is saturated with solution, it is dried and then heated to pyrolyze the precursor. This process may then be repeated any number of times until a desired density of infiltrant is obtained.

In yet another alternative process provided by the invention for increasing the thermal conductivity of a RBSN package, a reactive polymeric binder is added to the material to be reaction formed and the binder itself reacts during the process to form a nitrided material other than the starting material added. In one example, a preceramic polymer which forms AlN upon reaction may be added to silicon powder to be nitrided for the formation of RBSN. In a second example, a RBSN structure is infiltrated with nonvolatile liquid precursors or precursors dissolved in a suitable solvent, as will be understood by those in the field of ceramics. Precursors have been reported and are known for preparing high-purity AlN powders that may be employed in the invention; such high-purity powder is required to maximize the thermal conductivity of AlN.

Several known polymeric compounds are well-suited as AlN precursors in accordance with the invention. For example, organoaluminum amides may be obtained by reacting trialkylaluminum compounds with ethylene diamine. Additionally, polymeric precursors may be prepared electrochemically from Al and primary amines such as n-propyl amine. Such a reaction produces a high-viscosity liquid at a temperature of about 80° C.; at higher temperatures a gel or foam is obtained that can be dried under vacuum and pyrolized under ammonia to obtain AlN in a yield of about 42%. Polymeric precursors may also be prepared by an amine exchange reaction between $[(CH_3)_2N]_3Al$ and various amines, $RNH_2$, or diamines such as $NH_2CH_2CH_2NH_2$. When pyrolyzed under ammonia, an exchange reaction occurs and an aluminum imide $(Al(NH)_x)$ is formed, which can be thermally converted to AlN.

Alternatively, precursors derived from alkoxides may be used to produce AlN powders or films. In order to synthesize a precursor such that it contains Al—O bonds, an Al alkoxide is preferably used as a starting material. For example, a polymeric precursor may be prepared by partially hydrolyzing aluminum butoxide, which contains a specific amount of furfuryl alcohol, as a source of carbon for the carbothermic reduction of $Al_2O_3$. When pyrolized under ammonia, AlN is formed according to the following equation:

$$Al_2O_3 + 3C + 2NH_3 \rightarrow 3CO + 2AlN + 3H_2$$

When these alkoxide precursors are decomposed in an ammonia or nitrogen atmosphere, AlN is obtained at temperatures below 1400° C. Additionally, alkoxide-derived $AlO(OH)_x$ gels mixed with carbon may be nitrided under $H_2$—$N_2$ to produce AlN.

A third technique for increasing the thermal conductivity of reaction formed materials is based on recognition by the applicants that the thermal conductivity of porous reaction-formed ceramics like reaction bonded silicon nitride is, to some extent, limited by phonon scattering from extremely small grain sizes that characterize these materials. In this third technique, the thermal conductivity of such materials is increased using additive materials which increase the grain size of the final material beyond that which the starting reaction formed material would normally exhibit. For example, nitride seed crystals may be added to a starting powder to limit nucleation of the powder, at the start of the nitriding process, to a small number of sites relative to the number of sites at which nuclei would normally spontaneously form. This technique provides the ability to achieve full nitridation of the starting material and to maintain precise control over the microstructural features of the material.

In one application of this technique, silicon nitride particles are added to starting silicon powder to be nitrided. The silicon nitride particles define which polymorphic phase results from the nitriding process. Thus, selected ratios of α- or β—$Si_3N_4$ particles may be added to the silicon powder to achieve a desired phase ratio. A suitable process for production of $Si_3N_4$ particles to be added to silicon powder was presented above in connection with the use of added $Si_3N_4$ particles as a means for prenucleating a silicon powder to be nitrided. That $Si_3N_4$ particle production process is equally applicable here.

Considering the impact of impurities on RBSN conductivity, it is known that the low- to intermediate-temperature thermal conductivity of covalently bonded materials like $Si_3N_4$ is controlled by defects which scatter phonons. Impurity atoms at concentrations that typify most ceramic materials are the most closely spaced of all defects, and so are the primary cause for restricting phonon thermal conductivities to levels that are far below intrinsic levels.

Figure 11:
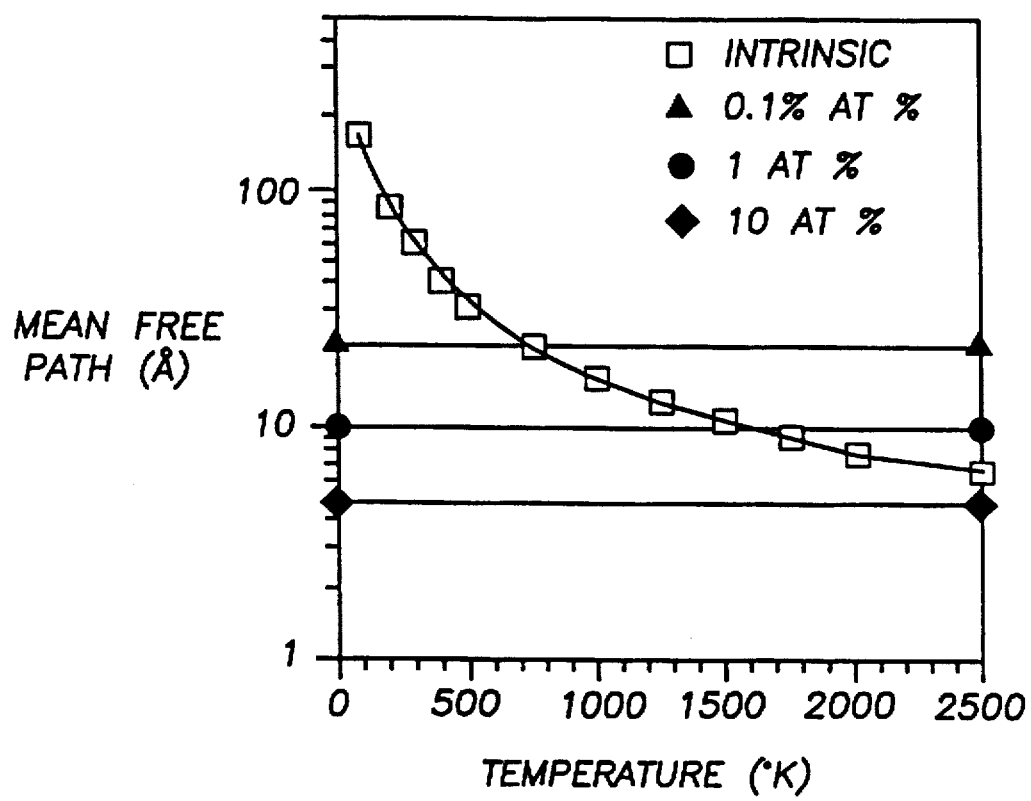
FIG. 11 is a plot of the relationship between intrinsic and impurity-controlled phonon mean free paths and temperature.

This phenomena is illustrated for silicon carbide in FIG. 11, which plots the temperatures for which phonon thermal conductivity transitions from extrinsic to intrinsic values for three silicon carbide impurity levels. As shown in the figure, even at 0.1 atomic percent impurities, SiC's thermal conductivity is impurity-controlled at temperatures less than about 800° C., corresponding to a phonon mean free path of approximately 20 Å. Although intrinsic values for $Si_3N_4$ are not reported, its behavior is understood to be similar to that of SiC.

While impurity levels cannot, as a practical matter, reach values low enough to permit intrinsic behavior near room temperature, extrinsic thermal conductivities do increase with improved purity levels. Experimental results with chemically vapor deposited $Si_3N_4$ indicate that oxygen is the principal impurity of concern for $Si_3N_4$. Thus, semiconductor-purity RBSN containing approximately 25% porosity may be expected to exhibit thermal conductivities up to approximately 120 W/m·°C. if processed under anaerobic conditions to reduce the oxygen impurity.

Production of Hermetic Package Structures From Reaction Formed Ceramic Materials As explained previously, the reaction formed package materials of the invention are porous; this porosity is interconnected and open-cell, i.e., the porosity extends through the nitrided material and is open to the environment at the material boundaries. In the case of reaction bonded silicon nitride, open-cell porosity is by definition a result of seeking complete nitridation, due to the need for free transport of nitriding gas throughout the internal volume of the silicon material being nitrided. Without such porosity, the nitriding reaction would be incomplete. Similarly for other reaction formed materials including polymeric ceramic precursors, such as a polysilazane, the interconnected pore structure of a reaction formed package component permits product gasses to escape from interior regions of the reacting composite material as well as to permit penetration of reactant gasses into interior regions of the part.

In accordance with the invention, there are provided techniques which achieve external hermeticity of a reaction formed package structure through any of several alternative processes. Hermeticity of an electronics package is particularly important in many critical applications for providing barriers to liquids and gases, especially moisture, and thereby to ensure reliability and avoid device degradation. For example, electronics subjected to accelerated temperature increases in, e.g., an engine compartment, could fail catastrophically if the electronics' packaging were to absorb liquid into the packaging material before being heated to temperatures above the liquid's boiling point. Thus, hermeticity of reaction formed packaging materials is a critical characteristic for adapting the materials to high performance electronics packaging applications.

Importantly, the processes provided by the invention for producing hermeticity accommodate internal porosity inherent in the reaction formed materials' morphologies. This porosity has critical advantages for package structures; e.g., low modulus, low dielectric constant, high strain to failure, low specific gravity, superior thermal shock resistance characteristics, and resistance to radiation damage are provided by the porosity.

In a first technique for producing a hermetic package, the open pore structure of the nitrided package material is processed to produce closed-cell porosity, i.e., the interior pores are isolated both from one another and from exterior surfaces of the nitrided material after that material has undergone the nitriding reaction. Pore isolation is here achieved by blocking the necks between individual pores throughout the nitrided part. This pore blockage is accomplished by providing a limited amount of liquid distributed uniformly throughout a part at the completion of the nitriding process, after which the liquid is coerced into flowing to the interior neck regions, at which point the liquid is solidified to close off the pore necks.

Specifically, in an example of one suitable approach to this technique, a high-melting temperature material which will not melt during the reaction forming process is added to the reactant powder normally used for reaction forming, and the added material is then melted after the nitriding is completed, whereby due to surface tension relationships the liquid flows into the pore necked regions, which have the smallest characteristic radius of curvature. The high-melting temperature material must thus have a melting point exceeding between, e.g., 1250° C. and 1400° C., in the case of reaction bonding of silicon, depending on the purity of the silicon powder to be reacted. As those skilled in the art of ceramics processing will understand, the selected high-melting temperature material should preferably require a melting temperature that is lower than the temperature at which RBSN will dissociate, about 1800°–1850° C. Advantageously, for the case of silicon, there is little or no impact on nitriding kinetics from a high-melting temperature additive.

Refractory silicate glass compositions, e.g., powders of high-temperature silicon oxynitride glasses and $SiO_2$ with $B_2O_3$ or $Al_2O_3$ additives, provide one class of suitable materials for blockage of RBSN pore necks. At higher nitriding temperature ranges, required of higher purity silicon powder that has been contaminated with, e.g., solvents, binders, dispersants, and perhaps oxygen, and required for lesser grades of silicon powder, a crystalline powder and product is required; e.g., a pure or substituted mullite ($3Al_2O_3 \cdot 2SiO_2$) material is preferred. Such minerals provide matched thermal expansion coefficients, suitable melting points, about 1850° C., and reasonable chemical compatibility.

The selected high-melting temperature material is added, typically as a powder, to those material components for the normal reaction forming process. If a glass composition is added, the composition may be formulated using conventional processes by mixing carbonates in desired ratios, then driving off $CO_2$ in a calcining step, after which the mixture is melted to homogenize it. Alternatively, batch compositions may be formulated from alkoxides and fired. Such glass compositions are available commercially from Corning, Schott, Ferro, and Nippon Electric Glass, among other suppliers.

The high-temperature additive may also be introduced as a mixed powder of, for example, $SiO_2$ and $Al_2O_3$ or mullite. Alternatively, the reaction bonding powder, e.g., silicon powder, may be coated with a high-temperature material either before or infiltrated after the powder has been formed into a desired net-shape prior to reaction bonding. Such an additive in this case provides dual functions, serving both as a binder for the green part and a pore blocking mechanism. For example, particles could be coated with alkoxides in proportions used for a typical glass formation. Successful powder coating requires achieving adequate contact angles between the reactive powder to avoid inadvertent depositing of the high-temperature additive at grain boundary sites. Ideally, an additive does not wet grain boundaries so that it would be concentrated at triple points in the RBSN. In this location, the additive has minimal adverse effect on thermal conductivity and high-temperature mechanical properties.

Whether the reactive powders are coated or a high-temperature additive powder is mixed in, using any of conventional mixing techniques, reaction bonding of the net-shaped part preserves both solidity of the added material and uniform distribution of the added material throughout the reaction-formed ceramic. After the reaction step, the multi-phase material is heated to the appropriate melting temperature for the selected admixture; as the admixture melts, it flows into the narrow necked regions in the continuous pore structure between the reacted particles. The material is held at the elevated temperature until pores are isolated by the fluid, and then cooled.

Upon solidification of the high-temperature material, the pore necks become closed off and the reaction bonded material is rendered closed-cell and hermetically sealed. Importantly, this hermeticity is redundant; distribution of blocked pore necks throughout the interior of the nitrided material establishes a plurality of interior hermetic barriers that is superior to a single external hermetic barrier.

A critical accomplishment of this technique is establishment of an initial uniform distribution of pore blocking material prior to the nitriding process. This permits forming and moving pore blocking liquid to the pore necks only after the nitriding process is complete, so that grain boundaries of the nitrided material remain free of the low melting point impurities commonly found in ceramics, and the nitrided material retains nearly-intrinsic high-temperature properties.

In addition, because this technique concentrates melted liquid in the neck regions between pores, volume change occurring during crystallization can be accommodated locally by the void space remaining between the neck regions. In this process, crystallization may occur during cooling or may occur isothermally at high temperatures. Crystallization during cooling occurs for the additive mullite, where the mullite powder is melted during a temperature increase at the end of the nitride process, after which crystallization occurs during cooling, once the liquid mullite has flowed into the neck regions. In the case of a glass-ceramic additive, which flows as a viscous liquid at the completion of nitridation, crystallization occurs even while an elevated temperature is maintained.

Considering reaction formed materials other than RBSN for which this pore blocking technique is advantageous, reaction formed silicon carbide may be rendered hermetic by a similar process. This may be important for capacitor package structures. Additionally, this technique may be applied to still other types of reaction formed ceramics. For example, particulate-filled or fiber-filled ceramics bonded with polymeric ceramic precursors may be rendered hermetic by mixing a selected high-temperature pore blocking material with the particulate, fiber, or other fillers during the preform process; in one example, SiC fiber-reinforced RBSN is mixed with mullite. Then, in a process similar to that of the nitriding process, the ceramic is pyrolyzed and then the temperature is raised to melt the additive and allow it to flow as a liquid into pore necks.

In a second approach for this pore blocking technique, the pore blocking additive is introduced into the interconnected pore structure after a packaging structure is nitrided. Here pore closure is accomplished in the manner described above, i.e., by heating the nitrided and infiltrated package to temperatures in excess of the additive melting point so that the melted additive, now liquid, flows to close the interconnected porosity.

For a RBSN package structure designed for low-temperature applications, hermeticity may be produced in a similar manner using an epoxy or other thermosetting polymer. In this case, the polymer is applied at room temperature to the reaction formed structure for introduction into the interconnected pore structure of the package.

An alternative to these pore blocking techniques is an external coating technique in accordance with the invention. Although it was stated above that in some cases the pore blocking technique may be superior to surface coatings, due to the inherent redundancy provided by pore blocking techniques, such a coating technique is attractive because of the low cost and flexibility of the process. Coatings may be applied at many stages of package fabrication, permitting a range of options for sealing various package surfaces. In addition, a wide range of coating processes are suitable, offering a range of options for limiting the maximum processing temperature necessary for achieving a satisfactory coating.

In an example of a coating process according to the invention, an assembled and nitrided package is dipped into a polymer-solvent solution of, e.g., polysilazane and a suitable solvent, e.g., toluene, mixed in a proportion that provides a suitable viscosity. The viscosity of the solution and the time of dipping immersion are controlled to correspondingly control the depth of penetration of the liquid into the porous package. When the liquid has suitably penetrated the part, it is removed, any excess solution is removed, and the part is dried by evaporating the solvent. Once dried, the package is heated in either an inert or nitriding atmosphere by established, known procedures, to produce a ceramic coating. This coating may be crystalline or amorphous, depending on the selected firing temperature. As was stated earlier, polysilazane produces product gases during heating. When used as a hermetic coating material, the diffusivity of these product gasses through a layer of polysilazane to the atmosphere must be considered; a polysilazane hermetic sealing layer should preferably be thin enough to permit diffusivity of the gasses during the heating stage.

Similarly, SiC coatings may be produced using polycarbosilanes, and a wide range of oxides and nitrides can be produced using known alkoxide-polymer combinations. For RBSN packages to be used in applications at only low to moderate temperature levels, the polymeric infiltrant selected may suitably be a thermosetting polymer, e.g., an epoxy or polyester. Localized coatings or coatings with unconventional, specialized properties may be cured by subjecting appropriate polymers to ultraviolet light or other appropriate electromagnetic radiation, e.g., neutrons.

In a further example of a coating process according to the invention for hermetically sealing an RBSN package, a nitrided RBSN package structure is first coated with a vapor-deposited silicon layer via standard plasma vapor deposition, chemical vapor deposition, sputtering, or other suitable process, and the coated part then undergoes a second nitriding step. During this second nitride step, the silicon layer itself nitrides and thereby provides an adherent and hermetic coating that extends an amount into the depth of the reaction formed material. Kinetic factors limit the coating thickness to less than about 1–10 μm.

Other vapor deposition processes and hermetic coatings are also contemplated by the invention. A particularly advantageous application of the hermetic coating technique of the invention is directed to vapor deposition of a synthetic diamond film on the surface of a nitrided part. Given the extremely high thermal conductivity of diamond, its application as a hermetic coating may also be exploited to increase the thermal conductivity of the nitrided part it is deposited over. Similarly, coatings of $Si_3N_4$, SiC, AlN, and other similar materials may be employed to achieve a hermetic RBSN package structure.

Diamond films and/or free standing diamond layers may be obtained from the following suppliers: Norton Diamond Film, Northboro, Mass.; Diamonex, Inc., Allentown, Pa.; Crystallume, Menlo Park, Calif.; and Ratheon Company-Elect. Syst. Div., Sudbury, Md. Diamond, $Si_3N_4$, SiC, AlN, or other coating may be deposited using vapor deposition, sputtering, or other conventional and well-known deposition technique.

Hermetic sealing of external package surfaces can also be achieved using a glass glazing process. For example, a borosilicate glass (BSG) having a composition similar to Pyrex™ may be applied using well-known ceramic processing techniques. In an example of such a technique, the glass is applied to the package surface in the form of an aqueous slurry of the glass powder. Application can be accomplished by dipping, spraying, or other suitable process. Alternatively, dry powders can be applied to the surfaces of the package. Here, the unfired glass powder is first dried, and then the coated part is heated to a temperature at which the glass flows—the high end of the working range, e.g., $10^3$–$10^6$ poise—and the temperature is held constant for a time suitable to allow the particles to coalesce and form a smooth surface, after which the part is cooled.

Hermetic sealings can also be achieved by controlled oxidation processes. In an example process, a RBSN package structure to be sealed is heated in an oxidizing atmosphere at a relatively low temperature, e.g., between about 850° C.–1050° C. These conditions promote controlled internal oxidation. Heating thereafter to a higher temperature range, e.g., 1250° C.–1350° C. promotes oxidation on external surfaces and pore closure by the oxide growing on the internal pore neck surfaces.

Simultaneous Reaction Forming of a Multi-Component RBSN-based Ceramic Package

Using adaptations of the reaction forming techniques discussed above, the invention enables production of a RBSN-based electronics package that includes compatible dielectric, conductor, resistor, and capacitor materials, all of which may be reaction formed in one step. Specific processes for forming a green package structure to be reaction formed are discussed in later sections; with any of these processes, a green package structure consisting of dielectric, conductor, and possibly resistor and capacitor elements are formed in essentially their final dimensions before the nitridation treatment. As explained above, with the selection of reaction bonded silicon nitride as the dielectric, preferably conductors are formed of nitrided Ti, resistors are formed of a nitrided tantalum phase, and the dielectric component of capacitors are formed of a nitrided Si—C—N phase. After formation of a green part corresponding to this combination, a reaction forming process is undertaken to nitride the entire part.

In an alternative to the use of thin or thick films of titanium or other film-based material for the production of a nitrided package conductor, tungsten or molybdenum lead pins are incorporated into a green package structure, following the design schemes described in later sections, to produce an RBSN-based package that utilizes a combination of discrete conductor lead pins and wire bonding to make connection to an electronics component housed in the package. Both tungsten and molybdenum are thermodynamically compatible with the nitriding process. Molybdenum may react with adjacent silicon during the nitriding process, however, to produce $MoSi_2$, if such a reaction is undesirable, a precoating of the molybdenum lead pins with a barrier material may be used to isolate it from the silicon powder package preform and thereby inhibit any possible reaction.

In accordance with the invention, the nitriding process parameters and starting materials for each constituent phase of an RBSN-based package may be slightly altered to achieve compatible nitriding rates for all constituents. Each constituent phase has distinct nucleation and growth kinetics when isolated from the others; when in intimate contact the phases present numerous opportunities for interacting with one another, as well as creating additional reaction pathways. Thus, in general, the altered process and material constituents are employed to manipulate the nitriding kinetics of the individual phases in a manner such that each phase is effectively nitrided and at the same time able to accommodate the required nitriding kinetics of the other phases.

It will be understood by those in the field of ceramics processing that such manipulation of kinetics is possible; for example, simple hydrocarbons like polyethylene and polystyrene may be employed in the invention to extend the induction period of nitridation for silicon, but have little effect on the fast reaction rate or the extent of conversion at nominally 1250° C. Use of polysilazane binders lengthens the induction period of nitriding silicon, retards the fast reaction rate, and causes premature termination of the fast reaction period of silicon nitridation for temperatures in the range of 1250° C.; temperatures approaching 1400° C. are needed to achieve complete nitridation of silicon powder that has been exposed to polysilazane, however. This requirement is accommodated by enhancing the silicon nitridation process with use of, e.g., $Si_3N_4$ nucleation seeds. Similarly, use of reactive binders and substitution of a hydrogen containing atmosphere for a nitrogen atmosphere shifts the onset of the Ti nitriding process to higher temperatures compared with the temperatures required when fugitive binders and a nitrogen atmosphere are employed.

One reactive binder that may be employed to accomplish this shift of Ti nitriding kinetics may be produced as follows. First 6.8 g (0.02 mol) of titanium butoxide is dissolved in 10 g of tetrahydrofuran (THF) and then 1.08 g, or 0.011 mol, of furfuryl alcohol is added. Separately, a 10% solution of $H_2SO_4$ is prepared and 0.54 g of this solution is dissolved in 10 g of THF. The 10 g of acidified THF is then added to the titanium butoxide solution and the mixture is refluxed for 2-4 hours. The solvent is then removed under vacuum; an amber-colored polymer is achieved which then may be redissolved in THF or toluene. Note that if this polymer is heated above 100° C. to remove the solvent, it can not be completely redissolved in any solvent.

With this reactive binder, a Ti powder to be formed as package conductors is mixed, using standard procedures, with the binder formed in one of the manners described below. During the reaction forming process, the Ti powder is nitrided while the binder is pyrolyzed. As the Ti powder nitrides, clean surfaces on the forming TiN grains serve as effective seeds for the pyrolysis product. At the end of the reaction forming process, a TiN material is produced having much of its porosity filled with the polymeric reaction product. Thus, this process produces a denser TiN phase because the simultaneous nitridation and pyrolysis processes produce products that both fill internal voids existing at the start of the process.

In one experimental example of a nitriding process according to the invention for simultaneously nitriding dielectric, conductor, and resistor phases, a green silicon substrate preform, titanium conductor preform, and tantalum resistor preform were together reaction formed to produce reaction bonded silicon nitride, reaction formed titanium nitride, and a nitride of tantalum: In a nitrogen atmosphere of 1 atm, a green preform of the three materials was first heated to 500° C. at a rate of 2° C./minute, and then held at that temperature for about 0.5 hours; this effectively provided burn-out of the binders in the powders. Thereafter, the nitriding was completed by heating the preform to 1250° C. at a rate of 2° C./minute, and then held at that temperature for 11 hours. Then the temperature was increased to 1350° C. at a rate of 0.5° C./minute, and held at 1350° C. for 3 hours. In the last heating step, the temperature was again increased, here to 1400° C., at a rate of 0.5° C./minute, and held at 1400° C. for 1 hour. The temperature in the nitriding atmosphere was then quenched to room temperature. This nitriding schedule successfully produced simultaneous nitriding of dielectric, conducing, and resistive phases based on starting materials of silicon, titanium, and tantalum. This example is not meant to limit the scope of process parameters contemplated by the invention for providing successful and complete nitriding; as will be understood by those skilled in the art, the temperature ramp rate, peak heating temperature, time, and other process parameters may be adjusted to accommodate various material phases to be simultaneously nitrided.

Because the nitridation mechanisms for titanium and tantalum differ from that of silicon, nitrided titanium and nitrided tantalum experience volumetric shape changes during the nitridation reaction. A molar volume change of 8.1% occurs during the nitriding of titanium, and a molar volume change of 9.7% occurs during the nitriding of tantalum. The average linear dimensional changes of these materials that occur during nitriding are approximately ⅓ of the volumetric change if no change in porosity occurs during the reactions. Thus, linear dimensional changes of nitrided titanium and tantalum are about 2.7% and 3.2%, respectively.

These dimensional changes occur in three separate stages. Because both titanium and tantalum incorporate substantial nitrogen in solution before transforming to a nitride phase, approximately 10%–20% of the total dimensional change of the elements occurs during the nitrogen dissolution steps. Both elements transform initially to nitrogen deficient phases; thus approximately 60%–70% of the total dimensional change of the elements occurs during the initial phase of transformation.

Nitrogen deficient $TiN_x$ begins to form between 400° C. to 800° C. in the nitrogen atmosphere; nitrogen deficient $TaN_x$ begins to form at approximately 500° C., based on weight gain. After transformation of both elements to nitrogen deficient compounds, the nitrides continue to expand as more nitrogen is incorporated into the crystal lattices; approximately 10%–20% of the total dimensional change occurs during these final nitrogen incorporation steps.

Considering the impact of these volumetric changes in nitrided titanium conducting lines and nitrided tantalum resistor elements in an RBSN-based package, it must be recognized that these elements are generally located on the surfaces of a RBSN substrate, as shown in later package design discussions. Thus, while the dimensional changes of the conducting lines and resistor elements are relatively large, generally they will not induce significant stress levels in the more massive RBSN substrate. Even if the conductor lines or resistor elements are embedded in the substrate or sandwiched between layers of the package sidewalls, the volume fractions of material which dimensionally change are so small that they will not induce a significant macroscopic effect on the overall dimensions of the entire part. Local stresses in the vicinity of an embedded Ti or Ta region could, during the nitriding process, produce damage if all of the phases in contact were rigid at the time of dimensional change. However, when exposed to solvents, binders, and plasticizers, as in the fabrication processes described above, silicon powder undergoes a majority of its nitriding reaction at temperatures in excess of 1200°–1250° C., which is much higher than the reaction temperatures of the conducting and resistive materials. Thus, the silicon powder effectively accommodates dimensional changes associated with formation of $TiN_x$ and $TaN_x$, and acts to automatically fill in any microcracks that may form in the unreacted silicon matrix.

Reaction Formed Electronics Package Designs

A wide range of electronics package designs are accommodated by the RBSN-based materials of the invention. Representative examples of such package designs are presented in the following discussion, which is given as an example only; additional and equivalent package designs are also contemplated by the invention, as will be clear from the discussion.

Figure 3A:
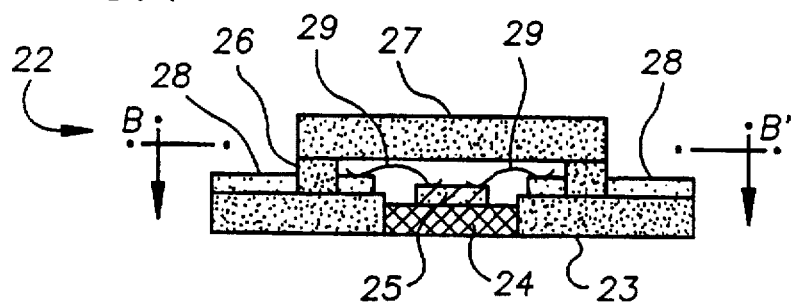
FIGS. 3A–3L are schematic representations of electronics package designs according to the invention.
Figure 3B:
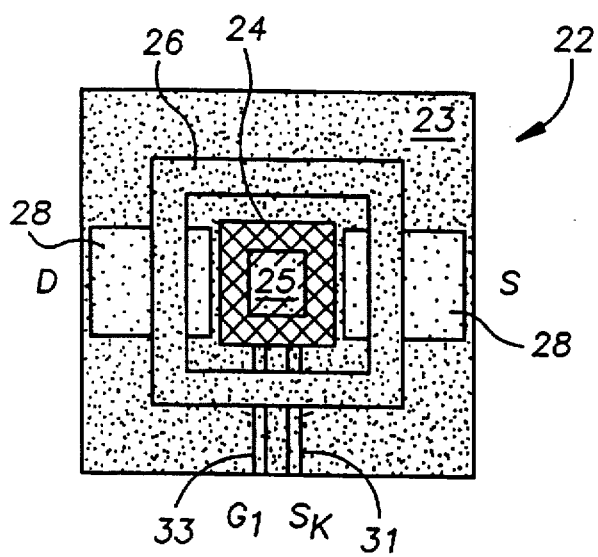
Figure 3C:
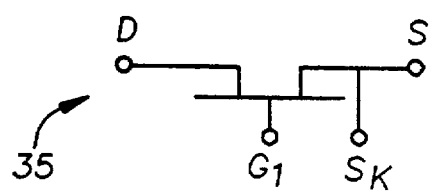

Referring now to FIGS. 3A–3C, there is shown a first RBSN-based electronics package 22 according to the invention. This package provides a reaction bonded silicon nitride substrate 23, in the center of which is a region comprising a cavity supporting a metallized heat spreader material 24. This heat spreader material may comprise, e.g., diamond, cubic-BN, or other suitable material that exhibits high thermal conductivity. Diamond exhibits an extraordinarily high thermal conductivity, i.e., over 1000 W/m·°C., and thus is a superior material for heat conduction. Cubic-BN exhibits similar properties and so is likewise well-suited as a heat spreader material.

In addition, the thermal coefficients of expansion of both diamond and cubic-BN, as shown in FIG. 1, are reasonably close to that of reaction bonded silicon nitride. This thermodynamic compatibility enables the direct joining of a diamond or cubic-BN substrate portion in a RBSN-based package during fabrication, as illustrated in example manufacturing sequences below for producing a robust high-temperature package system that surpasses prior package systems by providing both superior heat and power management, due to the properties of diamond or cubic-BN, as well as accommodating high frequency signal generation, due to the properties of the RBSN package.

Returning now to the electronics package design of FIG. 3, a semiconductor chip 25 is positioned and both physically and electrically bonded to the heat spreader 24 using, e.g., a layer of titanium (not shown). Encircling the chip 25 is a reaction bonded silicon nitride sidewall structure 26 and covering the chip is a reaction bonded silicon nitride cover 27. Reaction formed TiN conductors 28, 31, and 33 on the RBSN substrate provide electrical connection between the external chip package leads (not shown) at the exterior surface of the package sidewalls, and the chip 25 via bonding wires 29 from the chip and the metallized heat spreader to the TiN conductors. Such wire bonds may comprise aluminum or gold, or other suitable bonding wire, as discussed above.

This package design provides all of the advantages of reaction bonded silicon nitride discussed above, as well as conformance to typical package design geometry and methodology. As shown in the electrical schematic of FIG. 3C, a FET device (specified by the electrical schematic referred to as 35 in the figure) on the packaged chip 25 is provided with adequate electrical connections 28, 31, and 33 to MOS transistor source (S), gate ($G_1$), and drain (D) active regions and the substrate ($S_k$) all via a thin nitrided conducting film that is produced as a composite with the substrate and sidewall structure, extending through the thickness of the sidewall.

Figure 3D:
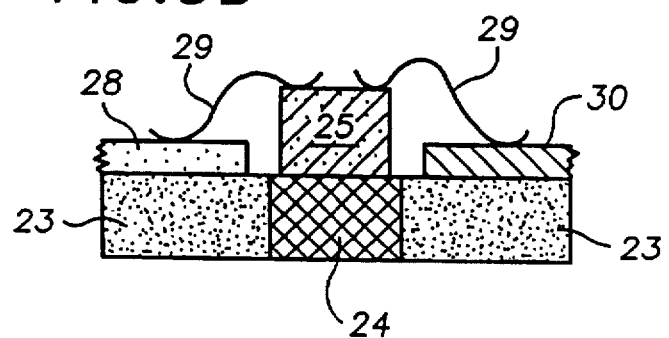

FIG. 3D illustrates an adaptation of this package design. In this design, as shown in the figure, an RBSN substrate 23 again supports a central heat spreader material 24, such as a region of diamond, and a conducting line 28. The substrate here additionally supports a resistor element 30. A semiconductor chip 25, bonded to the heat spreader 24 is electrically connected to the conducting line and resistor element by way of bonding wires 29. In this adaptation, no package sidewalls or cover are manufactured with the RBSN substrate.

Figure 3E:
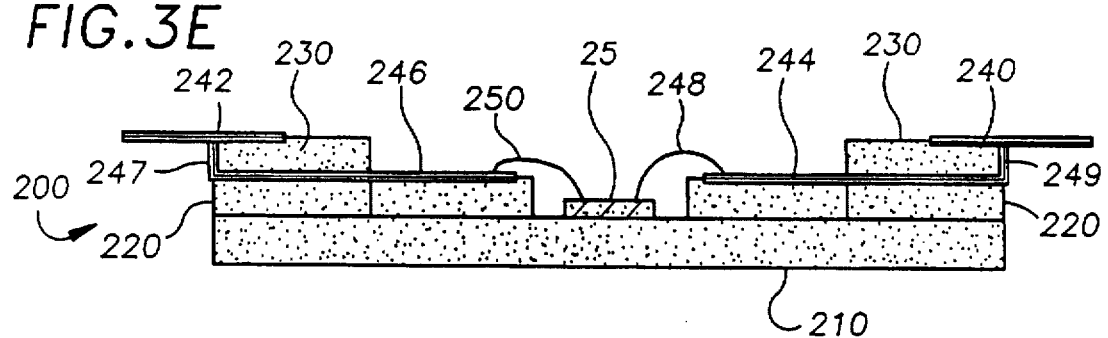
Figure 3F:
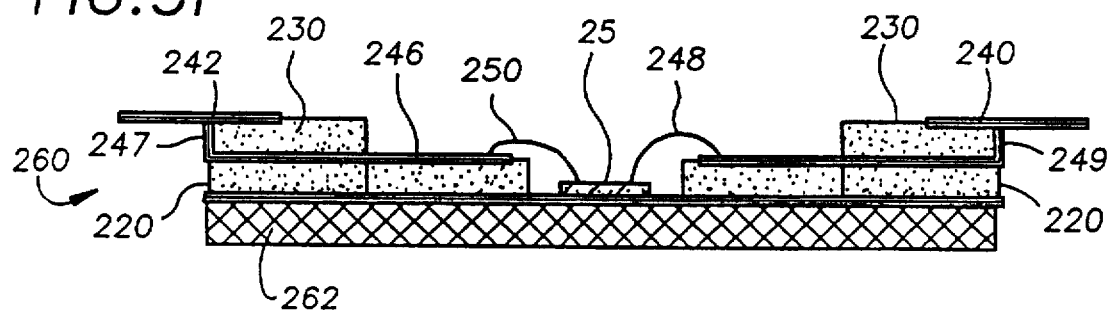

Two adaptations of a third RBSN-based package design according to the invention are illustrated in FIGS. 3E and 3F. In the first of these, shown in FIG. 3E, a multi-layer package 200 consists of a reaction bonded silicon nitride substrate 210 for supporting a semiconductor material or chip 25, and a multi-layer sidewall structure of a lower layer 220 and upper layer 230 encircling the chip. These substrate and sidewall structures may be produced using a green tape technology like that described in the next section, or using another suitable manufacturing process. Electrical leads 240, 242, 244, and 246 for making electrical connection to the chip from outside the package are formed of a thin film, thick film, or other suitable conductor geometry of, e.g., a titanium nitride film, a reaction formed film such as reaction bonded titanium nitride, zirconium nitride, or other conductive nitride, or other suitable conductive material.

The conductors include upper lead lines 240, 242, supported on top of the sidewall structure and lower lead lines 244, 246, sandwiched between layers of the sidewalls and extending through the thickness of the sidewalls to a point where bond wires 248, 250 may be attached to make electrical connection between the device chip 25 and the lower lead lines. Vertical conducting connectors 247, 249, make electrical connection between the upper lead lines and the lower lead lines.

In an adaptation of this package design, shown in FIG. 3F, the package substrate consists of a high thermal conductivity substrate 262, formed of e.g., diamond or cubic boron nitride or other suitable heat spreader material. Like the heat spreader substrate insert of the first package design (FIG. 3A–3C), the high thermal conductivity substrate 262 of this package provides superior heat dissipation capabilities. A semiconductor device chip 25 may be bonded to the substrate 262 using a metallization line such as titanium. As was the case with the first adaptation of this package design (FIG. 3E), here the package also consists of a multilayer reaction bonded silicon nitride sidewall structure that supports multiple levels of conducting lines for making electrical connection to the device chip using, e.g., bond wires, as described above.

Appropriate techniques for attaching a heat spreader like the high conductivity substrate 262 or other substrate to a reaction bonded sidewall structure, whether of a single layer, as in FIGS. 3A–3C, or of multiple layers, as in FIGS. 3E and 3F, will be described in detail in later sections. Preferably any chosen attachment technique forms a hermetic seal between the sidewall and substrate portions and provides the ability to position an electrically conducting, electrically isolating, or combination material between the structures as desired for a given package and device configuration.

Figure 3G:
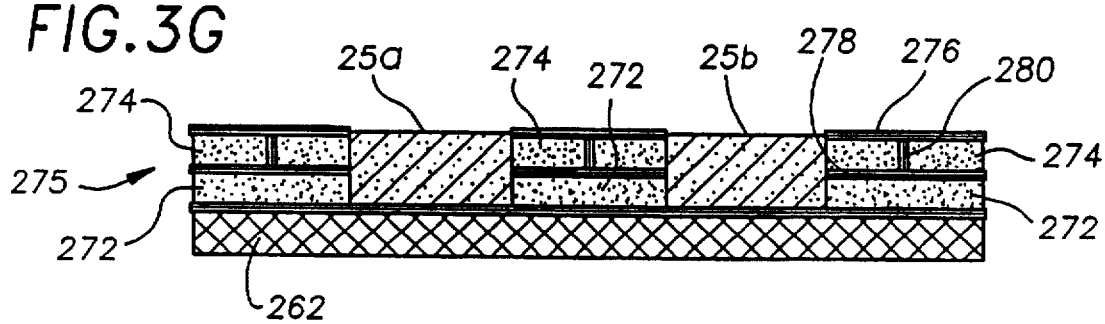

Turning now to another package design according to the invention, shown in FIG. 3G, a high thermal conductivity package substrate 262 here supports one or more device chips 25a, 25b, which are embedded between sidewall structures of the package. The sidewall structure consists of multiple layers 272, 274, of reaction bonded silicon nitride, and supports multiple levels of conducting lines 278, 276, formed of titanium nitride or other suitable conductor, as described above. The two conducting line levels are electrically joined via vertical conducting lines 280 through vias in the sidewall layers. In contrast with the earlier package designs, this design does not employ bond wires for making contact to device chips; instead, the conducting lines are positioned to extend through the width of the sidewalls and make direct contact to electrical contacts on active regions (not shown) on the device chip.

This direct conducting line contact to the device chip provides superior package reliability and reduces package manufacturing cost and complexity. Traditional wire bond connections in device packages, while proven to be adequate, have historically been a common failure point in device packaging; any temperature, vibrational, or other environmental condition which impacts the strength of the wire bond connection to the device contact or the package conductor, or which impacts the strength of the wire itself, may result in package failure. And successful, robust connection of wire bonds during the manufacturing process has been known to be difficult. As a result, the direct conducting line connection between device contacts and package exterior, provided by the package design of the invention, enhances the robustness of the package while at the same time reducing manufacturing cost. The manufacturing discussion below provides processing details for producing such direct conducting lines.

Figure 3H:
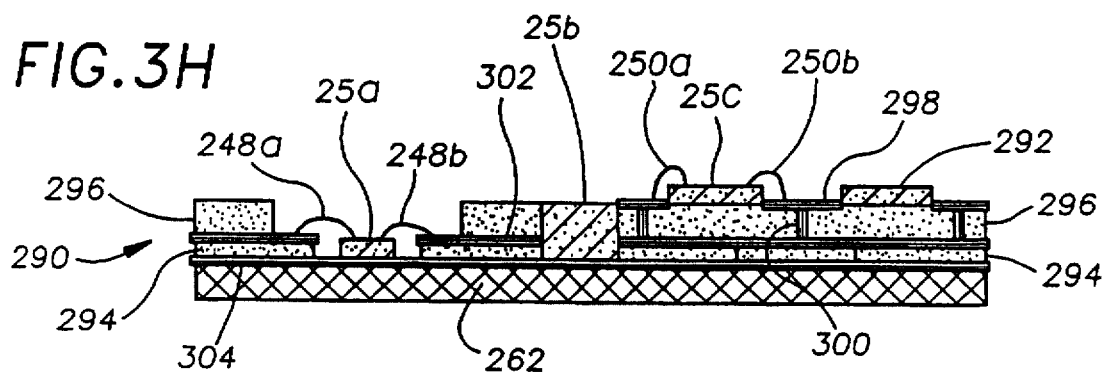

In a further electronics package design according to the invention, as shown in FIG. 3H, a high thermal conductivity substrate 262 supports a wire-bonded device chip 25a and a second device chip 25b that is embedded between package sidewalls 294, 296, and directly connected to conductor lines supported by the multi-layer package sidewalls. A third device chip 25c is surface mounted on the top surface of the package sidewall structure, and a passive component 292, e.g., a resistor element or capacitor structure, is additionally mounted on the top surface of the sidewall structure.

The wire bonded device chip 25a may be electrically and physically bonded to the heat spreader substrate 262 by way of a titanium film or other suitable conducting layer, and may be electrically connected to a conducting line 302 sandwiched between the sidewall layers 294, 296 by way of bond wires 248a, 248b. Similarly, the surface mounted chip 25c may be connected to sidewall conducting lines 298 via bond wires 250a, 250b. The embedded device chip 25b, like those in the previous package design example (FIG. 3G) is contacted directly by the package conducting line 302, without need for additional connectors or bond wires, as a result of it being embedded and in direct contact with the package sidewalls and conductors sandwiched between layers of the sidewalls.

The passive circuit element 292, consisting of, e.g., a thick film or thin film resistor or capacitor structure, is electrically connected to device chips in the package and external package surfaces by way of conductor lines 298 supported on the sidewall structures.

In the case of a capacitor structure, several capacitor geometries are accommodated by the package design of the invention. In a first, a dielectric layer, e.g., a layer of SiC, is formed in the package sandwiched between two conducting layers of the same lateral size as the SiC layer. This sandwich of materials may be embedded between layers of a multilayer sidewall structure, supported on the top of a sidewall structure, or supported on an exterior surface of the package base. In one alternative geometry, a dielectric layer supported in the package may be coated with a conducting layer over its entire area on one side of the layer, and coated with unconnected conducting regions on the other side of the layer, each conducting region geometrically defining a distinct capacitor. Similarly, the dielectric layer may be sandwiched between coatings of unconnected conducting regions.

Figure 3I:
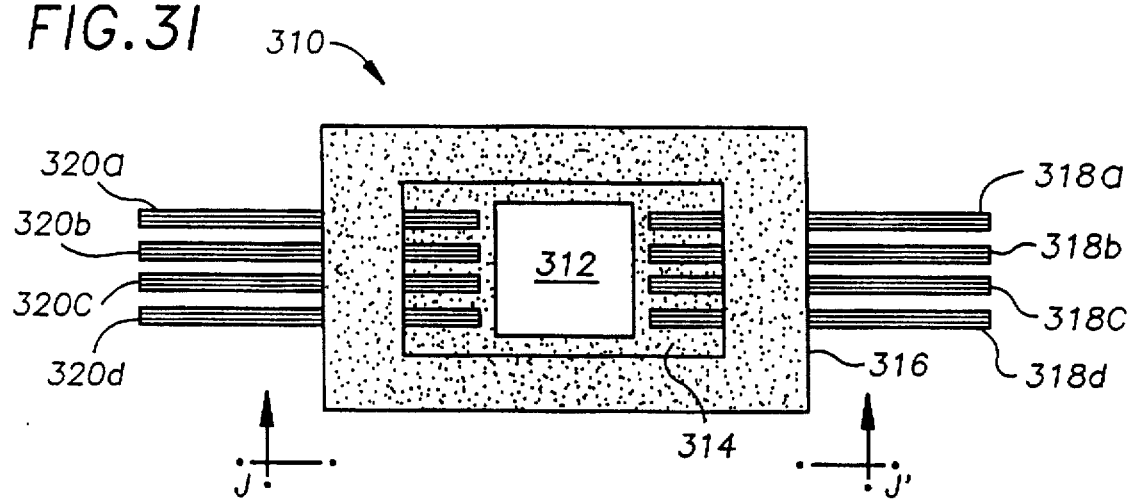
Figure 3J:
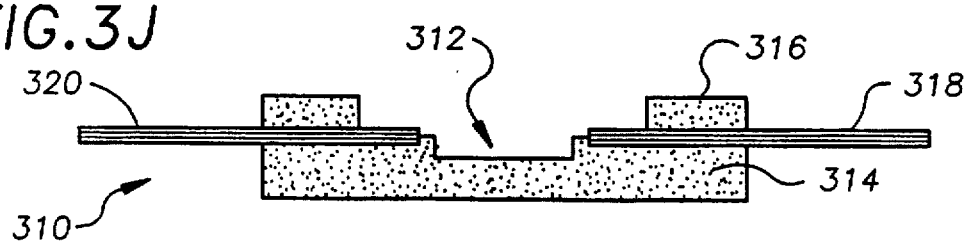

Turning now to FIGS. 3I and 3J, an additional package design provided by the invention consists of a molded base 314 and sidewall structure 316, both formed of reaction bonded silicon nitride. The package base 314 includes a central cavity 312 in which a semiconductor chip or other component may be inserted. Electrical conductors for connection to an inserted chip are provided by electrical leads 318a–318d, 320a–320d, which are embedded in the molded package during package manufacture, as discussed below. Such electrical leads may consist of tungsten, molybdenum, or other conductor material whose thermal expansion coefficient is compatible with that of RBSN.

Figure 3K:
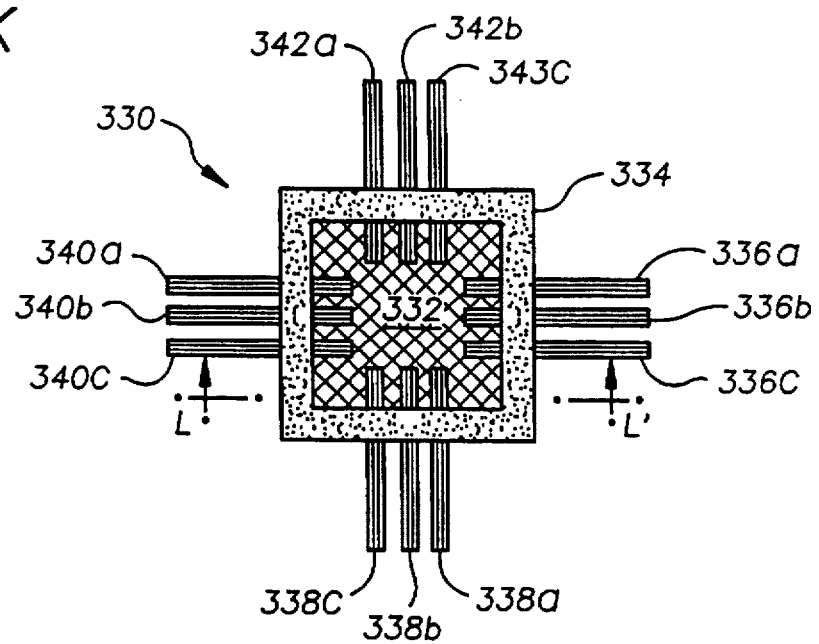
Figure 3L:
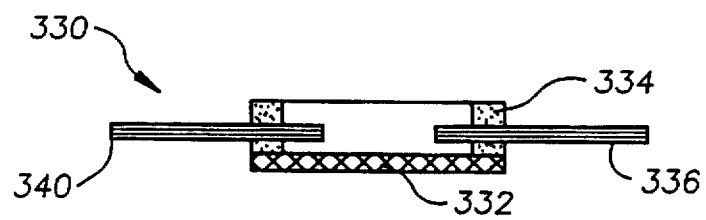

In a further molded package design provided by the invention, as shown in FIGS. 3K and 3L, a substrate 332 of high thermal conductivity, consisting of, e.g., diamond or cubic boron nitride, supports a molded RBSN sidewall structure 334 in which is embedded electrical conductors 336a–336c, 338a–338c, 340a–340c, and 342a–342c. The substrate 332 may alternatively consist of RBSN or other suitable material. The leads embedded in the RBSN sidewalls consist of a suitable conducting material as discussed earlier. The molded sidewall structure of this package provides for connectivity between multiple semiconductor components, chips, or modules that may be supported by the substrate layer. As will be understood by those in the field of electronics packaging design, the package designs discussed above may be adapted to accommodate a wide range of applications.

Reaction Formed Electronics Package
Manufacturing Process—Tape Casting

Figure 4:
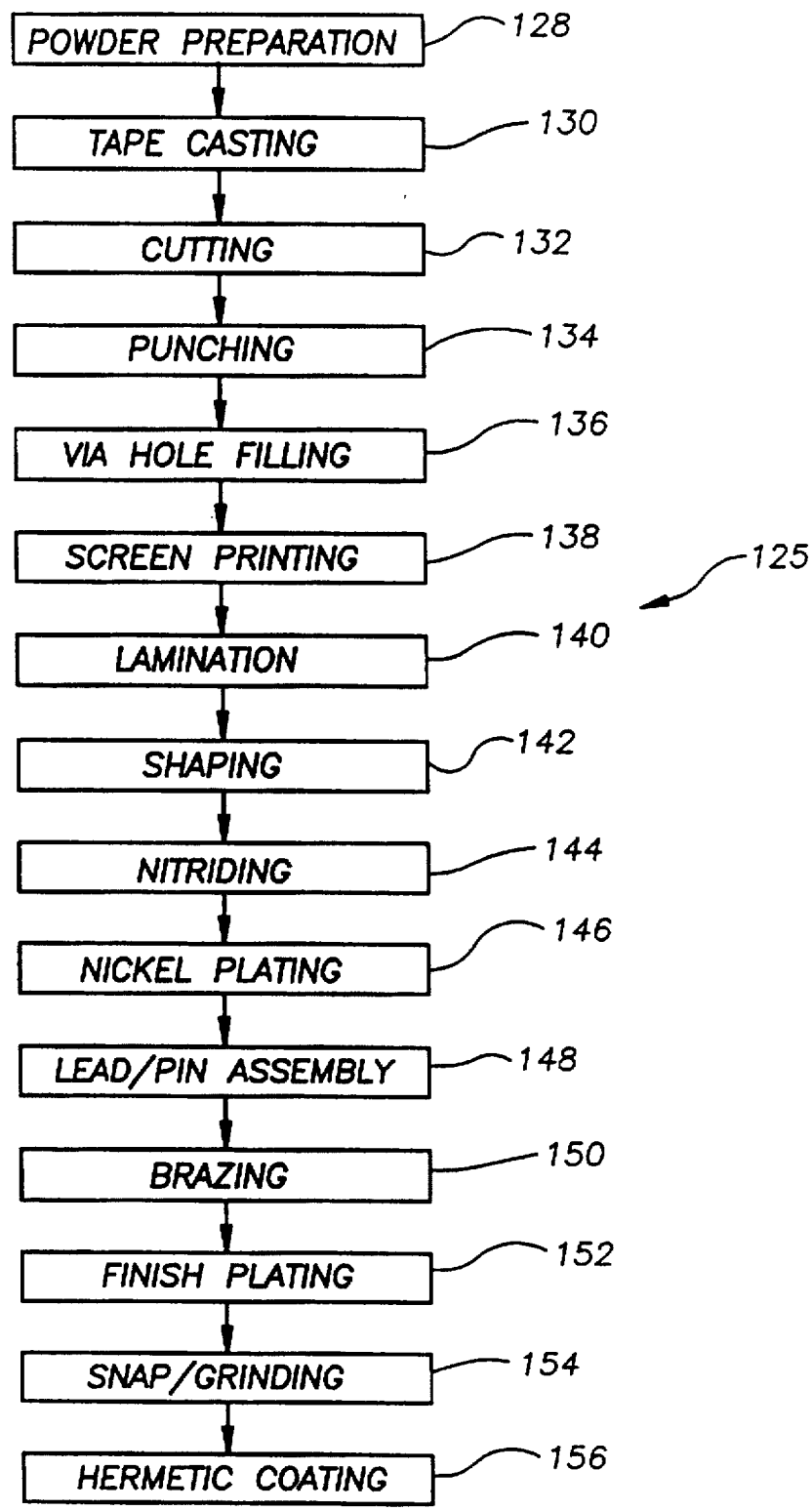
FIG. 4 is a flow chart of the steps for a first manufacturing process to produce an electronics package in accordance with the invention.

Referring now to FIG. 4, there is shown one manufacturing process flow 125, based on tape casting, for producing the nitride-based, multilayer package designs shown above, which are typically used in conventional low power, silicon device applications. Alternative manufacturing process flows according to the invention will be discussed below. In the first processing step of the tape casting process, powders of silicon, and optionally diamond, silicon nitride, or other materials, as outlined in earlier sections, are prepared 128 to obtain a slurry for tape casting an RBSN package substrate. The slurry consists of the selected powder, e.g., silicon powder, and optionally any of four additional components, namely, a binder, a plasticizer, a wetting agent, and solvent. The slurry also includes any preceramic polymers or high-temperature hermetic sealing materials selected, as discussed in the earlier sections, for increasing thermal conductivity or producing closed-cell porosity in the RBSN layer.

The binder acts to hold the various powder components together; the plasticizer renders the cast slurry flexible; the wetting agent ensures that the powder components are well-coated with the binder; and the solvent controls the viscosity of the resulting slurry mixture. Additionally, a deflloculating agent may be used to help uniformly disperse the powder components in the slurry. The resulting powder slurry is of a viscosity similar to that of paint.

In an example of slurry production according to the invention, 2.33 g of silicon powder is first dispersed in 4.5 g of xylene by adding 0.1 g of monocarboxypolystyrene (MCPS), of 250,000 mol wt., from Aldrich, as a dispersant, and then the mixture is ball milled for 24 hours. A 30% solution of polystyrene is then prepared in xylene using 3 g of polystyrene and 7 g of xylene. 1.66 g of this solution (0.5 g polystyrene) is then added to the silicon dispersion; the viscosity of the dispersion increases as the solution is added. A 0.3 g sample of dioctyophthalate is then added as a plasticizer.

In a second example of slurry production according to the invention, 2.33 g of silicon powder is first dispersed in 4.0 g of methylethyl ketone using 0.11 g of MCPS as the dispersant. The resulting solution is then ultrasonically dispersed for 1 min. using an ultrasonic probe. To this dispersion is then added 1.5 g of a 20% solution of PVB in MEK and 0.25 g of benzylbutyl phthalate as a plasticizer component. 2.5 g of MEK is then evaporated to obtain a dispersion of suitable viscosity for casting a tape.

In the next process step, the powder slurry is tape cast 130 by spreading the slurry to a desired thickness in a continuous sheet. The sheets are cast to produce a sheet thickness ranging from about 0.005 inches to 0.020 inches.

The continuous cast sheet is then cut 132 in a next step to produce tape lengths that are manageable. At this point, the cut tape may be positioned on metal alignment frames for ease of handling and layer-to-layer alignment in later process operations.

In the next process step, holes for vias and any desired cavities are punched 134 in the tape at prespecified locations. Such a cavity may be used for supporting a heat spreader material at the location of a chip to be encased in the package. A pneumatic punch or drill may be preferably used for this punching, in the case of a limited manufacturing production run, or if a large run or multiple run production process is to be undertaken, rigid metal die sets may alternatively be preferred. If an alignment frame was not provided for the cast tape in the previous step, it is advantageous at this point to also punch alignment holes in the tape.

The punched vias are then filled 136, to produce the electrical interconnection between layers shown in the package designs above. In the case of thin tape, e.g., less than 0.005 inches-thick, screen printing is used for via filling, wherein a separate screen is used for each via pattern to be filled. Well-known screen printing techniques may be satisfactorily employed here. In the case of thicker tapes, extrusion processes are preferred for via filling. Here, a metal plate which has been etched, drilled, or punched to produce the desired via pattern is used in a standard extrusion process. For example, in one extrusion process, the patterned plate is held at the front of a flexible bladder filled with the conductive paste, which is extruded into the via holes using a standard pressing operation.

Next, powder pastes for producing desired conductive, resistive, and dielectric phases, with the specific additives described above for achieving compatible nitriding rates, are screen printed 138 onto the surface of the cast tape. One example of a titanium ink provided by the invention for screen printing conductor lines is produced as follows. 0.45 g of titanium is dispersed in MEK and to this is added 0.15 g of a 20% solution of PVB. Benzyl butyl phthalate is then added as a plasticizer in the amount of 0.03 g. Excess MEK is then evaporated to obtain a viscosity suitable for screen printing, as is conventional. Inks for tantalum or other resistive material may be produced in similar processes.

To achieve a high packing density of reaction formed TiN, Ti ink may be prepared in accordance with the invention using the Ti reacted binder described in the section above instead of the non-reactive binder, e.g., PVB, given in the above example. In one example of this, 1.26 g of collodion is mixed with 0.05 g or polyethylene glycol and 0.01 g of oleic acid. To this is added 0.4 g of 2-methoxyethyl ether as a solvent. This mixture is then added to 1.125 g of Ti powder and mixed well with a metal spatula. The resulting mixture is then combined with the reactive Ti binder (0.125 g) in a glove-box under inert atmosphere.

In a second example, a 7% solution of PVC in THF (1.09 g) is mixed with 0.06 g of benzyl butyl phthalate and 0.01 g of oleic acid. Four drops (about 0.15 g) of 2-methoxyethyl ether is added to the mixture to control its viscosity. The mixture is then added to 1.125 g of Ti powder and under inert atmosphere, to 0.125 g of Ti reactive binder. Inks produced by these examples may be tape-cast, dried, and fired, to burn out polymers and solvents, in the processes described above. The resulting Ti powder is found to contain no residual polymers or other compounds.

For production of a preform capacitor structure, either of two preferable processes may be employed. In the first, a conductor and electrode precursor, e.g., titanium ink, is first screen printed onto a dielectric base precursor, e.g., silicon. Then the capacitor dielectric precursor, e.g., a mixture of silicon and vinylic polysilane, is screen printed on the electrode precursor, or is produced as a green tape structure. A second electrode precursor and conductor is then screen printed on the capacitor dielectric, and if the capacitor structure is to be embedded within layers of the package sidewalls or base, is then covered with a tape-cast silicon layer.

In a second capacitor formation process, preformed dielectric sheets, e.g., sheets of SiC, are first produced by, e.g., sectioning and/or grinding and polishing pieces from larger billets. To obtain very thin SiC layers, SiC sheets can be produced by vapor deposition onto a substrate that is easily removed by means of chemical reaction, phase transformation, e.g., melting or sublimation, or a parting layer. Conductors and electrode, or their precursors, can then be placed on any favorable combination of SiC or facing Si surfaces and vias.

Turning to particulars of the screen printing process, a screen, e.g., a 325 mesh stainless steel screen, is first stretched on a metal frame and a photolithographically processed pattern is laminated on to the screen to produce a desired conductor and resistor pattern, whereby screen openings are located at positions where the paste is to be deposited. The screen is then aligned with the punched tape and the powder pastes are forced through the screen using a polymer squeegee to obtain a paste thickness of about 10–15 μm. The deposited paste thereby provides a printed layer of the desired lateral dimensions.

If desired, heat spreader materials may at this point be positioned on the tapes or in the cavities previously drilled, in an additional step (not shown). Advantageously, diamond and cubic-BN are compatible with the nitriding process and so may be employed as heat spreader components that are defined on the cast tapes prior to the reaction forming process. Alternatively, heat spreader materials may be joined to the RBSN substrate after the reaction forming process. This joining process is discussed below.

At this point, the printed tape layers are laminated 140 to form a multilayer monolithic tape structure. A solvent and/or binder may first be sprayed on the tape to improve layer to layer adhesion. Then the tape layers are stacked, aligned, and pressed together to bond the layers to each other. Due to typical critical alignment requirements, plugs may be placed in any tape cavities to ensure that cavity shape is maintained during the pressing operation. Then, using a cutting tool, such as a razor blade, individual layered packages or a small number of grouped packages are shaped 142, i.e., cut, from the laminated layered block of tape.

Now individual or arrays of green package structures are nitrided 144 in a process according to the invention as specified above in the section on simultaneous nitriding of dielectric, conductive, and resistive components, to produce a composite densified structure; this nitriding takes the place of the conventional cofiring process and simultaneously produces reaction of the package dielectric, conductive, and resistive components. A nitriding procedure that includes a first burnout step, to remove binders and any other additives from the laminated block, and which accommodates the various conductive and resistive nitride-based materials is preferred, but variations on the nitridation schedules previously described are adequate for many package designs and applications.

A second heating step may at this point be undertaken to activate any high melting temperature powders that were added to the package preform powders for producing hermetic sealing of the package internal pore structure, using the heating schedules given in above discussions.

Once nitridation and any additional heating steps are complete, the densified package structure is then plated 146 with nickel at locations which are to be metallized. Prior to this plating operation, the surfaces of the reaction formed package are sealed to disallow penetration of the plating material into the porous reaction formed materials. Well-known plating procedures provide adequate nickel films. The nickel provides a good surface for attachment of metallization brazing material in later process steps. In the case of a leadless package design, nickel-plated surfaces may additionally be plated with gold to protect the nickel from oxidation and to allow die attachment, cover sealing, and solder connection to the substrate.

At this point, the package and leads and pins are assembled 148 in a desired configuration; in addition to electrical interconnections, optical wave guides or other information transport means may be included. Here the leads and pins are positioned on the package and held in place with braze material using, e.g., a graphite fixture that will not degrade during the braze process. A suitable braze material is the copper-silver alloy Cusil; other suitable braze materials may alternatively be used. Then, in a standard brazing process under a reducing atmosphere, the assembled braze preform is brazed 150, or reflowed, to form a solid attachment between leads and pins and the package.

Following the brazing process, exposed metal components are plated 152 with nickel to prevent corrosion of the materials and to provide appropriate surfaces for die attachment and cover seal attachment. Additionally, if gold wire bonding is to be used, then gold is deposited over the nickel; alternatively, if aluminum wire bonding is to be used, then the nickel plating is coated with aluminum. A standard thin film process is adequate for the deposition of gold or aluminum for wire bond applications such as these.

At this point, if groups of package structures, rather than individual packages, were together processed, then the individual packages are separated by snap breaking 154 the packages along predetermined scribe marks or other suitable separation process, as will be understood by those skilled in the art. Edge grinding may also be accomplished here to smooth the edges of packages.

Exterior hermetic sealing materials may at this point be coated 156 on the individual package structures, following any one of the wide range of processes given above, e.g., glass glaze coating. Alternatively, exterior hermetic coatings may be produced on package arrays or other package grouping, as prescribed by given package applications and manufacturing processes.

Reaction Formed Electronics Package Manufacturing Process—Molding

In alternative manufacturing processes, injection molding or pressing processes, conventionally associated with formation of ceramic or plastic packages, may be adapted, according to the invention, to form a RBSN-based package structure.

In a dry pressing process, a package base section, consisting of silicon powder, is dry-pressed in a preferred shape, and optionally may include a cavity for supporting a semiconductor chip or high thermal conductivity material insert. After nitriding of the pressed base following a nitriding schedule like those discussed above, a lead frame, consisting of, e.g., Kovar by a punching or etching process, is attached to the nitrided base using a devitrifying solder glass. Leads are then attached to the frame and plated following standard procedures. At this point, the semiconductor chip or die is attached to the base, wire bonded to the leads, and optionally sealed in the package with a cover.

In a molding process, a RBSN package structure with embedded leads is formed around a semiconductor die that is mounted on a stamped or pressed lead frame. The die is here both attached and wire-bonded to the lead frame prior to the injection molding step. Thus, if necessary, the die may be protected from molding stresses by coating the die with a compliant polymer. Particular molding techniques suitable for adaptation to the RBSN-based packages of the invention are provided in the "Microelectronics Packaging Handbook," Edited by R. Tummala and E. Rymaszewski, Van Nostrand Reinhold, 1989, Chapter 8, entitled, "Plastic packaging."

All of the manufacturing processes described above may be further adapted to accommodate the substitution of thick-or thin-film deposition of package conductors and resistors in place of reaction formed, nitride-based materials. The use of reaction bonded silicon nitride as a package dielectric, in combination with any conventional conductor, resistor, or capacitor package component configuration, itself provides significant advantages over conventional package dielectrics and component configurations. Thus, the RBSN-based packaging scheme of the invention is not limited to the use of simultaneously nitrided package conductors and resistors, and so is widely applicable to other package process flows.

Furthermore, as discussed previously, the RBSN packaging scheme of the invention accommodates a wide range of package constituents, including, e.g., combinations of RBSN sidewalls with high thermal conductivity substrates or other substrates or bases, and RBSN substrates with other sidewalls. While the selected sidewall and substrate materials may be joined before the nitriding process, reaction bonded sidewalls or bases may be joined with different substrate materials after the nitriding process. The particular steps and joining materials employed in such a hybrid assembly process are dependent on the expected operating environment for the package. Additionally, if the base structure is metallized for, e.g., making contact to a device supported on the base structure, then the base and sidewall joining materials and geometry preferably include a metallized component positioned to provide conductivity between the base and sidewalls.

For low-temperature operating conditions, epoxies may be used to join a sidewall and base structure. A wide range of epoxies are suitable, and may be either conductive or non-conductive. For operating conditions up to 250° C., a robust seal between the sidewall and the base can be formed using a gold-tin alloy, e.g., 80 wt % Au, 20 wt % Sn, which has a melting point of 280° C. In this case, the lower surface of the sidewall and a corresponding pattern on the base piece are coated with a Ti, Pt, and Au thin film; such a film coating is commercially available from Norton on diamond substrates. The two matching patterns are aligned, with a 1 mil–2 mil-thick gold-tin preform placed between them, and then are reflowed in a nitrogen atmosphere with a peak temperature of about 330° C. This process yields a strong, hermetic seal between the sidewall structure and the base structure.

Alternatively, a glass seal can be formed using either a screened-on glass or a glass preform. The glasses employed are preferably a solder sealing glass of the type manufactured by Corning, Ferro, or Schott. Here, the surfaces to be sealed on the base and the sidewall structures may be coated with titanium and nickel using a thin film technique such as sputtering or evaporation, if continuity of conductivity between the base and sidewalls are required. Following this thin film formation, the nickel film is oxidized by exposing it to air at a peak temperature of 425° C. for several minutes. This creates an oxide surface, which enables good bonding to the solder glass. Following the nickel oxidation, the sealing glass is patterned onto the seal surface by a screen printing technique.

After burn-out of the binders in the screen-printed glass, during which only the coated part is heated, the sidewall and base structures are fixtured in place such that a robust seal forms. With use of a vitreous glass, adequate reflow occurs, resulting in a reliable bond. If a glass preform is employed rather than a glass screen-printed layer, the preform is placed between the oxidized nickel surfaces before reflow and sealing.

It must be here noted again that the invention does not require use of a metal layer for attaching base and sidewall structures; such a metal layer will be found advantageous, however for the wide range of applications in which metallized base and sidewall structures are employed for making contact to the backside of a device supported on the base structure.

Electrical interconnections may be formed within the glass seal ring. In this case, the sidewall and base seal surfaces are patterned with titanium and nickel thin films, as in the earlier processes, but in areas where electrical interconnections are to be formed, isolated bond pads are formed, i.e., the bond pads are each separated from the sealing metallization by a 10 mil to 20 mil gap. In addition to the titanium and nickel depositions, gold is then deposited in the locations where electrical interconnection between the base and sidewall surfaces is to occur.

In the next step, as in previous processes, the sidewall and base pieces are oxidized, the areas of gold deposition are not oxidized. Following oxidation, the seal ring area is coated with sealing glass using a screen printing operation that retains via openings at the gold connection deposition sites. After an initial screening of solder, the glass is fired. Then the via regions are filled with a conductive ink, such as gold paste, as is conventionally used for printed circuit board fabrication. After a binder burn-out of the gold paste, the sidewall and base surfaces to be joined are aligned and fired, during which the electrical interconnections and mechanical seal are simultaneously formed. If necessary, to assure electrical isolation of the electrical interconnections, the sealing glass is patterned such that it covers those areas of isolation surrounding the electrical connection sites.

Reaction Formed Package-Integrated-Device Technology

Beyond the electronics package manufacturing processes described above for use with conventional electronics materials, the family of reaction formed materials provided by the invention makes possible a package-integrated-device technology (PID) for interleaving device and package manufacturing sequences, resulting in increased manufacturing efficiency as well as improved performance in the devices and packages produced. Using the PID process, described in detail below, device substrates or partially fabricated electronic devices may be embedded into semi-finished packages, whereby completion of device fabrication coincides with completion of package fabrication. Importantly, this makes possible the fabrication of active devices and circuits in a fully packaged environment.

The interleaved package-integrated-device manufacturing sequence is especially well-suited to wide-bandgap, high-temperature semiconductors such as SiC, indium phosphide, gallium arsenide, and diamond, among others. These materials and their corresponding devices can tolerate temperatures in the range of the reaction forming process, i.e., 1000° C.–1400° C., with little or no degradation, as dopant diffusion is minimal in such materials at these temperatures; accordingly, the reaction forming process step may be flexibly integrated into the device fabrication sequence at any convenient point, typically before final metallization. Thus, the reaction formed package system of the invention, designed to particularly accommodate high-temperature, high-power electronics, is uniquely well-suited to provide an improved manufacturing process for fabricating such electronics.

This correspondence with high-temperature electronics is enhanced, in accordance with the invention, with the use of diamond, cubic boron nitride, or other similar material as an electronics package substrate or heat spreader combined with a RBSN substrate for providing enhanced heat dissipation from high-power devices, as shown in the previous package design discussion. Diamond exhibits an extraordinarily high thermal conductivity, i.e., over 1000 W/m·°C., and is widely considered to be the superior material for heat conduction, and cubic-BN exhibits similar properties.

PID Device Design and Fabrication

In one embodiment of the PID process, in accordance with the invention, a high-frequency, high-power silicon carbide permeable base transistor is fabricated in concert with a RBSN and diamond- or cubic-BN-based package. It must be noted that this is but one example of the PID package and manufacturing sequence of the invention, and accordingly, the invention is not limited to such; this example illustrates the flexibility of the packaging process for accommodating a wide range of device materials and designs. This example packaging scheme is particularly advantageous because silicon carbide, diamond, and cubic-BN all exhibit similar high-temperature thermal expansion coefficients, as shown in FIG. 1, and so are well-suited to an integrated high-temperature packaging scheme.

As discussed previously, silicon carbide (SiC) is a wide-bandgap, high-temperature electronic material that is characterized by a high breakdown field and good thermal conductivity. SiC also exhibits a high electron saturation velocity. These outstanding properties together make SiC an excellent candidate for a high-frequency, high-power transistor structure such as the permeable base transistor. The wide bandgap of SiC also provides inherent radiation hardness and high temperature operation for SiC-based devices.

Figure 5:
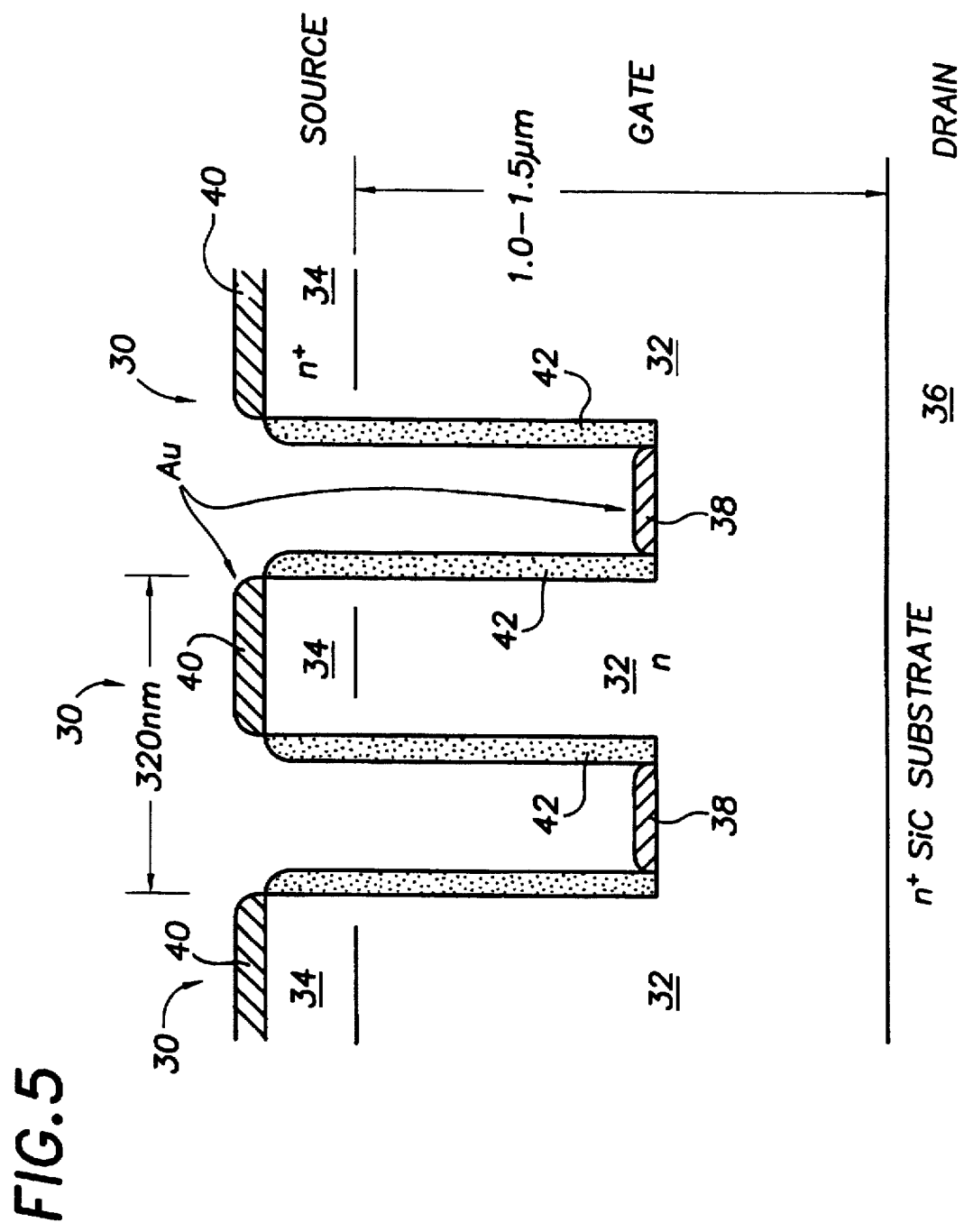
FIG. 5 is a schematic cross section of the design of a permeable base transistor in accordance with the invention.

Referring to FIG. 5, an example of a SiC permeable base transistor (PBT) 30 that is one possible high-performance device for incorporation in the PID process of the invention comprises a U-groove submicrometer-periodicity grating structure in which a channel region 32 is interposed vertically between a more heavily doped source region 34 and drain region 36, which comprises the SiC substrate. Modulation of the channel potential via a metal-semiconductor Schottky gate contact 38, located at the bottom of the grating grooves, provides for modulation of vertical current flow between the source and drain regions 34 and 36, respectively. An ohmic contact 40 to the source region is positioned at the top of the grating grooves, while an ohmic contact (not shown) to the drain region 36 is achieved via the substrate.

In an alternate design, (not shown) a dielectric layer may be located under the gate 38 to produce a metal-insulator-semiconductor structure with similar device characteristics.

The PBT design accommodates a densely-packed array of channel structures; the grating periodicity may typically range from 320 nm to 1000 nm, depending on the desired channel doping. This close packing produces a device that operates much like an array of parallel-channel vertical field effect transistors and thus enables very high currents to be achieved with small active regions. Reduction in active area minimizes distributed effects that can diminish the phase coherence of control signals in large power devices. Thermal effects created by such compactness are reduced by the good thermal conductivity of SiC. The compactness of the PBT also mitigates the negative effects of the high micropipe spiral defect density that is characteristic of commonly-available SiC.

The PBT design offers other advantages. The vertical distance between the source and drain regions, 34 and 36, respectively, can be easily adjusted to between 0.8 μm and 2.0 μm by adjusting the epitaxial layer thickness. The precise source-drain distance is determined by consideration of the tradeoff between a desired operating frequency and a channel breakdown voltage, for a given application. For example, a short source-drain distance would correspond to a high frequency-low voltage application, while a long source-drain distance provides a high breakdown voltage and a correspondingly lower operating frequency.

In addition, a short channel control region, defined within this length, wherein electrons travel at near-saturated velocities, can be readily attained in the PBT because it is determined by the gate metallization thickness and the channel doping. As a result, the high-field saturation velocity of SiC, which is more than twice that of Si or GaAs, is fully exploited, while the primary disadvantage of SiC, namely, its low mobility, is countered through the vertical design. Thus, a vertical SiC device such as the PBT is capable of very high-frequency operation.

Turning now to a SiC PBT fabrication sequence in accordance with the invention, device fabrication may proceed in an interleaved sequence with a RBSN PBT package. For ease of discussion, the PBT fabrication steps will first be described, with a package fabrication description to follow.

First, a 0.8 μm to 2.0 μm-thick n-type epitaxial layer is grown on an n+ SiC starting substrate. The starting substrate may comprise, e.g., a 1.3 inch-diameter single crystal, 6H-SiC substrate, with a nominal orientation of (0001), 4 degrees off of the c-axis, or other suitable substrate, e.g., a 4H-SiC substrate or a 6H-SiC substrate of other orientation. The substrate is doped n-type to a concentration as high as possible, preferably at least $3 \times 10^{18}$ cm$^3$ or greater, with a resistivity of 0.05 Ω-cm or lower. The epitaxial layer is doped at a reasonable density of, e.g., between $4 \times 10^{16}$–$2 \times 10^{17}$ cm$^{-3}$. This epitaxial layer corresponds to the channel region of the PBT. An additional epitaxial layer, doped to at least $1 \times 10^{19}$ cm$^{-3}$, is then grown on the first epitaxial layer to a thickness of about 150 nm. This n+ epitaxial layer corresponds to the source region of the PBT. As an alternative to this sequence of epitaxial growths, n-type ion implantation at 1000° C., followed by a high temperature activation anneal at a temperature greater than 1300° C. may be used to produce vertically-stacked heavily-doped n-type regions. SiC starting wafers and suitable epitaxial growth processes are available from ATMI, of Danbury, Conn.

Laser interferometric lithography, e-beam evaporation of a metal, and lift-off techniques are then used to produce the submicrometer-periodicity PBT grating pattern on the doped SiC substrate. Interferometric lithography is a viable process for successfully producing very small features over wide areas. In one suitable example of this technique, the 351 nm line from a 30 watt argon laser is passed through a beam splitter to produce two beams. The two beams are directed through spatial filters and then recombined a distance above a photoresist-coated substrate where they illuminate the substrate. With an appropriate selection of spatial filters, the recombination of the beams produces a high-contrast standing wave pattern that exposes the photoresist with a corresponding grating pattern; the beam angle of incidence, with respect to the substrate, and the laser wavelength determine the periodicity of the grating. A suitable exposure time may be between, e.g., 3–5 seconds. Additional details of this process are provided in U.S. Pat. No. 5,142,385, in the names of Smith et al., the entirety of which is hereby incorporated by reference. After exposure and development of the resist, Cr, Ni, or other suitable metal is evaporated and lifted off via the resist to produce a Cr grating on the wafer substrate. Other lithography techniques, such as X-ray lithography and electron-beam lithography, which lend themselves to production of the fine feature sizes of the grating may alternatively be used here.

Whatever the grating production technique, the resulting grating mask structure, e.g., the Cr grating structure produced on the substrate surface via the process given above, is then used to transfer the grating pattern to the SiC substrate. This may be accomplished using, e.g., a dry etch technique such as plasma etching or reactive ion etching (RIE). In one suitable RIE process, CF$_4$ etch gas is used; etching may be accomplished using, e.g., a sputtering machine modified to maintain a pressure of 10 mTorr with the substrate electrode voltage power at 250 volts and an rf power level of 28 watts.

At this point, dielectric isolation of the source contact pad area, as well as passivation of the grating structure sidewalls with a silicon dioxide layer (42 in FIG. 5) or other suitable dielectric layer, e.g., silicon nitride, may be accomplished. If a gate oxide is to be employed for creating a MIS-type structure, the gate oxide is also produced at this point. Sidewall passivation and gate oxidation is preferably produced by way of thermal oxidation; one acceptable oxide growth process comprises a 1200° C. oxidation in a hot-walled furnace with H$_2$O added to an O$_2$ ambient gas flow to produce a sidewall dielectric thickness of about 20 nm. Dielectric isolation of the device contact pad locations is produced using a standard process such as low temperature chemical vapor deposition of silicon dioxide. The dielectric layers are preferably at least 1 μm–1.5 μm-thick or greater. The dielectric isolation regions are patterned using conventional lithographic techniques and wet etches such as a buffered oxide etchant.

In the next process step, low-resistance metal contacts are provided for the source, drain, and gate regions. As mentioned above, ohmic contact is made to the source and drain, while a metal-semiconductor Schottky diode contact is made to the gate. High-temperature alloying of the source and drain metal to achieve such ohmic contact is known to degrade the Schottky rectifying contact, however. As a result, it is preferable for the source and drain contacts to be fabricated first.

Ohmic contact to the drain region, comprising the substrate, may be made on the front surface of the wafer through reactive-ion etched vias to the n+ substrate by evaporating a Ni or Ti layer of, e.g., 150 nm in thickness using, e.g., standard electron-beam evaporation. Alternatively a Ni or Ti film may be sputtered directly onto the backside wafer surface. In either case, the contacts are then alloyed in a hot-walled furnace for about 10 minutes in a N$_2$ or H$_2$ atmosphere at 1050° C. Ohmic contact to the source region, comprising the top surface of the grating structure, is accomplished using a much thinner Ni layer, e.g., from 10–20 nm-thick, produced by, e.g., a 3–5 minute alloy process. The difference in processing between the source and drain contacts is necessitated by the very thin top n+ region, which is less than 200 nm in thickness. At this point the gate metal can then be evaporated and patterned. Finally, contact pads to the device regions are formed using conventional lithography and lift-off or metal etch techniques.

Reaction Formed Package-Integrated-Device Manufacturing Process

Figure 6:
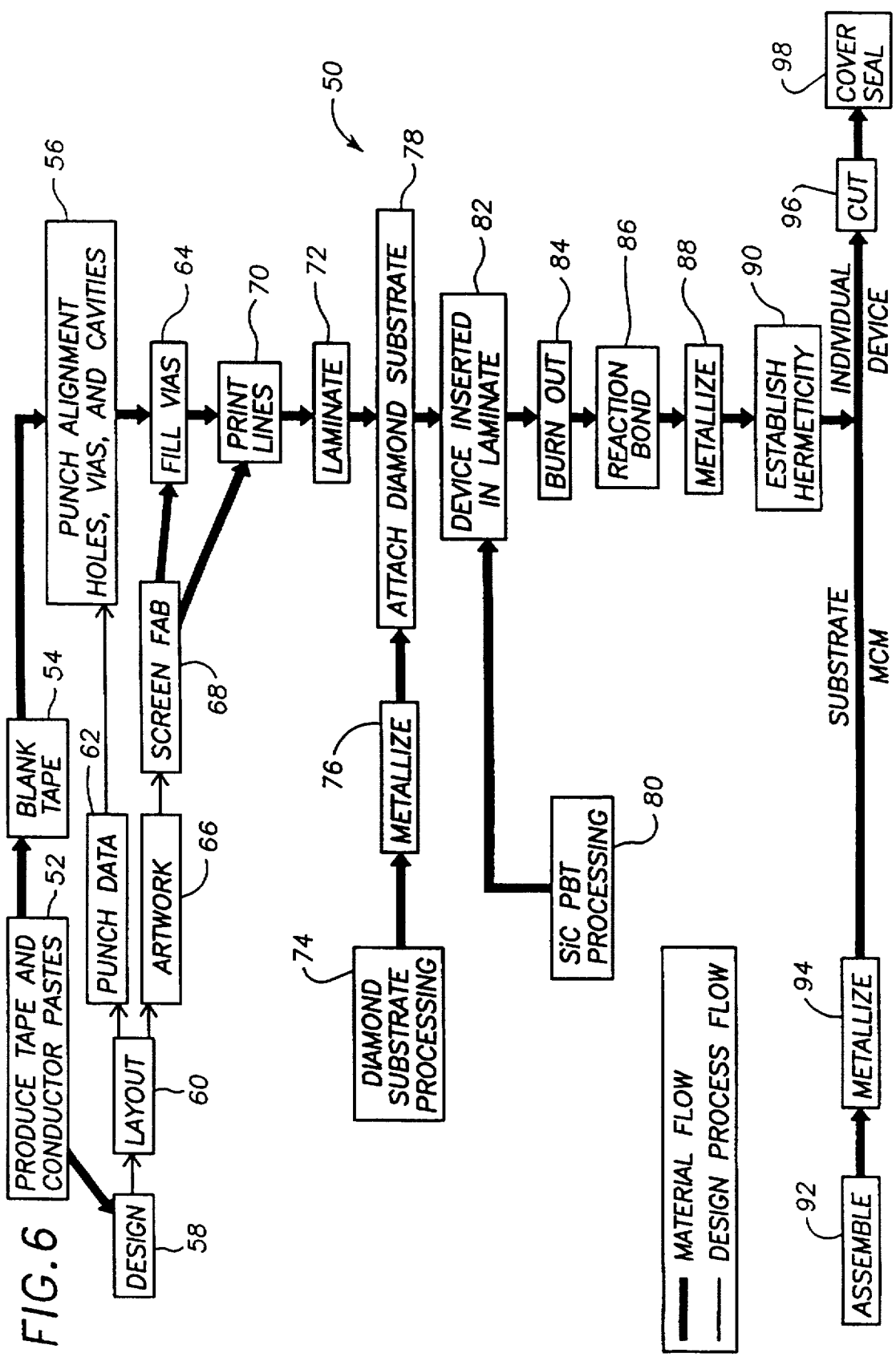
FIG. 6 is a flow chart of the steps for a second manufacturing process to produce an electronics package in accordance with the invention.

Referring now to FIG. 6, one example of a package-integrated-device (PID) manufacturing sequence according to the invention is illustrated with reference to interleaved fabrication and packaging of a SiC PBT like that described in the discussion above. However, as explained above, the PID is not limited to the SiC PBT; the invention can also be applied to packaging of, e.g., Si-based or GaAs-based high-power or high-temperature devices. Such devices include, e.g., GaAs field effect transistors and heterojunction bipolar transistors, silicon devices (as described above) such as metal-oxide-semiconductor field effect transistors, static induction transistors, and bipolar transistors.

Most importantly, application of the PID technology to wide-bandgap semiconductors such as SiC, as well as diamond and other such materials, provides the ability to operate devices based on these materials near to their intrinsic limits, i.e., the PID scheme eliminates device degradation produced by package limitations. For example, GaN-based field effect transistors, heterojunction bipolar transistors and permeable base transistors, SiC-based field effect transistors, static induction transistors, and permeable base transistor designs other than the one presently being discussed, and bipolar transistors are some of the devices accommodated by the PID process. Still other device structures and materials are further accommodated by the PID fabrication sequence of the invention.

The PID fabrication sequence accommodates a wide range of forming processes, e.g., tape casting, molding, and pressing, as well as package geometries, and further accommodates a wide range of external package connections, including electrical pin connections and optical fiber interfacing. In the discussion below, an example of a tape casting process is first presented and then alternative processes, geometries, and connection schemes are discusses.

As outlined in FIG. 6, a tape casting PID device and package fabrication sequence 50 begins with production 52 of silicon powder tape slurry and conductor slurries, e.g., titanium powder slurries. Preceramic polymers or powder additives for enhancing thermal conductivity or producing internal closed-cell porosity, as described above, may also be incorporated into the slurry mixtures. Green silicon powder tape is then formed 54 using the silicon powder slurry in manner similar to that previously discussed for forming cast tape, to produce cut tape layers for supporting conductor lines. At this point, alignment holes, vias, and cavities are punched 56 in the green silicon tape layers. These geometries are positioned based on a starting design 58, which is used to produce a package layout 60, from which punch data 62 is provided.

The punched holes, vias, and cavities are filled 64 with conductor and resistor slurries based on layout artwork 66, which produces a print screening fabrication template 68, as in the previous tape casting process described above. The screen printing template also provides the geometric pattern for screen printing 70 of the conductor slurries to form conductor lines and planes on each of the green silicon tape layers. After completion of conductor formation, the green tape layers are then laminated 72 to produce a multi-layer, net-shaped green package.

If diamond or other high thermal conductivity material is to be used as a heat spreading substrate or substrate insert for the RBSN-based package, it is first processed 74 (by way of one of the processes given in previous sections, or obtained from any of the identified sources) and then metallized 76 to provide a conducting connection to the devices it will support. Alternatively, as explained above, the insert may be joined at the end of the package manufacturing process. In the first case, the diamond substrate is joined 78 to the green multi-layer package, using a process like that described previously. Because there exists a finite chance that uncoated diamond may react with adjacent silicon particles to form SiC during a nitridation process, cubic-BN may be favored over diamond as an insert that is nitrided with the other package components for some applications. However, diamond may be made inert to the reaction by coating it with $Si_3N_4$ or other suitable material prior to its incorporation with the green part.

Concurrent with the above manufacturing steps, the SiC PBT or other device to be packaged is processed 80. This processing comprises all or a only a few of the fabrication sequence steps described above, depending on the stage of fabrication at which it is desired to insert the device chip into the green package. A SiC-based device can be successfully incorporated into the green package part at any stage of the process if a nitrided conducting line is employed for making electrical contact to the device. If, however, a refractory metal is employed for making device contact, the device can be incorporated into the green package part at any stage of the process prior to metallization; this is due to the fact that although the reaction forming process does not degrade the SiC or alter device doping profiles, most currently used metals are likely to degrade during the nitriding process. As a result, metallization, except for contact to the backside of the SiC chip, i.e., the drain region, using a refractory metal, is preferably accomplished only after the reaction forming process, but metallization by way of, e.g., reaction formed TiN may be positioned prior to the reaction forming process.

It must be noted, however, that some refractory metals such as tungsten or molybdenum may in fact be rendered compatible with the reaction forming process if covered with a deposited dielectric to prevent reaction of the metals during the process. In addition, refractory suicides or other such materials that can withstand the reaction forming temperature range may be suitable.

Three PID SiC PBT fabrication sequences are discussed here to illustrate features of the invention, but those skilled in the art will recognize that other fabrication sequences are equally viable. In a first sequence, the PBT processing 80 comprises completion of the device, whereby only interconnections to the package need to be formed after insertion in the green package. In a second sequence, the PBT processing 80 comprises semi-completion of the device; no contact metallization is completed. Here contact metallization and formation of both device contacts and connection to the package metal layers takes place after the reaction forming process. In a third sequence, the PBT processing 80 comprises only provision of a SiC substrate; device fabrication, together with metallization and contacting, takes place after the substrate is inserted in the package.

In all three of these examples, the reaction forming process takes place only after the device chip is embedded in the unreacted pre-formed dielectric and conductive package structure, and thus results in a completed package and device chip. The SiC PBT structure, which exploits the device substrate as the drain region, is especially suited to this technique because positioning of the substrate in the multi-layer green package inherently provides the ability to directly contact to the substrate drain region.

Figure 7:
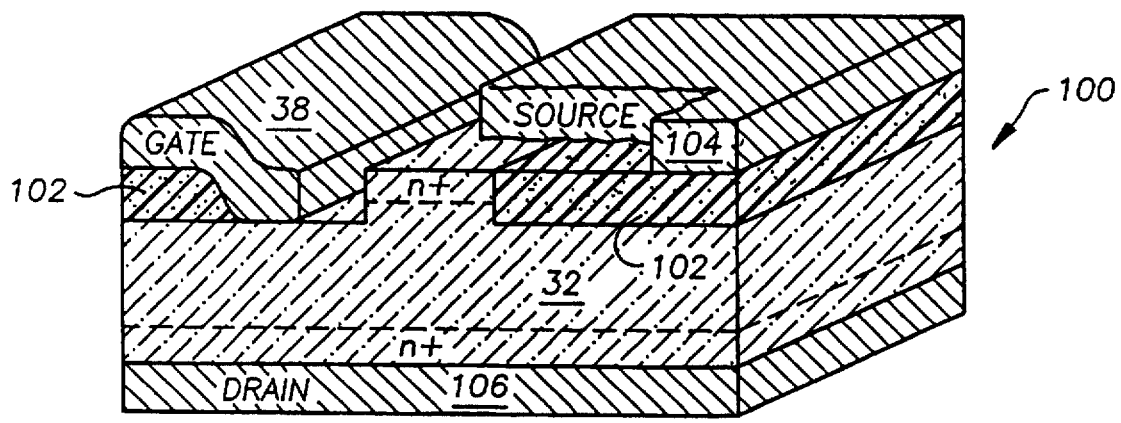
FIG. 7 is a schematic cross section of a silicon carbide permeable base transistor in accordance with the invention.

Referring to FIG. 7, in the first sequence example given above, a completed PBT 100, including gate metallization 38 is produced before insertion in a green package part. As shown in the figure, the PBT here incorporates $SiO_2$ as an insulating support layer 102 to fill the vertical area between the device grating structure under the source contact 104. A drain contact 106 is made to the back of the substrate.

Although it was suggested above in connection with the PBT fabrication sequence that the insulating support layer 102 may indeed comprise $SiO_2$, if temperatures higher than about 1100° C. are to be encountered in the reaction forming process or in device operation, it may be preferable to replace the $SiO_2$ with $Si_3N_4$ or silicon oxynitride layers.

Referring also to FIG. 6, the completed PBT device is inserted 82 into the preformed green package part. The entire assembly is then burned out 84 and reaction formed 86, following the processes previously described. At this point, metallization is then performed to contact the device contact pads, using, e.g., standard thin film techniques. As explained above, if a nitrided conducting line, e.g. reaction formed TiN is employed as a conducting contact to the device contact pads, then this conducting line may be positioned prior to the reaction forming process.

Figure 8:
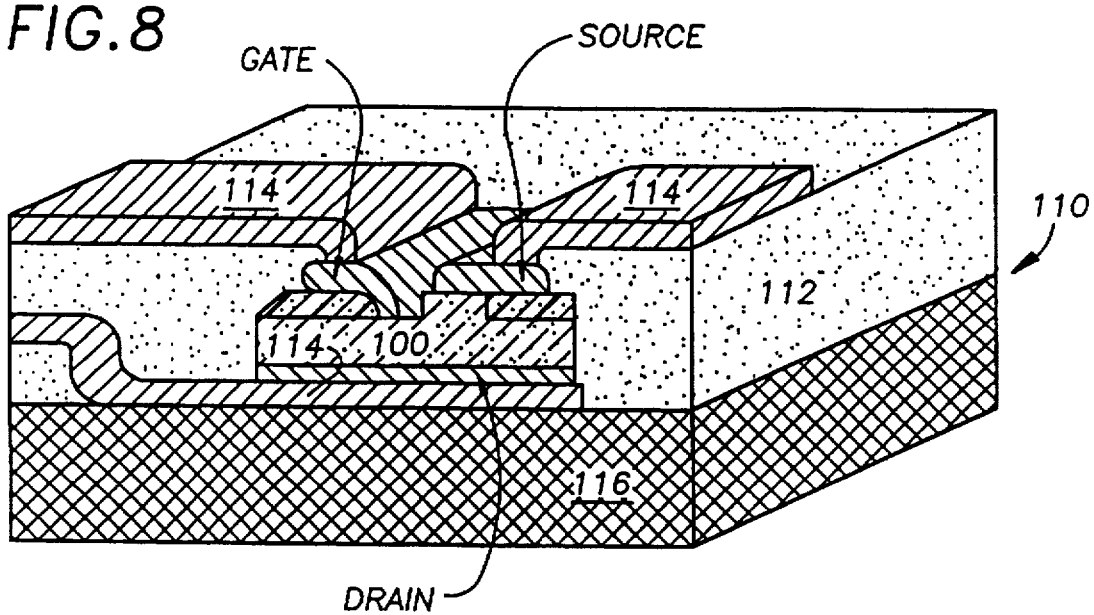
FIG. 8 is a schematic cross section of a metallized permeable base transistor embedded in a package structure in accordance with the invention.

As shown in FIG. 8, the reaction-formed package-integrated-device 110 includes the completed PBT 100 embedded in a RBSN package form 112, with thin film TiN or other suitable electrical contacts 114 between the device and the package, including a contact 114 to the backside of the device. The assembly also may include a diamond substrate heat sink 116 providing superior heat dissipation capabilities for the package assembly.

If a powder admixture or powder coating was not employed earlier in the PID process flow for rendering the RBSN packages hermetically sealed, hermeticity may at this point in the process be established 90 using a dip coat or other technique like those described previously. The assembly is then cut 96 and provided 98 with a cover seal, after which the SiC PBT package-integrated-device is complete. As seen in FIG. 8, the thin film conductor lines used to connect the device to the package completely eliminate the need for bond wires from device to package. This elegant connection scheme provides superior manufacturing efficiency and device-package performance and is one of the important advantages provided by the invention.

Figure 9:
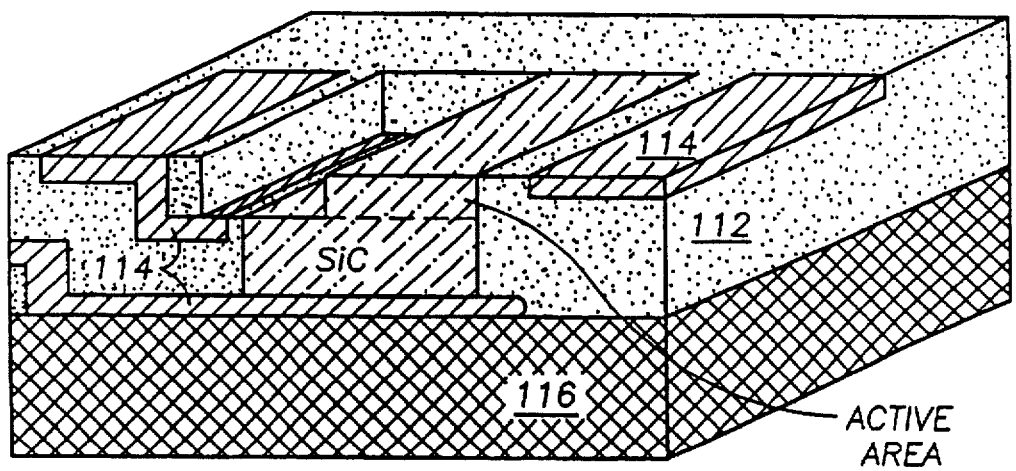
FIG. 9 is a schematic cross section of permeable base transistor embedded in a package structure in accordance with the invention.

Considering now the second PBT process sequence example given above, i.e., a PID process including semi-completion of a device with no metallization. Here, the SiC processing 80 (FIG. 6) proceeds separately from the package processing until the device chip is ready for final contact metallization. At this point, the chip is embedded in the green package part. The assembly is then burned out 84 and reaction formed 86 as described above. The structure of the assembly at this point is shown in FIG. 9; TiN conductor lines 114 are provided on the RBSN package form, ready for connection to the device contact areas. The next step is metallization 88 (FIG. 6) on the device chip together with interconnection to the package metal layers, using conventional thin film processing techniques as described above. This post-reaction bonding metallization provides the ability to avoid potential device contact degradation during the reaction forming process. After this point, the package assembly process proceeds as described above.

This particular PID sequence provides great flexibility in the types of connection between device chips and package that are accommodated, while achieving the advantages of the RBSN-based package system. Any suitable thin or thick film or wire bonding techniques for the given application thus may be used to maximize the manufacturing efficiency and performance of the package.

Finally considering the third of the three PBT process sequence examples, here a SiC substrate is embedded in the green package at the outset of device fabrication. By "substrate" is meant individual device chips, larger substrates containing several devices, which could be isolated using mesa-etching techniques, or other suitable starting platform for an intended device or device array. For example, advanced selective epitaxial growth techniques could be applied to the semiconductor materials after embedding of the materials in the package to achieve isolation like that of mesa-etch techniques.

Embedding of a substrate to be processed in a package at the start of the fabrication sequence provides the ability to create a 4-inch or larger diameter device fabrication platform that has size and planarity uniformity sufficient for processing by conventional advanced silicon pilot production lines, but which contain exotic materials (such as the SiC or diamond) that are typically limited to substrate sizes too small for the conventional equipment. This is especially important for silicon carbide device fabrication; historically, commercially available 4H- or 6H-SiC substrate material has been less than 1.5 inches in diameter, and so has been excluded from conventional silicon processing equipment. The RBSN package structure of the invention inherently provides the ability to produce a high purity, thermal-mechanically stable, and Si-process-compatible holder for supporting SiC or other wafers or pieces of wafers for processing in standard size, e.g., 4-inch, fabrication equipment.

In this PID sequence, a substrate to be processed is positioned in a RBSN green package structure once the structure has been formed with resistor and conductor lines using, e.g., the tape casting, molding, or pressing processes and the screen printing techniques described above. A cavity defining the location of the substrate is provided by processing as well. A diamond or other substrate or heat sink may at this point also be incorporated into the structure.

Figure 10:
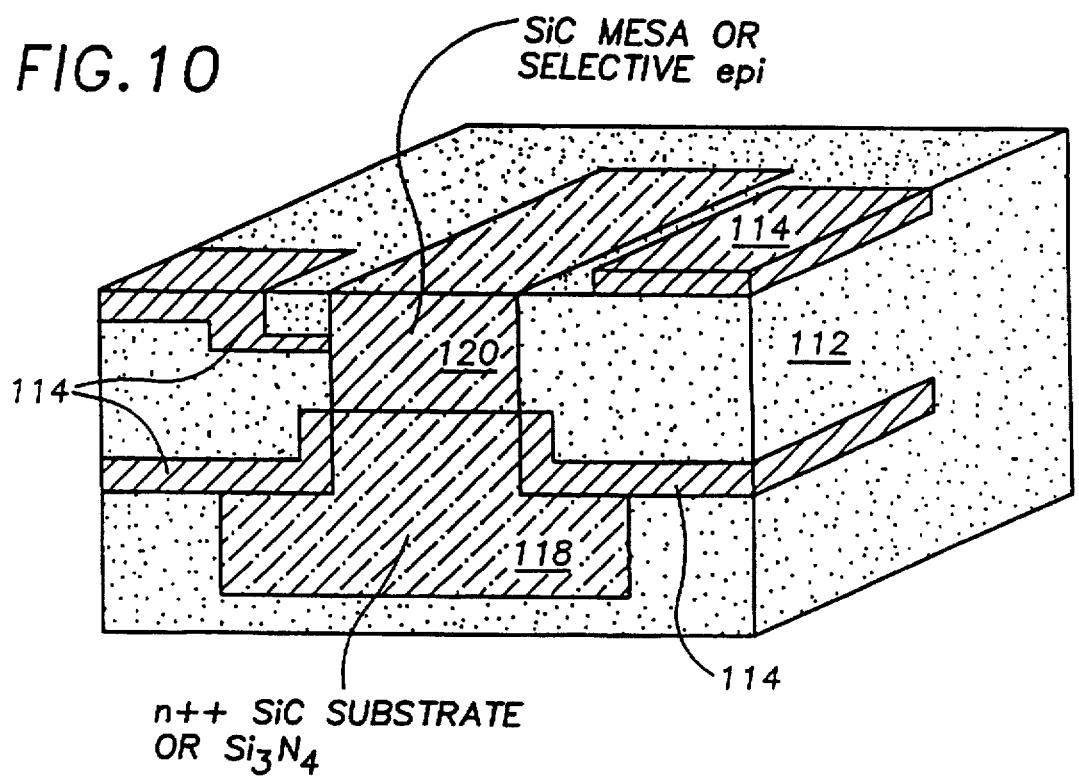
FIG. 10 is a schematic cross section of a permeable base transistor starting substrate embedded in a package structure in accordance with the invention.

Once the SiC or other substrate is inserted into the package, the substrate-package assembly is burned out 84 and reaction formed 86 (FIG. 6) to produce the assembly shown in FIG. 10. Here TiN conductor lines 114 are provided in the RBSN package structure 112 for metallization to device contact areas at a later stage in the fabrication process. If desired, a diamond substrate (not shown) may at this point, rather than before the reaction forming process, also be included in the assembly. Then, mesa structures 120 or otherwise isolated areas of the SiC or other substrate 118 are processed normally, in the manner described above, to produce devices on the substrate. Any additional package layers, including interconnect and passive-element materials, are then added to complete the packaged part assembly. Establishment of hermeticity may be carried out either before or after device fabrication, if it has not already been achieved using a powder admixture or powder coating.

Returning to the PID process flow outlined in FIG. 6, multichip module production is also accommodated by the PID manufacturing scheme of the invention. In this case, the support structure of a multichip module is assembled 92 and metallized to provide interconnectivity within the module while concurrently, the module components are produced following the PID process flow described above. The multichip module structure is then joined with the components and cut 96, and sealed 98, if desired, as in the earlier process.

Figure 12:
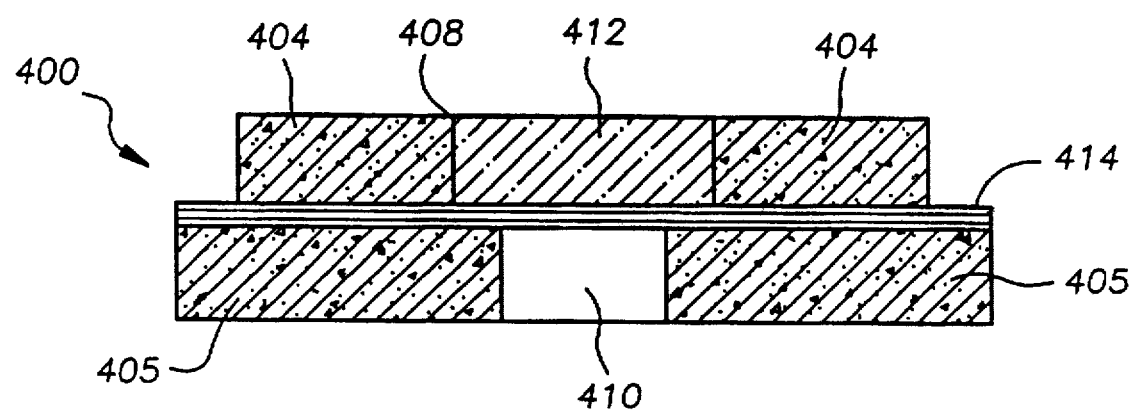
FIG. 12 is a schematic cross section of a semiconductor wafer holder according to the invention.

Considering adaptation of the PID fabrication process to optimize its functionality as a substrate holder, in one example, shown in FIG. 12, a RBSN-based semiconductor component holder 400 consists of two bonded layers 404, 405, of tape-cast silicon powder cut into a 4-inch (or otherwise suitable) diameter disk. A hole 408 is punched into the top disk at one or more locations corresponding to the size and shapes of wafers or pieces of wafers to be supported. In one suitable scheme, when a wafer or wafer piece 412 is placed in a hole of the same shape in the top layer, the piece is fully supported by the lower layer, and the front surfaces of the holder and the wafer piece, where device processing is to occur, are co-planar at the correct altitude. In addition, as shown in the figure, the bottom layer may include a small hole 410 located concentrically with a larger hole in the upper layer, thus providing access to the back of the chip for ohmic contacts while supporting the chip with an effective "shelf".

Alternatively, the chip holder may be cast to a specified thickness over a positioned chip or wafer piece positioned face-downward. In this case, the chips may be positioned with a tape cast layer, as in the first example, or may be free standing so that the casting makes up the entire holder. The positions of the wafers or wafer pieces can be precisely and uniquely defined with simple fiducials.

This fixturing scheme provided by the PID sequence presents several options. The substrate pieces to be processed may be made any appropriate size, ranging from individual device chips, optimum dimensions based on device area required for a particular electronic device, to entire wafers. The silicon holder layers may be converted to RBSN with or without the wafer in place in the holder. In the case of a SiC wafer, bonding between the SiC and the RBSN can be minimized or made very strong using polysilazane as a binder.

This range of options permits the holder to be used as a temporary fixturing device from which a chip is removed at the completion of processing, or may follow the PID strategy of remaining as an integral part of the finished package. In this case, appropriate electrical contacts can be made between the processed chip and the holder layers in any appropriate manner; for example, as shown in FIG. 12, TiN leads 414 may be placed on the surface between the two layers of the fixture in a manner such that they make appropriate electrical contact to the back side of the processed chip. As was shown above, this is necessary for many devices such as the SiC permeable base transistor discussed above. In addition, a heat spreader material (not shown) may be inserted in the hole 410 before reaction forming or at the end of the nitriding process to provide a RBSN-based package that includes a high thermal conductivity substrate portion. This wafer fixturing scheme thus may provide both a semiconductor material component holder and a complete RBSN-based package, including conductors, resistor or capacitor elements, and heat spreader portions, if desired.

With these examples, the many advantages of the PID process are illustrated, including, e.g., elimination of the need for any type of device-to-package ribbon or wire-bond techniques. Such wire bonding can limit device operation to temperatures lower than those that could be tolerated by either the device or packaging materials. Additionally, because the RBSN-based package and conductor materials exhibit relatively high thermal conductivity, thermal ground can easily be separated from electrical ground in the PID process. As a result, PID packages can significantly reduce common parasitics such as common-lead inductance; this parasitic reduction is particularly important for high-frequency, high-power devices like those anticipated by the PID technology. Furthermore, the interleaved device-package processing made possible by the PID process allows for incorporation of device redundancy at critical device fabrication steps. For example, several devices may be fabricated on the embedded semiconductor substrate at each processing stage. Then, any nonworking devices due to, for example, spiral micropipe defects in the SiC, could easily be removed from the device circuitry by selective interconnection schemes such as direct laser writing.

RBSN-based Package Cooling

Additional functionality provided by an RBSN-based package is enabled by the inherent RBSN morphology; the porosity typifying reaction bonded silicon nitride can be applied advantageously for cooling an RBSN-based package by utilizing the latent heats absorbed during evaporation or cooling processes. In a transpirational-evaporative cooling scheme according to the invention, a liquid "cooling material" is continuously applied to an exterior surface of the RBSN package, where it evaporates. In sublimational cooling scheme according to the invention, the pore structure of an RBSN package is infiltrated and filled, at least partially, with a cooling material that progressively sublimes as a transient thermal wave propagates through the thickness of the package material. Both of these change-of-phase cooling processes are capable of very high heat fluxes at a specific temperature level defined by the vapor pressure of the evaporating materials.

In the invention, this phase transformation cooling phenomena is employed to prevent an RBSN package from overheating during operation of a high power device contained within the package, or alternatively, is employed to protect the package from exposure to elevated temperatures. Optimum matrix conductivities of the package materials differ for the two cases. When used to prevent overheating from an internal source of heat, the RBSN-based matrix should exhibit a thermal conductance that is high enough to avoid significant temperature gradients in the porous matrix when subjected to elevated operational heat fluxes. Such a high thermal conductance level is achieved by a combination of a high thermal conductivity package matrix, e.g., a cubic-boron nitride/RBSN base and/or sidewall composite, as described above, and a package design that provides a short thermal path length. This combination of package design and package materials sets a condition in which a vapor phase forms only at exterior package surfaces. If significant gradients are allowed, the cooling material may reach a temperature level within the matrix at which vapor pressures could cause damage or device disruption.

In contrast, when the heat to be shielded originates from exterior to the package, temperature gradients in the package matrix composite are favored. Use of low conductance matrices, e.g., RBSN with no thermal conductive additives, cause the cooling material to reach temperature levels that produce vaporization at the exterior package surfaces, and then vaporization progressively into the porous matrix as the thermal wave penetrates the package material. Temperatures at regions more internal than a given instantaneous point of evaporation are therefore maintained uniform and at a lower point than that defined by the relationship between the temperature and vapor pressure of the cooling material and the encountered heat flux. Protective cooling is thus maintained for as long as the cooling material exists in the package material.

In either cooling application, the cooling material to be employed is determined by the temperature range of interest and the boiling point of candidate cooling materials. Water is an adequate cooling material for many applications.

Numerous applications exist for these cooling means provided by the RBSN-based packages of the invention. Both transpirational-evaporative and sublimational means achieve very high cooling heat fluxes, and yet are elegantly simple in configuration. If continuously supplied with a fluid cooling material, a package employing the transpirational-evaporative cooling technique can be cooled indefinitely. A package employing the sublimational cooling technique can be cooled until the charge of cooling material evaporates; thus, devices and packages cooled by such a process can be protected for only finite periods. Typical applications for such a scheme include electronic probes in various type of aircraft and missiles; wherein the electronics are exposed to very high temperature environments and may house very high power devices, but that need to remain robust only over a short, single thermal cycle duty cycle.

RBSN-based Ceramics for other Electronics-based Applications

The outstanding dielectric properties of reaction-formed materials, together with the dimensional stability these materials exhibit enable realization of highly efficient radiating device structures. Such radiating structures generally consist of metallic radiators fabricated on RBSN-based substrates, or alternatively, dielectric radiators that are precisely fabricated using molding techniques. With such a design, individual radiators or radiator arrays may be integrally coupled to active devices and microwave power distribution networks using PID or other RBSN-based package technology.

The combination of material attributes and fabrication techniques provided by the RBSN-based materials family of the invention make this approach ideally suited for radomes intended for use on hypersonic vehicles. Functionally, such a radome may be considered as a large, contoured window that also serves as a package for transmitting electronics, receiving electronics, and antennas. Materials used for such radome structures must satisfy a complex set of property, performance, and cost criteria.

Fundamentally, the radome material must remain transparent to microwave frequencies at the high stagnation temperature encountered during endoatmospheric operation. High purity RBSN exhibits low losses at 35 GHz, as explained previously, for temperatures up to at least 1250° C. Traditionally, low dielectric constants are favored for radome designs which use precisely contoured wall thicknesses to minimize reflection losses. High purity RBSN exhibits a dielectric constant that is both unusually low, because of its characteristic porosity, and is also nearly independent of temperature up to the highest characterized temperature level, 1250° C. By varying the porosity through the thickness of a RBSN radome wall, graded dielectric constant profiles needed for broad band antireflective characteristics are achieved. In addition, the high strength exhibited by high purity RBSN is uniquely well suited to the aerodynamic and other stresses typically encountered by radomes. Furthermore, the combination of low thermal expansion coefficient, low modulus of elasticity, high thermal conductivity, and high strength provide high purity RBSN with the exceptional thermal shock resistance that is needed to withstand the high heating rates typically encountered during radome operation.

Reception and/or transmission antennas are incorporated into a RBSN-based radome structure as either a contoured array or planar array, using any of the conducting nitride-based material discussed previously, e.g., TiN. In addition, solid state amplifiers, e.g., SiC transistor amplifiers, may be positioned on the inner surface of an RBSN radome structure directly adjacent to antenna elements, using the PID and other manufacturing process flows described above, to thereby provide integration of the radome electronics system. For radome applications in which wide temperature excursions are encountered, the matched thermal expansion coefficients achieved by the RBSN-based radome and the high temperature device materials provided by the invention and suggested above, e.g., SiC, avoid particular damaging sources of point stresses. In addition, the net shape feature exhibited by RBSN fabrication eliminates the need for costly and potentially damaging grinding operations typically employed to achieve close dimensional tolerances on complex radome shapes.

In accordance with the invention, an RBSN-based radome structure is produced using customary forming techniques, as described above for electronic package designs employing reaction formed powders. Green radome parts may be formed by isopressing spray-dried silicon powders using internal mandrels and shaped bags, in a technique like that used conventionally to produce silicon dioxide radomes that may have lengths in excess of 1 meter and diameters in excess of 30 cm. Antenna arrays are applied to inner or outer surfaces of the RBSN radome structure using screen printing processes like those previously described; when outer-surface arrays are employed, they are preferably connected to interior radome electronics by way of vias which extend through the radome wall thickness. Hermeticity of the radome structure, if desired, is achieved by any of the alternative processes described above for producing hermetically sealed package structures. As was prescribed for electronics packages composed of reaction formed materials according to the invention, green radome structures consisting of dielectric, conductor, antenna, and device components are converted to a final phase by a single nitriding step that simultaneously reacts with all phases incorporated in the green structure to produce a nitrided part in a single step.

From the foregoing, it is apparent that the RBSN-based electronics package designs and fabrication processes described above not only provide reliable accomplishment of the objects of the invention, but do so in a particularly effective and efficient manner. It is recognized, of course, that those skilled in the art may make various modifications and additions to the preferred embodiments described above to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

We claim:

1. A method for producing a packaged electronic device comprising the steps of:

shaping a package preform comprising a preform of a package base, a preform of package sidewalls connected to the base preform, and a preform of a package conductor positioned to extend to an outside surface of the sidewall preform;

inserting a semiconducting material component into the package preform to be supported by the package base preform; and heating the shaped package preform and inserted semiconducting material component in a nitrogen-containing gas atmosphere to nitride the package preform.

2. The method of claim 1 wherein the package base preform comprises silicon powder.

3. The method of claim 2 wherein the package base preform further comprises a silicon nitride precursor.

4. The method of claim 1 wherein the package sidewalls preform comprises silicon powder.

5. The method of claim 1 wherein the step of shaping a package base preform and sidewalls preform comprises laminating tape cast unreacted sheets comprising silicon powder.

6. The method of claim 1 wherein the step of shaping a package base preform and sidewalls preform comprises laminating extruded unreacted sheets comprising silicon powder.

7. The method of either of claims 2 or 4 wherein the package conductor preform comprises a film of titanium.

8. The method of claim 7 wherein the package conductor preform further comprises a titanium nitride precursor.

9. The method of claim 2 further comprising the steps of:
defining a cavity in the package base preform; and
inserting a heat spreader preform in the base preform cavity, both steps before insertion of the semiconducting material component in the package preform.

10. The method of claim 9 wherein the heat spreader preform comprises boron nitride.

11. The method of claim 9 wherein the heat spreader preform comprises diamond.

12. The method of claim 4 wherein the sidewalls preform comprises a multilayer preform of silicon powder.

13. The method of claim 12 wherein the sidewalls preform further comprises a silicon nitride precursor.

14. The method of claim 2 wherein the base preform comprises aluminum nitride and silicon powder.

15. The method of claim 2 wherein the base preform comprises silicon powder and silicon nitride powder.

16. The method of claim 2 wherein the base preform comprises silicon powder and boron nitride powder.

17. The method of claim 1 wherein the base preform comprises a layer of diamond.

18. The method of claim 1 wherein the base preform comprises a layer of boron nitride.

19. The method of claim 1 wherein the base preform comprises a layer of silicon nitride.

20. The method of claim 1 further comprising the step of attaching a package cover to the package after heating the shaped package preform.

21. The method of claim 1 further comprising the step of attaching a package cover to the package before heating the shaped package preform.

22. The method of claim 1 further comprising the step of coating surfaces of the package with a hermetic sealing layer.

23. The method of claim 22 wherein the hermetic sealing layer comprises reaction bonded silicon nitride.

24. The method of claim 22 wherein the hermetic sealing layer comprises glass.

25. The method of claim 2 wherein the package base preform further comprises a refractory silicate glass, and wherein the package sidewalls preform comprises silicon powder and a refractory silicate glass, and further comprising the step of heating the package to melt the refractory silicate glass to produce an internal pore structure of the base and sidewalls that is characterized by closed cell porosity.

26. The method of claim 1 further comprising the step of processing the semiconducting material component to define an active device area on the component after the step of heating the package preform and inserted semiconducting material component.

27. The method of claim 26 further comprising the step of forming a conducting contact on the active device area.

28. The method of claim 1 further comprising the step of processing the semiconducting material component to define an active device area on the component before the step of heating the package preform and inserted semiconducting material component.

29. The method of claim 28 further comprising the step of forming a conducting contact on the active device area before the step of heating the package preform and inserted semiconducting material component.

30. The method of claim 29 further comprising the step of making electrical connection between the conducting contact on the active device area and the package conductor preform before the step of heating the package preform and inserted semiconducting material component.

31. The method of claim 2 wherein the step of shaping a package preform further comprises shaping a package resistor preform positioned to be connected to the package conductor preform.

32. The method of claim 31 wherein the package resistor preform comprises a film of tantalum.

33. The method of claim 32 wherein the package resistor preform further comprises a tantalum nitride precursor.

34. The method of claim 31 wherein the package resistor preform comprises a film of titanium powder and silicon powder.

35. The method of claim 31 wherein the package resistor preform comprises a film of a titanium powder, titanium nitride precursor, and silicon powder.

36. The method of claim 2 wherein the step of shaping a package preform further comprises shaping a package capacitor preform positioned to be connected to the package conductor preform.

37. The method of claim 36 wherein the capacitor preform comprises a preceramic polymer.

38. The method of either of claims 26 or 28 wherein the semiconducting material component comprises silicon carbide.

39. The method of either of claims 26 or 28 wherein the semiconducting material component comprises silicon.

40. The method of either of claims 26 or 28 wherein the semiconducting material component comprises diamond.

41. The method of claim 26 or 28 wherein the semiconducting material component comprises active areas of a transistor.

42. The method of claim 1 wherein the step of shaping a package preform comprises injection molding package base and sidewalls preforms.

43. The method of claim 1 wherein the step of shaping a package preform comprises dry pressing package base and sidewalls preforms.

44. The method of claim 1 wherein the step of heating the shaped package preform comprises heating the shaped package preform at a heating temperature less than about 1500° C.

45. The method of claim 44 wherein the step of heating the shaped package preform further comprises first heating the shaped package preform through a ramped temperature range from a starting temperature to the heating temperature.

46. A method for producing a packaged electronic device comprising the steps of:
shaping a package preform comprising a preform of a package base and a preform of a package conductor positioned on the package base preform and extending to an outer wall of the base preform;
inserting a semiconducting material component into the package preform to be supported by the package base preform; and
heating the shaped package preform and inserted semiconducting material component in a nitrogen-containing gas atmosphere to nitride the package preform.

47. The method of claim 46 wherein the package base preform comprises silicon powder.

48. The method of claim 47 wherein the package base preform further comprises a silicon nitride precursor.

49. The method of claim 46 wherein the package conductor preform comprises a film of titanium.

50. The method of claim 49 wherein the package conductor preform further comprises a titanium nitride precursor.

51. The method of claim 47 further comprising the steps of:
defining a cavity in the package base preform; and
inserting a heat spreader preform in the base preform cavity, both steps before insertion of the semiconducting material component in the package preform.

52. The method of claim 51 wherein the heat spreader preform comprises boron nitride.

53. The method of claim 51 wherein the heat spreader preform comprises diamond.

54. The method of claim 47 wherein the base preform comprises aluminum nitride and silicon powder.

55. The method of claim 47 wherein the base preform comprises silicon powder and silicon nitride powder.

56. The method of claim 47 wherein the base preform comprises silicon powder and boron nitride powder.

57. The method of claim 47 wherein the base preform comprises silicon powder and diamond powder.

58. The method of claim 46 further comprising the step of attaching a package cover to the package after the step of heating the shaped package preform.

59. The method of claim 46 further comprising the step of attaching a package cover to the package before the step of heating the shaped package preform.

60. The method of claim 59 further comprising the step of coating surfaces of the package cover and base with a hermetic sealing layer.

61. The method of claim 60 wherein the hermetic sealing layer comprises glass.

62. The method of claim 47 wherein the package base preform further comprises a refractory silicate glass, and further comprising the step of heating the package to melt the refractory silicate glass to produce an internal pore structure of the base that is characterized by closed cell porosity.

63. The method of claim 46 further comprising the step of processing the semiconducting material component to define an active device area on the component after the step of heating the package preform and inserted semiconducting material component.

64. The method of claim 63 further comprising the step of forming a conducting contact on the active device area.

65. The method of claim 46 further comprising the step of processing the semiconducting material component to define an active device area on the component before the step of heating the package preform and inserted semiconducting material component.

66. The method of claim 65 further comprising the step of forming a conducting contact on the active device area before the step of heating the package preform and inserted semiconducting material component.

67. The method of claim 66 further comprising the step of making electrical connection between the conducting contact on the active device area and the package conductor preform before the step of heating the package preform and inserted semiconducting material component.

68. The method of claim 46 wherein the step of shaping a package preform further comprises shaping a package resistor preform positioned to be connected to the package conductor preform.

69. The method of claim 68 wherein the package resistor preform comprises a film of tantalum.

70. The method of claim 69 wherein the package resistor preform further comprises a tantalum nitride precursor.

71. The method of claim 68 wherein the package resistor preform comprises a film of titanium powder and silicon powder.

72. The method of claim 68 wherein the package resistor preform comprises a film of a titanium powder, titanium nitride precursor, and silicon powder.

73. The method of claim 46 wherein the step of shaping a package preform further comprises shaping a package capacitor preform positioned to be connected to the package conductor preform.

74. The method of claim 73 wherein the capacitor preform comprises a preceramic polymer.

75. The method of either of claims 63 or 65 wherein the semiconducting material component comprises silicon carbide.

76. The method of either of claims 63 or 65 wherein the semiconducting material component comprises silicon.

77. The method of either of claims 63 or 65 wherein the semiconducting material component comprises diamond.

78. The method of either of claims 63 or 65 wherein the semiconducting material component comprises indium phosphide.

79. The method of claim 63 or 65 wherein the silicon carbide material component comprises active areas of a transistor.

80. The method of claim 46 wherein the step of shaping a package preform comprises injection molding the package base preform.

81. The method of claim 46 wherein the step of shaping a package preform comprises dry pressing the package base preform.

82. The method of claim 46 wherein the step of shaping a package preform comprises laminating tape cast unreacted sheets of silicon powder.

83. A method for producing an electronic device package comprising the steps of:
shaping a package preform comprising a preform of a package base and a preform of a package conductor positioned on the package base preform and extending to an outer wall of the base preform; and
heating the shaped package preform in a nitrogen-containing gas atmosphere to nitride the package preform.

84. The method of claim 83 wherein the package base preform comprises silicon powder.

85. The method of claim 84 wherein the package base preform further comprises a silicon nitride precursor.

86. The method of claim 84 wherein the package conductor preform comprises a film of titanium.

87. The method of claim 86 wherein the package conductor preform further comprises a titanium nitride precursor.

88. The method of claim 84 wherein the base preform comprises aluminum nitride and silicon powder.

89. The method of claim 84 wherein the base preform comprises silicon powder and silicon nitride powder.

90. The method of claim 84 wherein the base preform comprises silicon powder and boron nitride powder.

91. The method of claim 84 wherein the base preform comprises silicon powder and diamond powder.

92. The method of claim 83 further comprising the step of attaching a package cover to the package.

93. The method of claim 92 further comprising the step of coating surfaces of the package cover and base with a hermetic sealing layer.

94. The method of claim 93 wherein the hermetic sealing layer comprises reaction bonded silicon nitride.

95. The method of claim 93 wherein the hermetic sealing layer comprises glass.

96. The method of claim 84 wherein the package base preform further comprises a refractory silicate glass, and further comprising the step of heating the package to melt the refractory silicate glass to produce an internal pore structure of the base that is characterized by closed cell porosity.

97. The method of claim 83 wherein the step of shaping a package preform further comprises shaping a package resistor preform positioned to be connected to the package conductor preform.

98. The method of claim 97 wherein the package resistor preform comprises a film of tantalum.

99. The method of claim 97 wherein the package resistor preform comprises a film of titanium powder and silicon powder.

100. The method of claim 97 wherein the package resistor preform comprises a film of a titanium powder, titanium nitride precursor, and silicon powder.

101. The method of claim 83 wherein the step of shaping a package preform further comprises shaping a package capacitor preform positioned to be connected to the package conductor preform.

102. The method of claim 101 wherein the capacitor preform comprises a preceramic polymer.

103. The method of claim 84 wherein the step of shaping a package preform comprises injection molding the package base preform.

104. The method of claim 84 wherein the step of shaping a package preform comprises dry pressing the package base preform.

105. The method of claim 84 wherein the step of shaping a package preform comprises laminating unreacted sheets of silicon powder.

106. A method for producing an electronic device package comprising the steps of:
shaping a package preform comprising a preform of a package base, a preform of package sidewalls, and a preform of a package conductor positioned to extend to an outside surface of the sidewall preform; and
heating the shaped package preform in a nitrogen-containing gas atmosphere to nitride the package preform.

107. The method of claim 106 wherein the package base preform comprises silicon powder.

108. The method of claim 107 wherein the package sidewall preform comprises silicon powder.

109. The method of claim 108 wherein the package base preform and the package sidewall preform each further comprise a silicon nitride preceramic polymer.

110. The method of claim 106 wherein the package conductor preform comprises a film of titanium.

111. The method of claim 110 wherein the package conductor preform further comprises a titanium nitride precursor.

112. The method of claim 107 further comprising the steps of:
defining a cavity in the package base preform; and
inserting a heat spreader preform in the base preform cavity, both steps before heating the package preform.

113. The method of claim 112 wherein the heat spreader preform comprises boron nitride.

114. The method of claim 112 wherein the heat spreader preform comprises diamond.

115. The method of claim 107 wherein the base preform comprises aluminum nitride and silicon powder.

116. The method of claim 107 wherein the base preform comprises silicon powder and silicon nitride powder.

117. The method of claim 107 wherein the base preform comprises silicon powder and boron nitride powder.

118. The method of claim 107 wherein the base preform comprises silicon powder and diamond powder.

119. The method of claim 106 wherein the base preform comprises a layer of diamond.

120. The method of claim 106 wherein the base preform comprises a layer of boron nitride.

121. The method of claim 106 wherein the base preform comprises a layer of silicon nitride.

122. A method for producing an electronic device package comprising the steps of:
shaping a package preform comprising a preform of package sidewalls;
heating the shaped package sidewall preform in a nitrogen-containing gas atmosphere to nitride the package sidewall preform; and
attaching the nitrided package sidewall preform to a package base.

123. The method of claim 122 wherein the package base comprises a layer of diamond.

124. The method of claim 122 wherein the package base comprises a layer of boron nitride.

125. The method of claim 122 wherein the package base comprises a layer of s silicon nitride.

126. The method of claim 122 wherein the package base comprises a layer of aluminum nitride.

127. The method of either of claims 106 or 122 wherein the sidewall preform comprises a multilayer preform of silicon powder.

128. The method of either of claims 106 or 122 further comprising the step of attaching a package cover to the package.

129. The method of claim 128 further comprising the step of coating surfaces of the package with a hermetic sealing layer.

130. The method of claim 108 wherein the package base preform and the package sidewall preform each further comprise a refractory silicate glass, and further comprising the step of heating the package to melt the glass to produce an internal pore structure of the package sidewalls and base that is characterized by closed cell porosity.

131. The method of claim 122 wherein the sidewall preform comprises silicon powder and a refractory silicate glass, and further comprising the step of heating the sidewall to melt the glass to produce an internal pore structure of the package sidewalls that is characterized by closed cell porosity.

132. The method of either of claim 122 wherein the step of shaping a package preform further comprises shaping a package conductor preform positioned to extend to an outside surface of the sidewall preform.

133. The method of either of claims 106 or 122 wherein the step of shaping a package preform further comprises shaping a package resistor preform positioned to be connected to the package conductor preform.

134. The method of claim 133 wherein the package resistor preform comprises a film of tantalum.

135. The method of claim 133 wherein the package resistor preform comprises a film of titanium and silicon powder.

136. The method of claim 133 wherein the package resistor preform comprises a film of titanium nitride powder, titanium nitride precursor, and silicon powder.

137. The method of either of claims 106 or 122 wherein the step of shaping a package preform further comprises shaping a package capacitor preform positioned to be connected to the package conductor preform.

138. The method of claim 137 wherein the capacitor preform comprises a preceramic polymer.

139. The method of claim 106 wherein the step of shaping a package preform comprises injection molding package base and sidewall preforms.

140. The method of claim 106 wherein the step of shaping a package preform comprises dry pressing package base and sidewall preforms.

* * * * *